(12) United States Patent
Yamazaki et al.

(10) Patent No.: US 9,202,851 B2
(45) Date of Patent: Dec. 1, 2015

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Junichiro Sakata, Atsugi (JP); Miyuki Hosoba, Isehara (JP); Tatsuya Takahashi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/097,749

(22) Filed: Dec. 5, 2013

(65) Prior Publication Data

US 2014/0091303 A1 Apr. 3, 2014

Related U.S. Application Data

(63) Continuation of application No. 12/848,389, filed on Aug. 2, 2010, now Pat. No. 8,629,441.

(30) Foreign Application Priority Data

Aug. 7, 2009 (JP) .................................. 2009-185300

(51) Int. Cl.
*H01L 27/32* (2006.01)
*H01L 27/12* (2006.01)
*H01L 29/45* (2006.01)

(52) U.S. Cl.
CPC .......... *H01L 27/3262* (2013.01); *H01L 27/124* (2013.01); *H01L 27/1222* (2013.01);

(Continued)

(58) Field of Classification Search
CPC . H01L 27/32; H01L 27/3225; H01L 27/3244; H01L 27/3248; H01L 27/3262; H01L 27/3265
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 001941299 A 4/2007
CN 101063758 A 10/2007
(Continued)

OTHER PUBLICATIONS

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C" Journal of Solid State Chemistry, 1985, vol. 60, pp. 382-384.

(Continued)

*Primary Examiner* — Eduardo A Rodelo
(74) *Attorney, Agent, or Firm* — Eric J. Robinson; Robinson Intellectual Property Law Office, P.C.

(57) ABSTRACT

The semiconductor device includes a driver circuit including a first thin film transistor and a pixel including a second thin film transistor over one substrate. The first thin film transistor includes a first gate electrode layer, a gate insulating layer, a first oxide semiconductor layer, a first oxide conductive layer, a second oxide conductive layer, an oxide insulating layer which is in contact with part of the first oxide semiconductor layer and which is in contact with peripheries and side surfaces of the first and second oxide conductive layers, a first source electrode layer, and a first drain electrode layer. The second thin film transistor includes a second gate electrode layer, a second oxide semiconductor layer, and a second source electrode layer and a second drain electrode layer each formed using a light-transmitting material.

18 Claims, 47 Drawing Sheets

(52) U.S. Cl.
CPC ........ *H01L27/1225* (2013.01); *H01L 27/1255* (2013.01); *H01L 27/32* (2013.01); *H01L 27/3248* (2013.01); *H01L 29/45* (2013.01)

(56) References Cited

U.S. PATENT DOCUMENTS

| | | | |
|---|---|---|---|
| 6,294,274 B1 | 9/2001 | Kawazoe et al. | |
| 6,330,044 B1 | 12/2001 | Murade | |
| 6,433,609 B1* | 8/2002 | Voldman | 327/313 |
| 6,563,174 B2 | 5/2003 | Kawasaki et al. | |
| 6,704,068 B2 | 3/2004 | Murade | |
| 6,717,633 B2 | 4/2004 | Murade | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,271,867 B2 | 9/2007 | Kim et al. | |
| 7,282,782 B2 | 10/2007 | Hoffman et al. | |
| 7,297,977 B2 | 11/2007 | Hoffman et al. | |
| 7,298,084 B2 | 11/2007 | Baude et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,550,772 B2 | 6/2009 | Toyota et al. | |
| 7,580,088 B2 | 8/2009 | Kim et al. | |
| 7,674,650 B2 | 3/2010 | Akimoto et al. | |
| 7,704,859 B2 | 4/2010 | Sato | |
| 7,719,185 B2 | 5/2010 | Jin et al. | |
| 7,732,819 B2 | 6/2010 | Akimoto et al. | |
| 7,745,798 B2 | 6/2010 | Takahashi | |
| 7,838,402 B2 | 11/2010 | Nagasawa et al. | |
| 7,847,908 B2 | 12/2010 | Tanno | |
| 7,910,490 B2 | 3/2011 | Akimoto et al. | |
| 7,932,521 B2 | 4/2011 | Akimoto et al. | |
| 7,982,215 B2 | 7/2011 | Inoue et al. | |
| 8,030,195 B2 | 10/2011 | Inoue et al. | |
| 8,193,045 B2 | 6/2012 | Omura et al. | |
| 8,274,077 B2 | 9/2012 | Akimoto et al. | |
| 8,384,077 B2 | 2/2013 | Yano et al. | |
| 8,441,085 B2 | 5/2013 | Nagasawa et al. | |
| 8,466,463 B2 | 6/2013 | Akimoto et al. | |
| 8,502,217 B2 | 8/2013 | Sato et al. | |
| 8,629,069 B2 | 1/2014 | Akimoto et al. | |
| 8,669,550 B2 | 3/2014 | Akimoto et al. | |
| 2001/0030323 A1* | 10/2001 | Ikeda | 257/59 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0232421 A1* | 11/2004 | Ono et al. | 257/59 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0057261 A1 | 3/2007 | Jeong et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252145 A1* | 11/2007 | Toyota et al. | 257/59 |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083927 A1 | 4/2008 | Nishiura et al. | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0157081 A1* | 7/2008 | Huh | 257/59 |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1* | 10/2008 | Park et al. | 257/43 |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308805 A1 | 12/2008 | Akimoto et al. | |
| 2009/0001374 A1 | 1/2009 | Inoue et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0189155 A1 | 7/2009 | Akimoto | |
| 2009/0189156 A1 | 7/2009 | Akimoto | |
| 2009/0225251 A1* | 9/2009 | Kaitoh et al. | 349/46 |
| 2009/0278122 A1 | 11/2009 | Hosono et al. | |
| 2009/0280600 A1 | 11/2009 | Hosono et al. | |
| 2009/0283762 A1 | 11/2009 | Kimura | |
| 2009/0305461 A1 | 12/2009 | Akimoto et al. | |
| 2010/0059751 A1 | 3/2010 | Takahashi et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0136743 A1 | 6/2010 | Akimoto et al. | |
| 2010/0289997 A1 | 11/2010 | Suzuki | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2013/0146452 A1 | 6/2013 | Yano et al. | |

FOREIGN PATENT DOCUMENTS

| | | |
|---|---|---|
| CN | 101283388 A | 10/2008 |
| EP | 0 862 077 A | 9/1998 |
| EP | 1 132 765 A | 9/2001 |
| EP | 1 737 044 A | 12/2006 |

(56) References Cited

FOREIGN PATENT DOCUMENTS

| | | |
|---|---|---|
| EP | 1770788 A | 4/2007 |
| EP | 1933293 A | 6/2008 |
| EP | 1981085 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2 226 847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-313729 A | 11/1992 |
| JP | 05-251705 | 9/1993 |
| JP | 08-264794 | 10/1996 |
| JP | 10-301100 A | 11/1998 |
| JP | 11-505377 | 5/1999 |
| JP | 11-191626 A | 7/1999 |
| JP | 2000-044236 A | 2/2000 |
| JP | 2000-150900 | 5/2000 |
| JP | 2002-076356 A | 3/2002 |
| JP | 2002-151694 A | 5/2002 |
| JP | 2002-289859 A | 10/2002 |
| JP | 2003-029293 | 1/2003 |
| JP | 2003-086000 | 3/2003 |
| JP | 2003-086808 | 3/2003 |
| JP | 2003-179069 A | 6/2003 |
| JP | 2003-195355 A | 7/2003 |
| JP | 2003-258226 A | 9/2003 |
| JP | 2004-103957 | 4/2004 |
| JP | 2004-273614 A | 9/2004 |
| JP | 2004-273732 A | 9/2004 |
| JP | 2007-081362 | 3/2007 |
| JP | 2007-096055 | 4/2007 |
| JP | 2007-123861 | 5/2007 |
| JP | 2007-163467 | 6/2007 |
| JP | 2007-171932 | 7/2007 |
| JP | 2007-235102 A | 9/2007 |
| JP | 2007-309965 A | 11/2007 |
| JP | 2007-316110 A | 12/2007 |
| JP | 2008-112136 A | 5/2008 |
| JP | 2009-130180 A | 6/2009 |
| JP | 2009-135530 A | 6/2009 |
| JP | 2009-141002 A | 6/2009 |
| JP | 2009-265271 | 11/2009 |
| JP | 2010-098280 | 4/2010 |
| WO | WO 2004/114391 | 12/2004 |
| WO | WO-2008/149873 | 12/2008 |
| WO | WO-2009/034953 | 3/2009 |
| WO | WO-2009/072532 | 6/2009 |
| WO | WO 2009/075281 | 6/2009 |
| WO | WO-2009/093602 | 7/2009 |

OTHER PUBLICATIONS

Kimizuka et al., "Syntheses and Single-Crystal Data of Homologous Compounds, $In_2O_3(ZnO)m$ ($m$ = 3, 4, and 5), $InGaO_3(ZnO)_3$, and $Ga_2O_3(ZnO)m$ ($m$ = 7, 8, 9, and 16) in the $In_2O_3$—$ZnGa_2O_4$—$ZnO$ System," Journal of Solid State Chemistry, Apr. 1, 1995, vol. 116, No. 1, pp. 170-178.

Nakamura et al., "The Phase Relations in the $In_2O_3$—$Ga_2ZnO_4$—$ZnO$ System at 1350° C," Journal of Solid State Chemistry, Aug. 1, 1991, vol. 93, No. 2, pp. 298-315.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Lee et al., "Current Status of, Challenges to, and Perspective View of AM-OLED," IDW '06: Proceedings of the 13th International Display Workshops, Dec. 7, 2006, pp. 663-666.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Tsuda et al., "Ultra Low Power Consumption Technologies for Mobile TFT-LCDs," IDW '02: Proceedings of the 9th International Display Workshops, Dec. 4, 2002, pp. 295-298.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Ikeda et al., "Full-Functional System Liquid Crystal Display Using CG-Silicon Technology," SID Digest '04: SID International Symposium Digest of Technical Papers, 2004, vol. 35, pp. 860-863.

Kurokawa et al., "UHF RFCPUs on Flexible and Glass Substrates for Secure RFID Systems," Journal of Solid-State Circuits, 2008, vol. 43, No. 1, pp. 292-299.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hirao et al., "Novel Top-Gate Zinc Oxide Thin-Film Transistors (ZnO TFTs) for AMLCDs," Journal of the SID, 2007, vol. 15, No. 1, pp. 17-22.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Park et al., "Challenge to Future Displays: Transparent AM-OLED Driven by Peald Grown ZnO TFT," IMID '07 Digest, 2007, pp. 1249-1252.

Park et al., "Amorphous Indium—Gallium—Zinc Oxide TFTs and their Application for Large Size AMOLED," AM-FPD '08 Digest of Technical Papers, Jul. 2, 2008, pp. 275-278.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Kitzerow et al., "Observation of Blue Phases in Chiral Networks," Liquid Crystals, 1993, vol. 14, No. 3, pp. 911-916.

Kikuchi et al., "Polymer-Stabilized Liquid Crystal Blue Phases," Nature Materials, Sep. 2, 2002, vol. 1, pp. 64-68.

Kikuchi et al., "62.2: Invited Paper: Fast Electro-Optical Switching in Polymer-Stabilized Liquid Crystalline Blue Phases for Display

(56) References Cited

OTHER PUBLICATIONS

Application," SID Digest '07: SID International Symposium Digest of Technical Papers, 2007, vol. 38, pp. 1737-1740.
Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.
Park et al., "High performance amorphous oxide thin film transistors with self-aligned top-gate structure," IEDM 09: Technical Digest of International Electron Devices Meeting, Dec. 7, 2009, pp. 191-194.
Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Miyasaka, "Suftla Flexible Microelectronics on their Way to Business," SID Digest '07: SID International Symposium Digest of Technical Papers, 2007, vol. 38, pp. 1673-1676.
Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.
Prins et al., "A Ferroelectric Transparent Thin-Film Transistor," Appl. Phys. Lett. (Applied Physics Letters), Jun. 17, 1996, vol. 68, No. 25, pp. 3650-3652.
Takahashi et al., "Theoretical Analysis of IGZO Transparent Amorphous Oxide Semiconductor," IDW '08: Proceedings of the 15th International Display Workshops, Dec. 3, 2008, pp. 1637-1640.
Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.
Ohara et al., "21.3: 4.0 In. QVGA AMOLED Display Using In—Ga—Zn—Oxide TFTs with a Novel Passivation Layer," SID Digest '09: SID International Symposium Digest of Technical Papers, May 31, 2009, pp. 284-287.
Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.
Osada et al., "Development of Driver-Integrated Panel using Amorphous In—Ga—Zn—Oxide TFT," AM-FPD '09 Digest of Technical Papers, Jul. 1, 2009, pp. 33-36.
Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Sakata et al., "Development of 4.0-In. AMOLED Display with Driver Circuit Using Amorphous In—Ga—Zn—Oxide TFTs," IDW '09: Proceedings of the 16th International Display Workshops, 2009, pp. 689-692.
Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.
Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.
Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.
Van de Walle, "Hydrogen as a Cause of Doping in Zinc Oxide," Phys. Rev. Lett. (Physical Review Letters), Jul. 31, 2000, vol. 85, No. 5, pp. 1012-1015.
Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Nakamura, "Synthesis of Homologous Compound with New Long-Period Structure," Nirim Newsletter, Mar. 1, 1995, vol. 150, pp. 1-4.
Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.
Orita et al., "Mechanism of Electrical Conductivity of Transparent $InGaZnO_4$," Phys. Rev. B (Physical Review B), Jan. 15, 2000, vol. 61, No. 3, pp. 1811-1816.
Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.
Janotti et al., "Native Point Defects in ZnO," Phys. Rev. B (Physical Review. B), Oct. 4, 2007, vol. 76, No. 16, pp. 165202-1-165202-22.
Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Hsieh et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.
Janotti et al., "Oxygen Vacancies in ZnO," Appl. Phys. Lett. (Applied Physics Letters), 2005, vol. 87, pp. 122102-1-122102-3.
Oba et al., "Defect energetics in ZnO: A hybrid Hartree-Fock density functional study," Phys. Rev. B (Physical Review B), 2008, vol. 77, pp. 245202-1-245202-6.
Orita et al., "Amorphous transparent conductive oxide $InGaO_3(ZnO)_m$ (m<4): a Zn 4s conductor," Philosophical Magazine, 2001, vol. 81, No. 5, pp. 501-515.
Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Mo et al., "Amorphous Oxide TFT Backplanes for Large Size AMOLED Displays," IDW '08: Proceedings of the 6th International Display Workshops, Dec. 3, 2008, pp. 581-584.
Kim et al., "High-Performance oxide thin film transistors passivated by various gas plasmas," 214th ECS Meeting, 2008, No. 2317, ECS.
Clark et al., "First Principles Methods Using CASTEP," Zeitschrift fur Kristallographie, 2005, vol. 220, pp. 567-570.
Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.
Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.
Chinese Office Action (Application No. 201010248886.3) Dated Mar. 14, 2014.

* cited by examiner

FIG. 1A1 FIG. 1A2
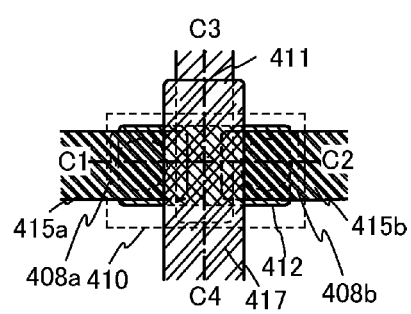
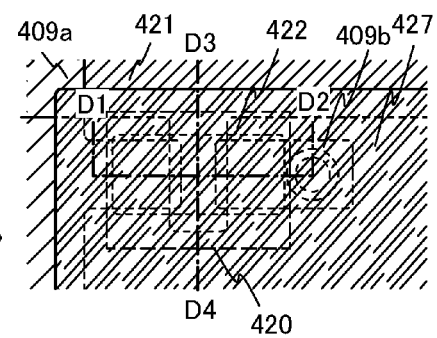
FIG. 1B
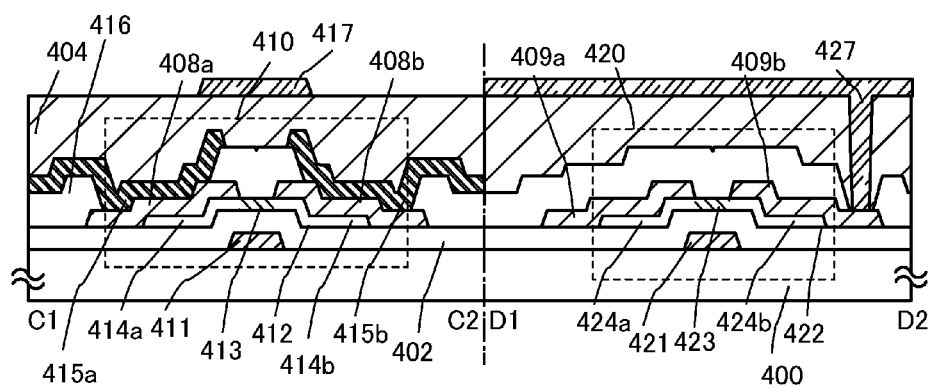
FIG. 1C
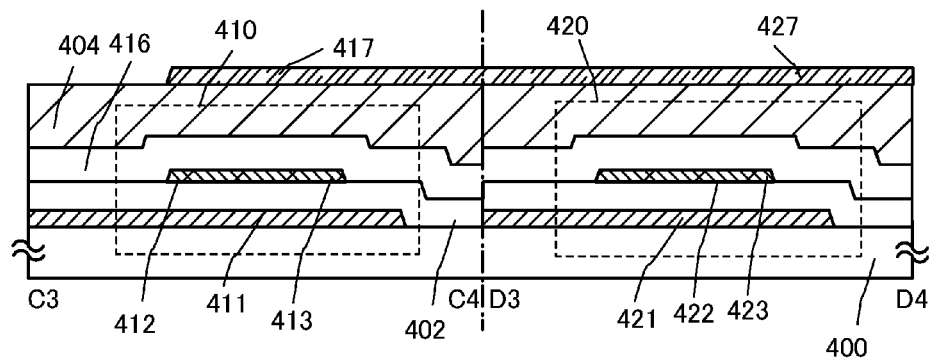

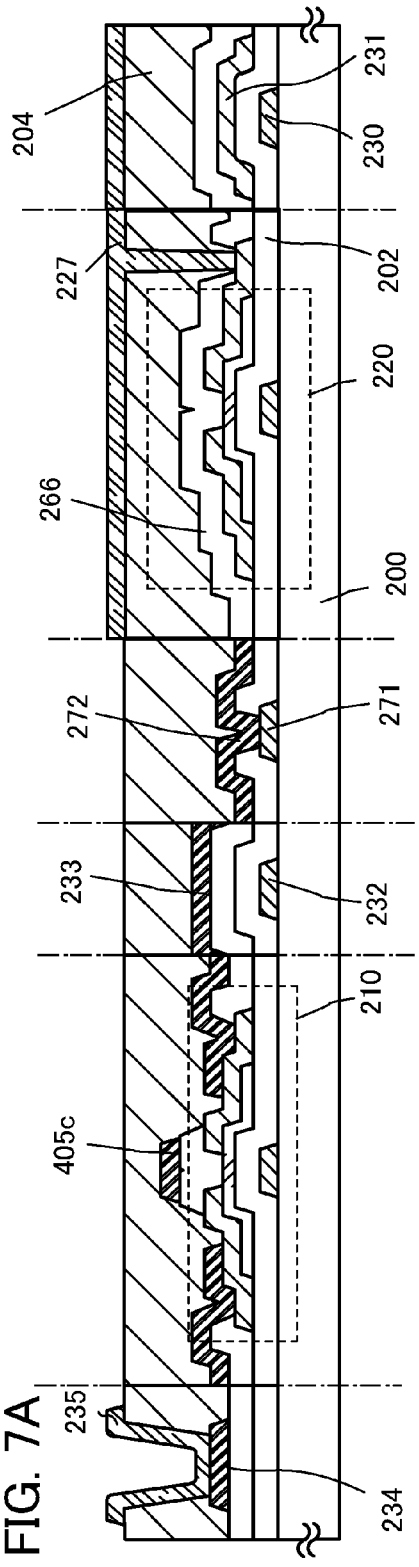

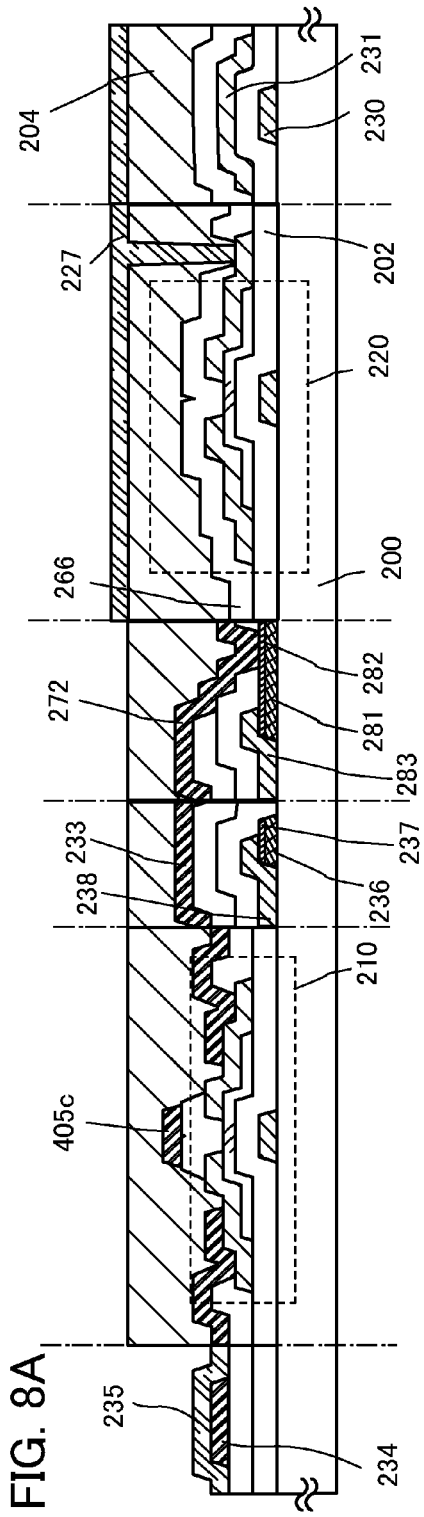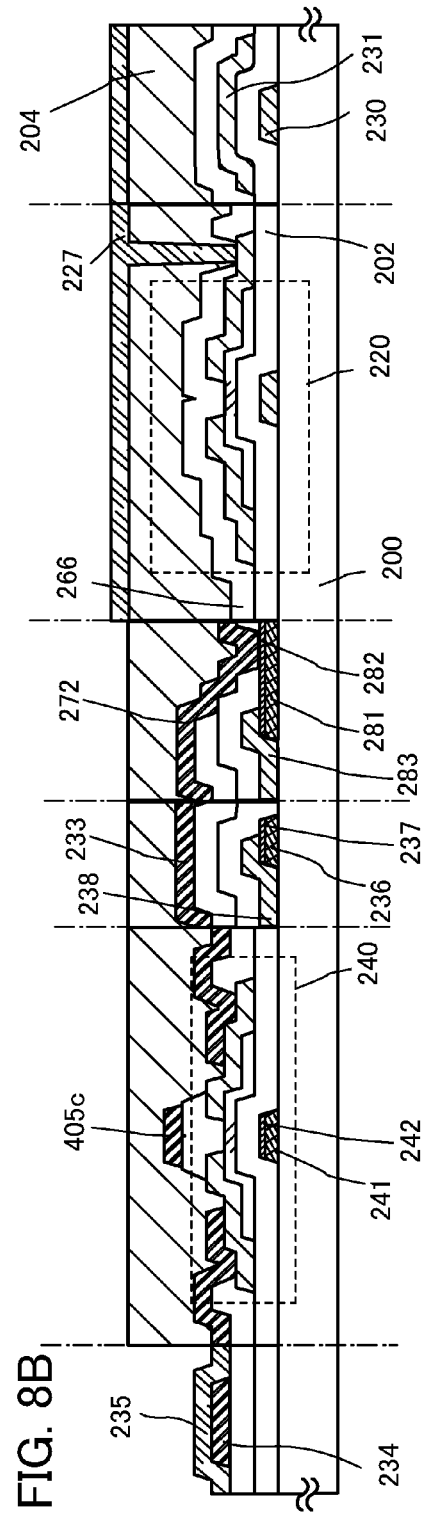

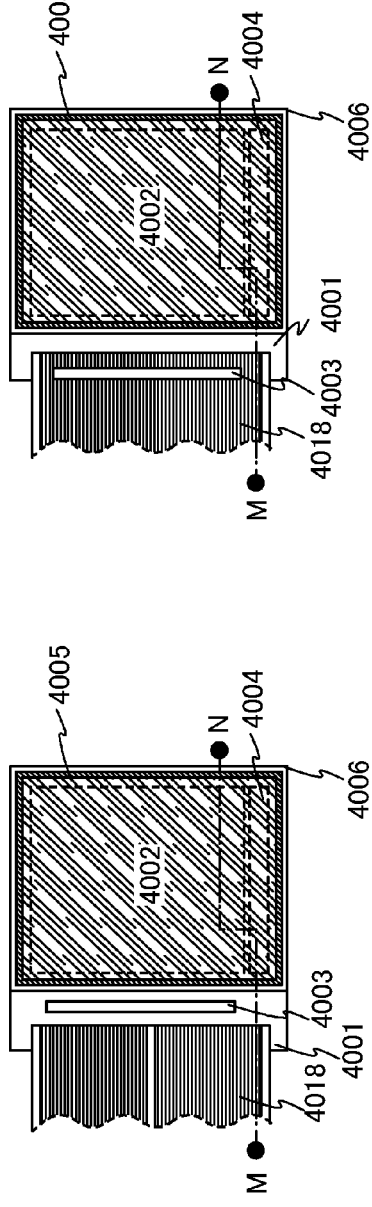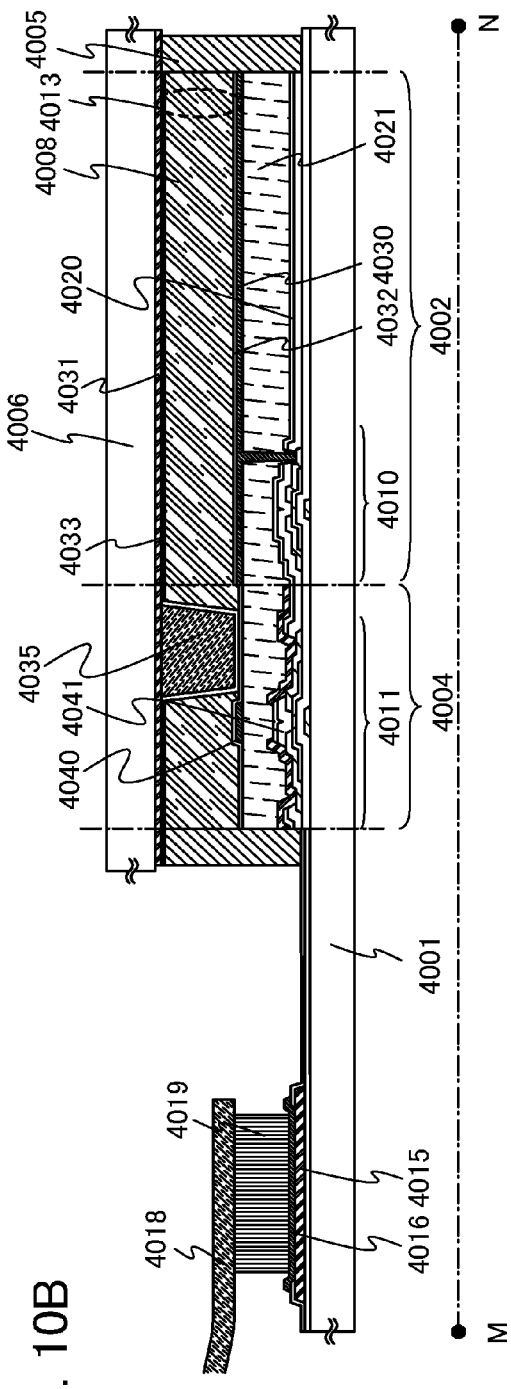

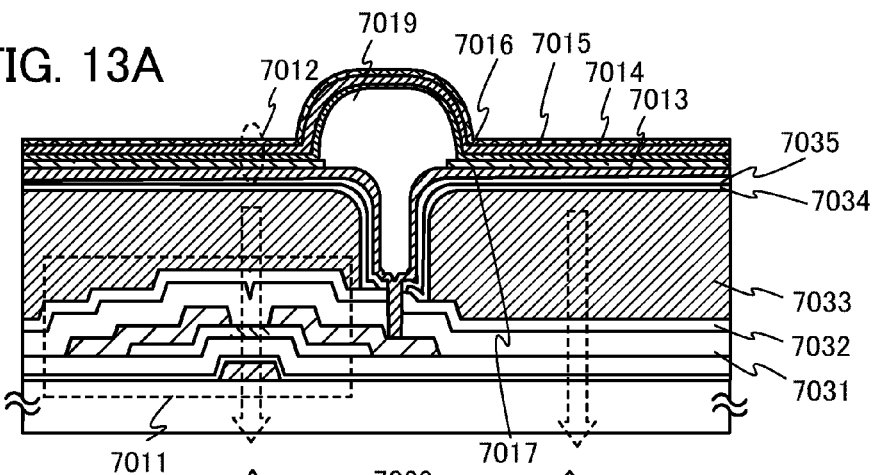
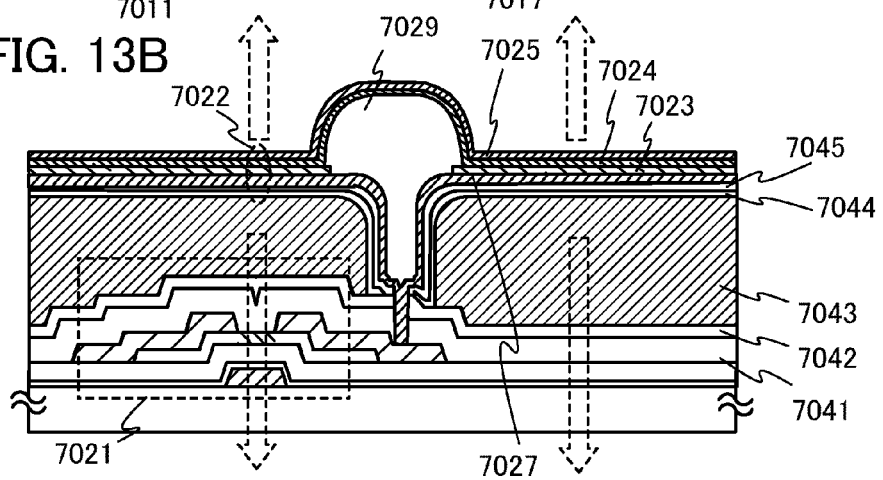
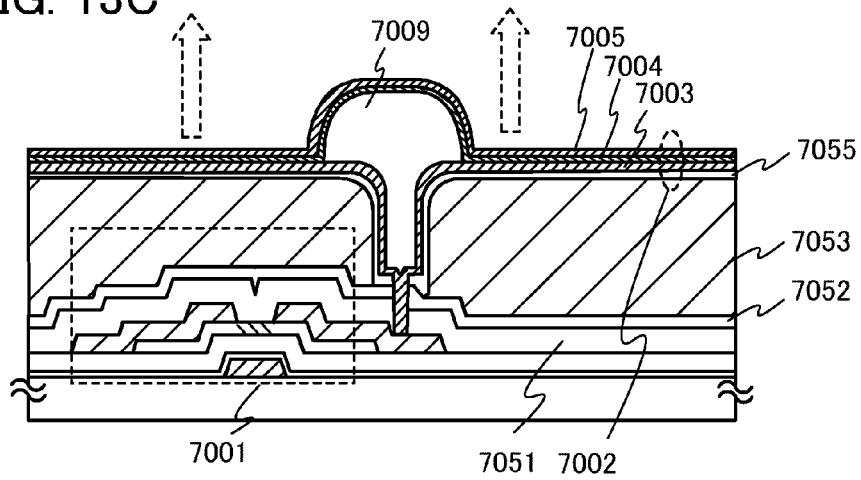

FIG. 38A1
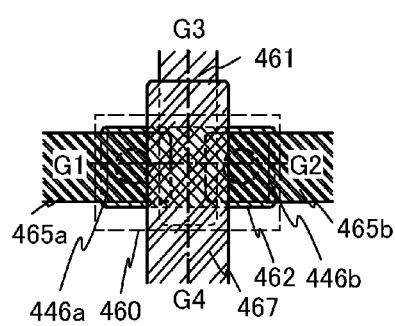
FIG. 38A2
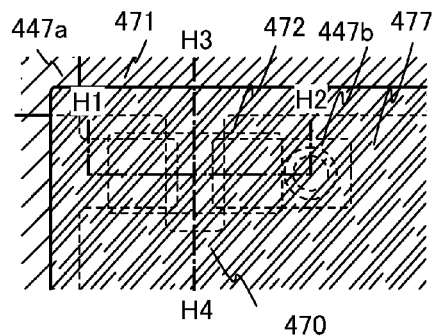
FIG. 38B
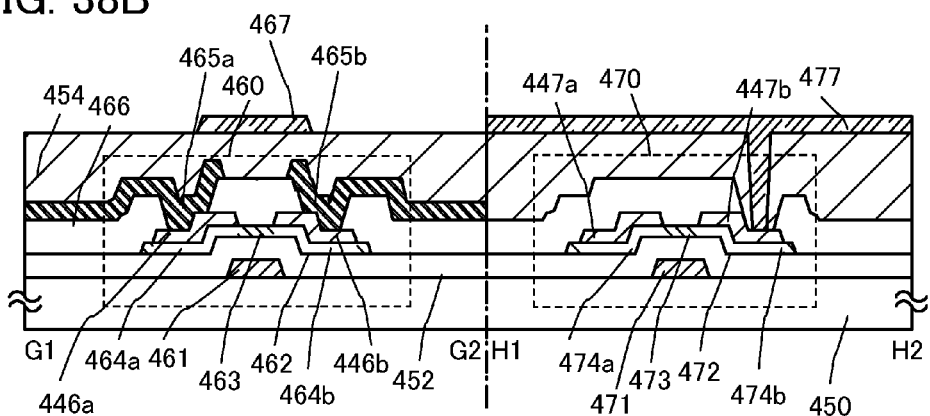
FIG. 38C
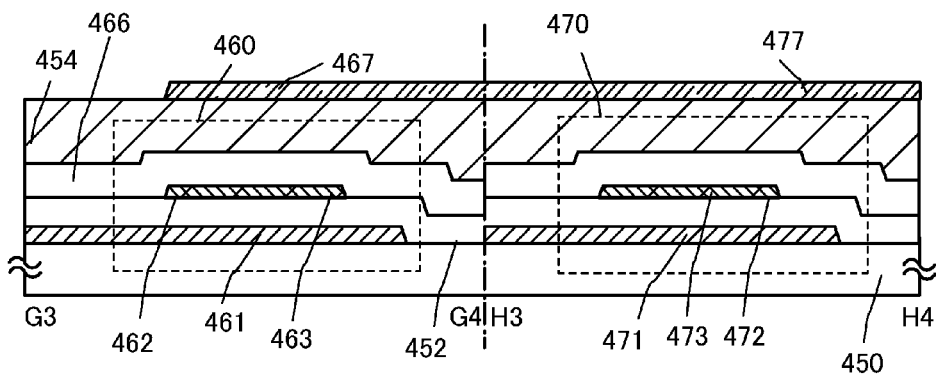

FIG. 43A1    FIG. 43A2
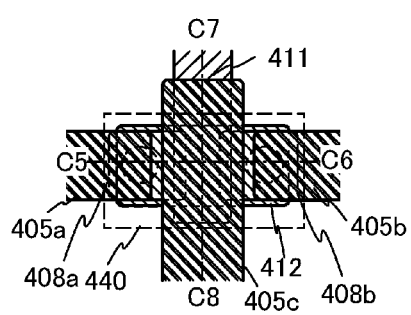
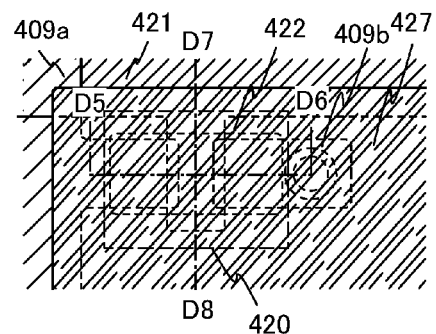
FIG. 43B
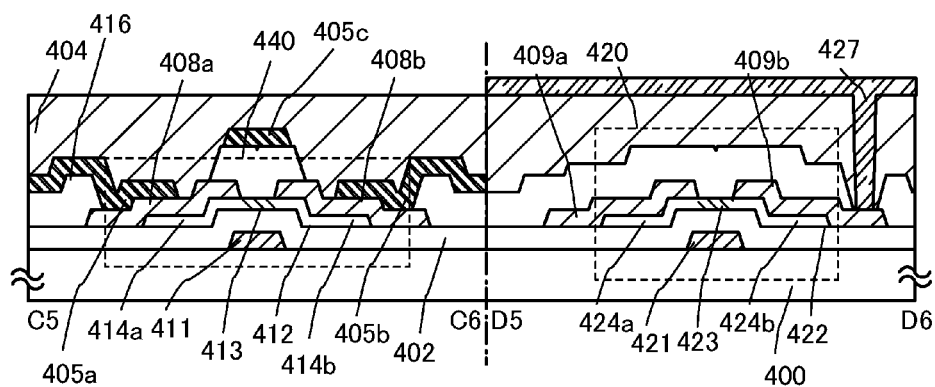
FIG. 43C
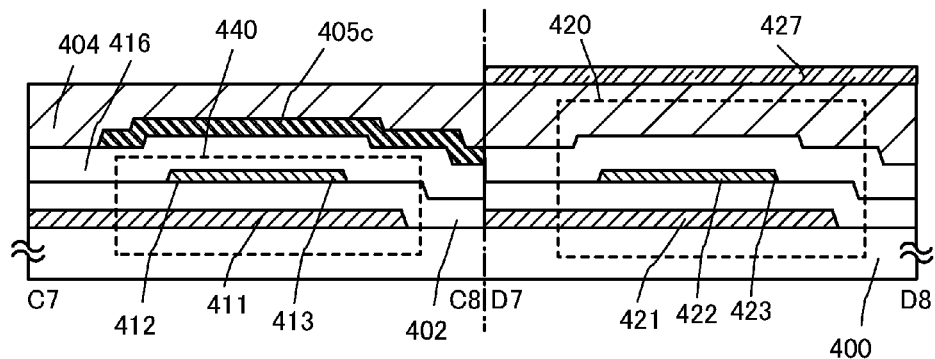

FIG. 45A1
FIG. 45A2
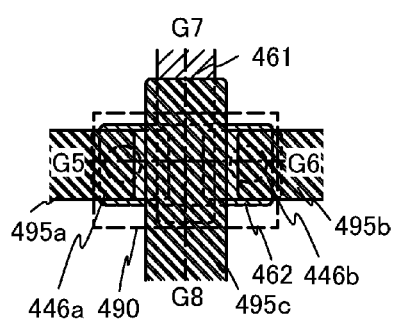
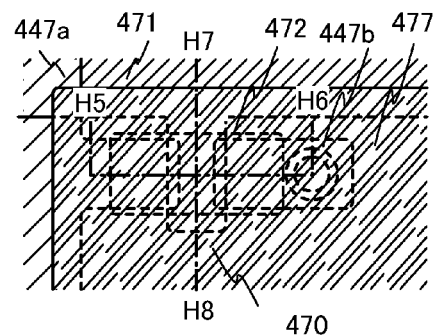
FIG. 45B
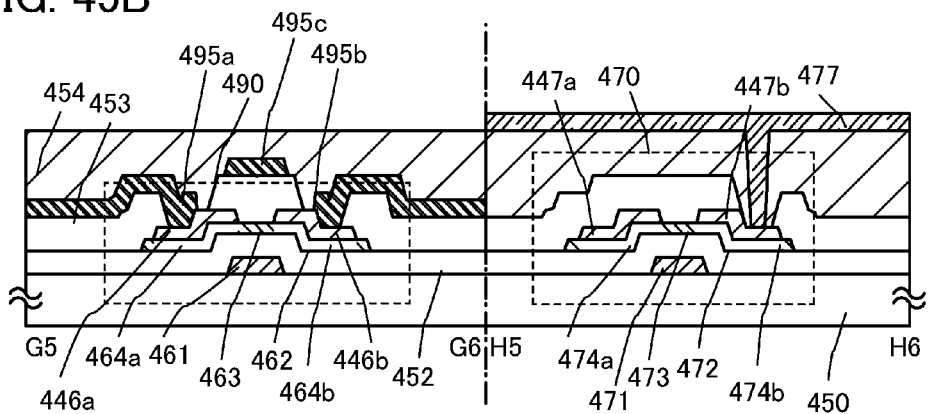
FIG. 45C
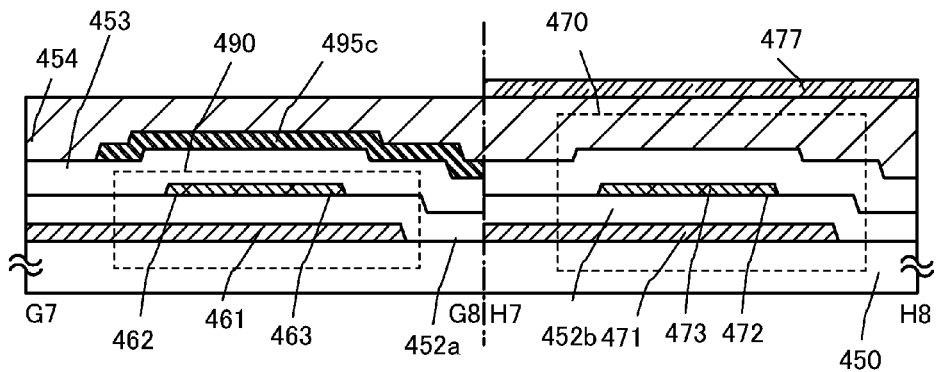

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device including an oxide semiconductor and a manufacturing method thereof.

Note that semiconductor devices in this specification mean all devices which can function by utilizing semiconductor characteristics, and electro-optical devices such as display devices, semiconductor circuits, and electronic devices are all semiconductor devices.

2. Description of the Related Art

In recent years, a technique by which a thin film transistor (TFT) is manufactured using a semiconductor thin film (having a thickness of approximately several nanometers to several hundred nanometers) formed over a substrate having an insulating surface has attracted attention. Thin film transistors have been applied to a wide range of electronic devices such as ICs or electro-optical devices and urgently developed particularly as switching elements in image display devices. Various metal oxides are used for a variety of applications. For example, indium oxide is a well-known material and has been used as a transparent electrode material which is necessary for liquid crystal display devices or the like.

Some metal oxides exhibit semiconductor characteristics. The examples of such metal oxides having semiconductor characteristics are a tungsten oxide, a tin oxide, an indium oxide, a zinc oxide, and the like. A thin film transistor in which a channel formation region is formed using such metal oxides having semiconductor characteristics is known (Patent Document 1 and Patent Document 2).

REFERENCE

Patent Document

[Patent Document 1] Japanese Published Patent Application No. 2007-123861
[Patent Document 2] Japanese Published Patent Application No. 2007-096055

SUMMARY OF THE INVENTION

When a plurality of thin film transistors is manufactured on an insulating surface, for example, there is a portion where a gate wiring and a source wiring intersect with each other. In the intersection, an insulating layer is provided between a gate wiring and a source wiring which has a potential different from that of the gate wiring, and a capacitance is generated due to the insulating layer which functions as a dielectric. This capacitance is also called parasitic capacitance between wirings, and distortion of signal waveforms may occur. Further, when parasitic capacitance is large, signal transmission may be delayed.

Furthermore, an increase in parasitic capacitance leads to a cross talk phenomenon in which an electric signal leaks between wirings and an increase in power consumption.

In an active matrix display device, particularly when large parasitic capacitance is generated between a signal wiring which supplies an image signal and another wiring or an electrode, display quality may be deteriorated.

Moreover, when miniaturization of the circuit is achieved, a distance between wirings is short, and parasitic capacitance between wirings may increase.

An object of an embodiment of the present invention is to provide a semiconductor device which can efficiently reduce parasitic capacitance between wirings.

In addition, when a driver circuit is formed over an insulating surface, operation speed of a thin film transistor used for the driver circuit is preferably high.

For example, when a channel length (also referred to as L) of a thin film transistor is short, or a channel width (also referred to as W) is wide, operation speed is increased. However, when a channel length is short, there is a problem of switching characteristics; for example, an on/off ratio becomes small. When a channel width W is wide, there is a problem in that a capacitance load of a thin film transistor itself is increased.

An object is to provide a semiconductor device provided with a thin film transistor having stable electric characteristics when a channel length is short.

When a plurality of different circuits is formed on an insulating surface, for example, when a pixel portion and a driver circuit are formed over one substrate, a thin film transistor used for the pixel portion is needed to have excellent switching characteristics, for example, a high on/off ratio, and a thin film transistor used for the driver circuit is needed to have high operation speed. In particular, it is needed that time to write a display image becomes short, as a display device has higher definition; therefore, the thin film transistor used for the driver circuit preferably has high operation speed.

An object of an embodiment of the present invention is to provide a semiconductor device provided with a plural kinds of thin film transistors, each of which is formed in accordance with characteristics of a plural kinds of circuits, in which a complicated step is not performed and the plural kinds of circuits are formed over one substrate without an increase in manufacturing cost.

An embodiment of the present invention includes a driver circuit and a pixel portion over one substrate, and thin film transistors in the driver circuit and in the pixel portion. By formation of the driver circuit and the pixel portion over one substrate, a manufacturing cost can be reduced.

According to an embodiment of the present invention, a thin film transistor in a driver circuit (also referred to as a first thin film transistor) and a thin film transistor in a pixel portion (also referred to as a second thin film transistor) are thin film transistors each having a bottom gate structure. Each of the thin film transistors has a gate electrode (also referred to as a gate electrode layer), a source electrode (also referred to as a source electrode layer), a drain electrode (also referred to as a drain electrode layer), and a semiconductor layer having a channel formation region.

According to an embodiment of the present invention, a gate electrode, a source electrode, and a drain electrode of a thin film transistor in a pixel portion are formed using a light-transmitting conductive layer, and a semiconductor layer is formed using a light-transmitting semiconductor layer. That is, the thin film transistor in the pixel portion is formed using a light-transmitting material. Thus, improvement in aperture ratio of the pixel portion is achieved.

According to an embodiment of the present invention, a gate electrode of a thin film transistor in a driver circuit is formed using a material which is the same as that of a gate electrode of a thin film transistor in a pixel portion or a material having a lower resistance value than the material used for the gate electrode of the thin film transistor in the pixel portion. A source and drain electrodes of the thin film transistor in the driver circuit are formed using a material having a lower resistance value than the material used for a source and drain electrodes of the thin film transistor in the pixel portion. Therefore, the resistance values of the source and drain electrodes of the thin film transistor in the pixel portion are higher than the resistance values of the source and drain electrodes of the thin film transistor in the driver circuit.

According to an embodiment of the present invention, a thin film transistor in a driver circuit includes conductive layers between a semiconductor layer and a source electrode and between the semiconductor layer and a drain electrode. It is preferable that the resistance values of the conductive layers be lower than that of the semiconductor layer and higher than those of the source and drain electrode layers. Thus, operation speed of the driver circuit is improved.

According to an embodiment of the present invention, a thin film transistor in a driver circuit includes an oxide insulating layer which is in contact with part of a semiconductor layer and which is in contact with peripheries and side surfaces of conductive layers. The conductive layers are provided between the semiconductor layer and a source electrode and between the semiconductor layer and a drain electrode. With a structure in which the oxide insulating layer is included, a distance between a gate electrode layer and a wiring layer formed above or near the gate electrode layer (such as a source wiring layer or a capacitor wiring layer) is large; thus, parasitic capacitance is reduced. Reduction in parasitic capacitance can lead to suppression of distortion in signal waveforms. In the thin film transistor in the driver circuit, the source electrode is in contact with the conductive layer which is provided between the semiconductor layer and the source electrode, and the drain electrode is in contact with the conductive layer which is provided between the semiconductor layer and the drain electrode.

An embodiment of the present invention is a semiconductor device which includes a driver circuit including a first thin film transistor and a pixel including a second thin film transistor over one substrate. The first thin film transistor includes a first gate electrode layer; a gate insulating layer provided over the first gate electrode layer; a first oxide semiconductor layer, which is provided over the first gate electrode layer with the gate insulating layer therebetween and which includes a first channel formation region; a first oxide conductive layer and a second oxide conductive layer which are provided over the first oxide semiconductor layer; an oxide insulating layer which is in contact with part of the oxide semiconductor layer and which is in contact with peripheries and side surfaces of the first oxide conductive layer and the second oxide conductive layer; a first source electrode layer in contact with the first oxide conductive layer; and a first drain electrode layer in contact with the second oxide conductive layer. The second thin film transistor includes a second gate electrode layer formed using a light-transmitting material; a second oxide semiconductor layer which is provided over the second gate electrode layer with the gate insulating layer therebetween and which includes a second channel formation region; and a second source electrode layer and a second drain electrode layer which are provided over the second oxide semiconductor layer and formed using a light-transmitting material.

Another embodiment of the present invention may be a semiconductor device in which the source and drain electrode layers of the first thin film transistor are each formed using a conductive layer of an element selected from Al, Cr, Cu, Ta, Ti, Mo, and W as a main component, or a stack of any of these elements in combination.

Another embodiment of the present invention may be a semiconductor device in which the source and drain electrode layers of the second thin film transistor are each formed using indium oxide, an indium oxide-tin oxide alloy, an indium oxide-zinc oxide alloy, or zinc oxide.

Another embodiment of the present invention may be a semiconductor device including a capacitor portion over the same substrate over which the first thin film transistor and the second thin film transistor are provided. The capacitor portion may include a capacitor wiring and a capacitor electrode overlapped with the capacitor wiring. The capacitor wiring and the capacitor electrode each may have a light-transmitting property.

Another embodiment of the present invention may be a semiconductor device including a conductive layer which is over an oxide insulating layer of the first thin film transistor and which is overlapped with the channel formation region of the first oxide semiconductor layer.

Another embodiment of the present invention may be a semiconductor device in which the first oxide conductive layer and the second oxide conductive layer are formed using the same material as that of the source and drain electrode layers of the second thin film transistor.

An embodiment of the present invention may be a method for manufacturing a semiconductor device which includes a driver circuit including a first thin film transistor and a pixel portion including a second thin film transistor over one substrate. The method includes the following steps of: forming a first gate electrode layer and a second gate electrode layer; forming a gate insulating layer over the first gate electrode layer and the second gate electrode layer; forming a first oxide semiconductor layer over the first gate electrode layer with the gate insulating layer therebetween, and forming a second oxide semiconductor layer over the second gate electrode layer with the gate insulating layer therebetween; performing dehydration or dehydrogenation on the first oxide semiconductor layer and the second oxide semiconductor layer; forming an oxide conductive film over the first oxide semiconductor layer and the second oxide semiconductor layer; forming a first oxide conductive layer and a second oxide conductive layer over the first oxide semiconductor layer by removing part of the oxide conductive film and forming a second source electrode layer and a second drain electrode layer over the second oxide semiconductor layer; forming an oxide insulating layer over the first oxide conductive layer, the second oxide conductive layer, the second source electrode layer, and the second drain electrode layer; exposing part of the first oxide conductive layer and part of the second oxide conductive layer by removing part of the oxide insulating layer; and forming a first source electrode layer in contact with the exposed first oxide conductive layer and forming a first drain electrode layer in contact with the exposed second oxide conductive layer.

Another embodiment of the present invention may be a method for manufacturing a semiconductor device in which a resist mask is formed using a multi-tone mask, so that the first oxide semiconductor layer, the second oxide semiconductor layer, the first oxide conductive layer, the second oxide conductive layer, the second source electrode layer, and the second drain electrode layer are formed by etching using the resist mask.

The oxide semiconductor used in this specification is, for example, a metal oxide expressed by $InMO_3(ZnO)_m$ (m>0). A thin film including the metal oxide is formed, and a thin film transistor formed using the thin film for an oxide semiconductor layer is manufactured. Note that M denotes one metal element or a plurality of metal elements selected from Ga, Fe, Ni, Mn, and Co. For example, M denotes Ga in some cases; meanwhile, M denotes the above metal element such as Ni or Fe in addition to Ga (Ga and Ni or Ga and Fe) in other cases. Further, the above oxide semiconductor may include Fe or Ni, another transitional metal element, or an oxide of the transitional metal as an impurity element in addition to the metal element included as M. In this specification, an oxide semiconductor layer whose composition formula is represented as $InMO_3(ZnO)_m$ (m>0, m is not an integer) where at least Ga is included as M is referred to as an In—Ga—Zn—O-based oxide semiconductor, and a thin film thereof is also referred to as an In—Ga—Zn—O-based semiconductor film.

As a metal oxide used for the oxide semiconductor layer, any of the following metal oxides can be used in addition to the above: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Moreover, silicon oxide may be included in the oxide semiconductor layer formed using the above metal oxide.

The oxide semiconductor is preferably an oxide semiconductor containing In, more preferably, an oxide semiconductor containing In and Ga. In order to obtain an i-type (intrinsic) oxide semiconductor layer, dehydration or dehydrogenation is effective.

In the case where heat treatment is performed under an atmosphere of an inert gas such as nitrogen or a rare gas (e.g., argon or helium) in the manufacturing process of the semiconductor device, an oxide semiconductor layer is changed into an oxygen-deficient oxide semiconductor layer by the heat treatment to be a low-resistance oxide semiconductor layer, i.e., an n-type (e.g., n$^-$-type) oxide semiconductor layer. Then, the oxide semiconductor layer is made to be in an oxygen-excess state by the formation of an oxide insulating layer which is in contact with the oxide semiconductor layer. Accordingly, part of the oxide semiconductor layer is changed into a high-resistance oxide semiconductor layer, i.e., an i-type oxide semiconductor layer. Thus, it is possible to manufacture and provide a semiconductor device including a highly reliable thin film transistor with favorable electric characteristics.

In the manufacturing process of the semiconductor device, for dehydration or dehydrogenation, heat treatment is performed at higher than or equal to 350° C., preferably higher than or equal to 400° C. and lower than a strain point of the substrate, for example, higher than or equal to 400° C. and lower than or equal to 700° C., more preferably higher than or equal to 420° C. and lower than or equal to 570° C. under an inert gas atmosphere containing nitrogen or a rare gas (argon, helium, or the like), in order to reduce impurities such as moisture contained in the oxide semiconductor layer.

Two peaks of water or at least one peak of water at around 300° C. are/is not detected even when thermal desorption spectroscopy (also referred to as TDS) at up to 450° C. is performed on an oxide semiconductor layer subjected to dehydration or dehydrogenation. Therefore, even when TDS is performed at up to 450° C. on a thin film transistor including the oxide semiconductor layer subjected to dehydration or dehydrogenation, at least the peak of water at around 300° C. is not detected.

In addition, it is important, in the manufacturing process of the semiconductor device, to prevent water or hydrogen from being mixed into the oxide semiconductor layer, with the oxide semiconductor layer not exposed to the air. When a thin film transistor is formed using an i-type oxide semiconductor layer obtained by changing an oxide semiconductor layer into a low-resistance oxide semiconductor layer, i.e., an n-type (e.g., n$^-$-type) oxide semiconductor layer by dehydration or dehydrogenation and then by changing the low-resistance oxide semiconductor layer into a high-resistance oxide semiconductor layer to be an i-type semiconductor layer by supplying oxygen, the threshold voltage of the thin film transistor can be positive, whereby a so-called normally-off switching element can be realized. It is preferable for a semiconductor device that a channel be formed with positive threshold voltage which is as close to 0 V as possible in a thin film transistor. Note that if the threshold voltage of the thin film transistor is negative, the thin film transistor tends to be normally on; in other words, current flows between a source electrode and a drain electrode even when the gate voltage is 0 V. In an active matrix display device, the electric characteristics of a thin film transistor included in a circuit are important and influence the performance of the display device. Among the electric characteristics of the thin film transistor, the threshold voltage ($V_{th}$) is particularly important. For example, when the threshold voltage is high or negative even when the thin film transistor has a high field effect mobility property, it is difficult to control the circuit. In the case where a thin film transistor has high threshold voltage, the thin film transistor cannot perform a switching function as the TFT and might be a load when the TFT is driven at low voltage. For example, in the case of an n-channel thin film transistor, it is preferable that a channel be formed and drain current flow only after positive voltage is applied to a gate electrode. A transistor in which a channel is not formed unless driving voltage is raised and a transistor in which a channel is formed and drain current flows even when negative voltage is applied are unsuitable as a thin film transistor used in a circuit.

In addition, the gas atmosphere in which the temperature is lowered from the heating temperature T may be switched to a gas atmosphere which is different from the gas atmosphere in which the temperature is raised to the heating temperature T. For example, after dehydration or dehydrogenation is performed in a furnace, cooling is performed with the furnace filled with a high-purity oxygen gas or a high-purity $N_2O$ gas without exposure to the air.

The electric characteristics of a thin film transistor are improved using an oxide semiconductor film cooled slowly (or cooled) under an atmosphere which does not contain moisture (having a dew point of lower than or equal to −40° C., preferably lower than or equal to −60° C.) after moisture contained in the film is reduced by heat treatment for dehydration or dehydrogenation, and high-performance thin film transistors which can be mass-produced are realized.

In this specification, heat treatment performed under an atmosphere of an inert gas such as nitrogen or a rare gas (e.g., argon or helium) is referred to as "heat treatment for dehydration or dehydrogenation". In this specification, "dehydrogenation" does not indicate elimination of only $H_2$ by this heat treatment. For convenience, elimination of H, OH, and the like is referred to as "dehydration or dehydrogenation".

In the case where heat treatment is performed under an atmosphere of an inert gas such as nitrogen or a rare gas (e.g., argon or helium) in the manufacturing process of the semiconductor device, an oxide semiconductor layer is changed into an oxygen-deficient oxide semiconductor layer by the heat treatment to be a low-resistance oxide semiconductor layer, i.e., an n-type (e.g., n$^-$-type) oxide semiconductor layer. As a result, a region of the oxide semiconductor layer which is overlapped with a source electrode layer is formed as a high-resistance source region (also referred to as an HRS region) which is an oxygen-deficient region, and a region of the oxide semiconductor layer which is overlapped with a drain electrode layer is formed as a high-resistance drain region (also referred to as an HRD region) which is an oxygen-deficient region.

Specifically, the carrier concentration of the high-resistance drain region is higher than or equal to $1\times10^{18}/cm^3$ and is at least higher than the carrier concentration of a channel formation region (lower than $1\times10^{18}/cm^3$). Note that the carrier concentration in this specification is carrier concentration obtained by Hall effect measurement at room temperature.

A low-resistance source region (also referred to as a LRS region) and a low-resistance drain region (also referred to as a LRD region) may be formed between a drain electrode layer formed using a metal material and an oxide semiconductor layer. Specifically, the carrier concentration of the low-resistance drain region is higher than that of the high-resistance drain region (HRD region), for example, in the range of higher than or equal to $1\times10^{20}/cm^3$ and lower than or equal to $1\times10^{21}/cm^3$.

Then, a channel formation region is formed by making at least part of the oxide semiconductor layer subjected to dehydration or dehydrogenation be in an oxygen-excess state so as to obtain a high-resistance oxide semiconductor layer, i.e., an i-type oxide semiconductor layer. Note that as a method for making the oxide semiconductor layer subjected to dehydration or dehydrogenation be in an oxygen-excess state, a method for forming an oxide insulating layer which is in contact with the oxide semiconductor layer subjected to dehydration or dehydrogenation can be given. Examples of the method for forming an oxide insulating layer include a sputtering method. In addition, after the formation of the oxide insulating layer, heat treatment (e.g., heat treatment under an atmosphere containing oxygen), cooling treatment under an oxygen atmosphere or cooling treatment in ultra-dry air (having a dew point of lower than or equal to $-40°$ C., preferably lower than or equal to $-60°$ C.) after heating under an inert gas atmosphere, or the like may be performed.

Further, in order to make at least part of the oxide semiconductor layer subjected to dehydration or dehydrogenation (a portion overlapped with a gate electrode layer) serve as the channel formation region, the oxide semiconductor layer is selectively made to be in an oxygen-excess state so as to be a high-resistance oxide semiconductor layer, i.e., an i-type oxide semiconductor layer. The channel formation region can be formed in such a manner that a source electrode layer and a drain electrode layer formed using metal electrodes of Ti or the like are formed on and in contact with the oxide semiconductor layer subjected to dehydration or dehydrogenation and an exposed region which does not overlap with the source electrode layer and the drain electrode layer is selectively made to be in an oxygen-excess state. In the case where the oxide semiconductor layer is selectively made to be in an oxygen-excess state, a high-resistance source region overlapped with the source electrode layer and a high-resistance drain region overlapped with the drain electrode layer are formed, and the channel formation region is formed between the high-resistance source region and the high-resistance drain region. In other words, the channel formation region is formed between the source electrode layer and the drain electrode layer in a self-aligned manner.

According to an embodiment of the present invention, it is possible to manufacture and provide a semiconductor device including a highly reliable thin film transistor with favorable electric characteristics.

Note that by the formation of the high-resistance drain region (and the high-resistance source region) in part of the oxide semiconductor layer, which overlaps with the drain electrode layer (and the source electrode layer), reliability of a driver circuit can be improved. Specifically, when the high-resistance drain region is formed, a transistor can have a structure in which conductivity is gradually changed from the drain electrode layer to the high-resistance drain region and the channel formation region. Thus, in the case where operation is performed with the drain electrode layer electrically connected to a wiring for supplying a high power supply potential VDD, the high-resistance drain region serves as a buffer, and thus local concentration of an electric field does not occur even if the high electric field is applied between the gate electrode layer and the drain electrode layer, which leads to an increase in the withstand voltage of the transistor.

In addition, by the formation of the high-resistance drain region (and the high-resistance source region), the amount of leakage current in the driver circuit can be reduced. Specifically, by the formation of the high-resistance source region and the high-resistance drain region, the leakage current of the transistor, which flows between the drain electrode layer and the source electrode layer, flows from the drain electrode layer through the high-resistance drain region, the channel formation region, and the high-resistance source region to the source electrode layer. In this case, in the channel formation region, leakage current flowing from the high-resistance drain region to the channel formation region can be concentrated in the vicinity of an interface between the channel formation region and a gate insulating layer which has high resistance when the transistor is in an off state. Thus, the amount of leakage current in a back channel portion (part of a surface of the channel formation region, which is apart from the gate electrode layer) can be reduced.

Further, the high-resistance source region overlapped with the source electrode layer and the high-resistance drain region overlapped with the drain electrode layer overlap with part of the gate electrode layer with the gate insulating layer therebetween depending on the width of the gate electrode layer, and the intensity of an electric field in the vicinity of an end portion of the drain electrode layer can be reduced more effectively.

Note that the ordinal numbers such as "first" and "second" in this specification are used for convenience and do not denote the order of steps and the stacking order of layers. In addition, the ordinal numbers in this specification do not denote particular names which specify the present invention.

As a display device including a driver circuit, a light-emitting display device in which a light-emitting element is used and a display device in which an electrophoretic display element is used, which is also referred to as "electronic paper", are given in addition to a liquid crystal display device.

In a light-emitting display device in which a light-emitting element is used, a pixel portion includes a plurality of thin film transistors. The pixel portion includes a region where a gate electrode of one thin film transistor is connected to a source wiring (also referred to as a source wiring layer) or a drain wiring (also referred to as a drain wiring layer) of another thin film transistor. In addition, in a driver circuit of the light-emitting display device in which a light-emitting element is used, there is a region where a gate electrode of a thin film transistor is connected to a source wiring or a drain wiring of the thin film transistor.

When a pixel portion and a driver circuit are formed over one substrate in a liquid crystal display device, in the driver circuit, only either positive polarity or negative polarity is applied between the source and drain electrodes in a thin film transistor for constituting a logic gate such as an inverter circuit, a NAND circuit, a NOR circuit, or a latch circuit or a thin film transistor for constituting an analog circuit such as a sense amplifier, constant voltage generating circuit, or a VCO. Therefore, the high-resistance drain region which requires high withstand voltage may be designed to be wider than the high-resistance source region. In addition, the width of portions of each of the high-resistance source region and the high-resistance drain region overlapped with the gate electrode layer may be increased.

A thin film transistor having a single-gate structure is described as the thin film transistor provided for a driver circuit; however, a thin film transistor having a multi-gate structure in which a plurality of channel formation regions is included can also be used as needed.

An AC drive is performed in the liquid crystal display device in order to prevent deterioration of a liquid crystal. Through the AC drive, the polarity of a signal potential applied to a pixel electrode layer is inverted to be negative or positive at regular intervals of time. In a TFT electrically connected to the pixel electrode layer, a pair of electrodes functions alternately as a source electrode layer and a drain electrode layer. In this specification, one of a pair of electrodes of the thin film transistor in a pixel is referred to as a source electrode layer and the other is referred to as a drain electrode layer; actually in AC drive, one electrode functions alternately as the source electrode layer and the drain electrode layer. In order to reduce leakage current, the width of the gate electrode layer of the thin film transistor provided for the pixel may be narrower than the width of the gate electrode layer of the thin film transistor provided for a driver circuit. In order to reduce the leakage current, the gate electrode layer of the thin film transistor provided for a pixel may be designed so as not to overlap with the source or drain electrode layer.

According to an embodiment of the present invention, a thin film transistor having stable electric characteristics can be manufactured and provided. Thus, a semiconductor device which includes highly reliable thin film transistors with favorable electric characteristics can be provided.

BRIEF DESCRIPTION OF THE DRAWINGS

In the accompanying drawings:
FIGS. 1A1, 1A2, 1B, and 1C are views illustrating a semiconductor device;
FIGS. 7A and 7B are views each illustrating a semiconductor device;
FIGS. 8A and 8B are views each illustrating a semiconductor device;
FIGS. 10A1, 10A2, and 10B are views each illustrating a semiconductor device;
FIGS. 13A to 13C are views each illustrating a semiconductor device;
FIGS. 38A1, 38A2, 38B, and 38C are views illustrating a semiconductor device;
FIGS. 43A1, 43A2, 43B, and 43C are views illustrating a semiconductor device;
FIGS. 45A1, 45A2, 45B, and 45C are views illustrating a semiconductor device.

DETAILED DESCRIPTION OF THE INVENTION

Figure 2A:
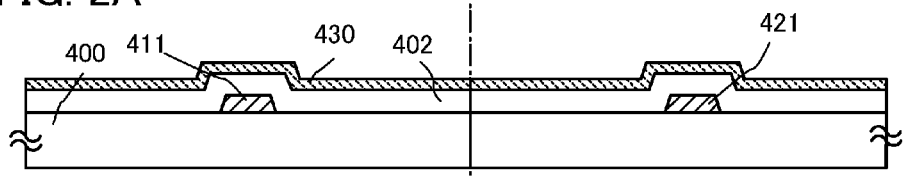
FIGS. 2A to 2E are views illustrating a method for manufacturing a semiconductor device.

Embodiments will be described in detail with reference to the drawings. However, the present invention is not limited to the following description, and various changes for the modes and details thereof will be apparent to those skilled in the art unless such changes depart from the spirit and the scope of the invention. Therefore, the present invention should not be interpreted as being limited to what is described in the embodiments below. In the structures to be given below, the same portions or portions having similar functions are denoted by the same reference numerals in different drawings, and explanation thereof will not be repeated.

Note that contents described in each of the following embodiments can be combined with or replaced with each other as appropriate.

(Embodiment 1)

A semiconductor device and a method for manufacturing the semiconductor device will be described with reference to FIGS. 1A1, 1A2, 1B, and 1C, FIGS. 2A to 2E, and FIGS. 3A to 3D. FIGS. 1A1, 1A2, 1B, and 1C illustrate an example of a cross-sectional structure of two thin film transistors formed over one substrate. Thin film transistors 410 and 420 illustrated in FIGS. 1A1, 1A2, 1B, and 1C are thin film transistors having a bottom-gate structure.

FIG. 1A1 is a plan view of the thin film transistor 410 provided in a driver circuit. FIG. 1A2 is a plan view of the thin film transistor 420 provided in a pixel. FIG. 1B is a cross-sectional view illustrating a cross-sectional structure taken along line C1-C2 of FIG. 1A1 and a cross-sectional structure taken along line D1-D2 of FIG. 1A2. FIG. 1C is a cross-sectional view illustrating a cross-sectional structure taken along line C3-C4 of FIG. 1A1 and a cross-sectional structure taken along line D3-D4 of FIG. 1A2.

The thin film transistor 410 provided in the driver circuit includes a gate electrode layer 411, a gate insulating layer 402, an oxide semiconductor layer 412 which includes at least a channel formation region 413, a high-resistance source region 414a, and a high-resistance drain region 414b, a low-resistance source region 408a, a low-resistance drain region 408b, a source electrode layer 415a, and a drain electrode layer 415b over a substrate 400 having an insulating surface. In addition, the thin film transistor 410 includes an oxide insulating layer 416 which is in contact with the oxide semiconductor layer 412 and peripheries and side surfaces of the low-resistance source region 408a and the low-resistance drain region 408b.

The high-resistance source region 414a is formed in a self-aligning manner in contact with a lower surface of the low-resistance source region 408a. Further, the high-resistance drain region 414b is formed in a self-aligning manner in contact with a lower surface of the low-resistance drain region 408b. Furthermore, the channel formation region 413 is in contact with the oxide insulating layer 416, and is a high-resistance region (i-type region) as compared with the high-resistance source region 414a and the high-resistance drain region 414b.

The source electrode layer 415a is in contact with the low-resistance source region 408a and the drain electrode layer 415b is in contact with the low-resistance drain region 408b.

For the source electrode layer 415a and the drain electrode layer 415b, a metal material is preferably used in order to reduce the resistance of a wiring.

In addition, by providing the low-resistance source region 408a and the low-resistance drain region 408b, stable operation can be realized in terms of heat in comparison with a Schottky junction. A low-resistance drain region whose carrier concentration is higher than that of the oxide semiconductor layer is intentionally provided, so that ohmic contact is formed.

A conductive layer 417 which overlaps with the channel formation region 413 is formed above the channel formation region 413. The conductive layer 417 is electrically connected to the gate electrode layer 411 so as to have the same potential, so that gate voltage can be applied from above and below the oxide semiconductor layer 412 provided between the gate electrode layer 411 and the conductive layer 417. When the gate electrode layer 411 and the conductive layer 417 have different potentials, for example, a predetermined potential, a GND potential, or 0 V, electric characteristics of the TFT, such as threshold voltage, can be controlled. That is, one of the gate electrode layer 411 and the conductive layer 417 functions as a first gate electrode layer, and the other of the gate electrode layer 411 and the conductive layer 417 functions as a second gate electrode layer, whereby the thin film transistor 410 can be used as a thin film transistor having four terminals.

A planarizing insulating layer 404 is provided between the conductive layer 417 and the source and drain electrode layers 415a and 415b, and the oxide insulating layer 416.

The thin film transistor 420 provided in the pixel includes a gate electrode layer 421, the gate insulating layer 402, an oxide semiconductor layer 422 which includes at least a channel formation region 423, a high-resistance source region 424a, and a high-resistance drain region 424b, a source electrode layer 409a, and a drain electrode layer 409b over the substrate 400 having an insulating surface. In addition, the thin film transistor 420 includes the oxide insulating layer 416 which is in contact with the oxide semiconductor layer 422.

The high-resistance source region 424a is formed in a self-aligning manner in contact with a lower surface of the source electrode layer 409a. Further, the high-resistance drain region 424b is formed in a self-aligning manner in contact with a lower surface of the drain electrode layer 409b. Furthermore, the channel formation region 423 is in contact with the oxide insulating layer 416, and is a high-resistance region (i-type region) as compared with the high-resistance source region 424a and the high-resistance drain region 424b.

The oxide semiconductor layer 412 is partly overlapped with the source and drain electrode layers 415a and 415b. The oxide semiconductor layer 412 is overlapped with the gate electrode layer 411 with the gate insulating layer 402 interposed therebetween. That is, the gate electrode layer 411 is provided below the oxide semiconductor layer 412 with the gate insulating layer 402 interposed therebetween. In addition, the oxide semiconductor layer 422 is partly overlapped with the source and drain electrode layers 409a and 409b. Moreover, the oxide semiconductor layer 422 is overlapped with the gate electrode layer 421 with the gate insulating layer 402 interposed therebetween. That is, the gate electrode layer 421 is provided below the oxide semiconductor layer 422 with the gate insulating layer 402 interposed therebetween.

A light-transmitting material is used for the source and drain electrode layers 409a and 409b in order to realize a display device having a high aperture ratio using a light-transmitting thin film transistor. Note that a material having lower resistance than the source and drain electrode layers 409a and 409b is preferably used for the source and drain electrode layers 415a and 415b.

A light-transmitting material is also used for the gate electrode layer 421.

In the pixel in which the thin film transistor 420 is provided, a conductive layer having a light-transmitting property to visible light is used as a pixel electrode layer 427, another electrode layer (such as a capacitor electrode layer), or a wiring layer (such as a capacitor wiring layer), so that a display device having a high aperture ratio is realized. Needless to say, the gate insulating layer 402, the oxide insulating layer 416, and the planarizing insulating layer 404 are preferably formed using a film having a light-transmitting property to visible light.

The planarizing insulating layer 404 is provided between the pixel electrode layer 427 and the source and drain electrode layers 409a and 409b, and the oxide insulating layer 416.

The pixel electrode layer 427 is in contact with the drain electrode layer 409b through an opening (also referred to as a contact hole) provided in the oxide insulating layer 416 and an opening provided in the planarizing insulating layer 404.

Note that heat treatment (heat treatment for dehydration or dehydrogenation) in which impurities such as moisture are reduced is performed after formation of an oxide semiconductor film which is used for forming the oxide semiconductor layer 412 and the oxide semiconductor layer 422. After the heat treatment for dehydration or dehydrogenation and slow cooling, the carrier concentration of the oxide semiconductor layers is decreased by forming the oxide insulating layer in contact with the oxide semiconductor layers 412 and 422 or the like, which leads to improvement in electric characteristics and reliability of the thin film transistors 410 and 420.

In this specification, a film having a light-transmitting property to visible light means a film having a transmittance of visible light of 75% to 100%, and the film having a conductive property is also referred to as a transparent conductive film. Further, the gate electrode layer, the source electrode layer, the drain electrode layer, the pixel electrode layer, another electrode layer, and a wiring layer may be formed using a conductive film having a semi-light-transmitting property to visible light. Being semi-light-transmitting to visible light means having a transmittance of visible light of 50% to 75%.

Note that in the semiconductor device illustrated in FIGS. 1A1, 1A2, 1B, and 1C, channel lengths of the thin film transistors 410 and 420 are the same as an example; however, the present invention is not limited thereto. For example, since a thin film transistor for a driver circuit requires higher speed operation than a thin film transistor for a pixel, the channel length of the thin film transistor 410 may be narrower than that of the thin film transistor 420. At this time, the channel length of the thin film transistor 410 is preferably approximately 1 μm to 5 μm, and the channel length of the thin film transistor 420 is preferably approximately 5 μm to 20 μm.

As described above, the semiconductor device illustrated in FIGS. 1A1, 1A2, 1B, and 1C includes a driver circuit having a first thin film transistor and a pixel having a second thin film transistor over one substrate. The second thin film transistor is formed using a light-transmitting material and the first thin film transistor is formed using a material having a lower resistance than the light-transmitting material. Thus, the aperture ratio of the pixel can be improved, and operation speed of the driver circuit can be improved. By providing a driver circuit and a pixel over one substrate, the number of the wirings which electrically connect the driver circuit and the pixel to each other can be decreased and the total length of the wirings which electrically connect the driver circuit and the pixel to each other can be shortened, so that reduction in the size of a semiconductor device and in cost can be achieved.

The semiconductor device illustrated in FIGS. 1A1, 1A2, 1B, and 1C includes, in the thin film transistor for the driver circuit, the low-resistance source region and the low-resistance drain region between the source and drain electrode layers and the oxide semiconductor layer in which the channel formation region is formed. The low-resistance source region and the low-resistance drain region are provided, so that frequency characteristics of a peripheral circuit (driver circuit) can be improved. This is because contact resistance can be further decreased by contact of a metal electrode layer and a low-resistance source region and a low-resistance drain region as compared with by direct contact of the metal electrode layer and an oxide semiconductor layer. An electrode layer using molybdenum (such as a stacked layer of a molybdenum layer, an aluminum layer, and a molybdenum layer) has high contact resistance with the oxide semiconductor layer because molybdenum is difficult to oxidize in comparison with titanium, for example. This is because extraction of oxygen from the oxide semiconductor layer is weak, so that a contact interface between the molybdenum layer and the oxide semiconductor layer does not become n-type. However, the low-resistance source region and the low-resistance drain region are interposed between the oxide semiconductor layer and the source and drain electrode layers, whereby contact resistance can be decreased, which can lead to improvement in frequency characteristics of a peripheral circuit (driver circuit). By providing the low-resistance source region and the low-resistance drain region, the channel length of the thin film transistor is determined at the time of etching of the layer which is to be the low-resistance source region and the low-resistance drain region; therefore, the channel length can be further shortened.

The semiconductor device illustrated in FIGS. 1A1, 1A2, 1B, and 1C has a structure in which an oxide insulating layer is in contact with part of the oxide semiconductor layer and a periphery and side surfaces of an oxide conductive layer which is in contact with the source and drain electrode layers. With the structure, when an portion in which a wiring formed of the same layer as the gate electrode layer and a wiring formed of the same layer as the source and drain electrode layers are intersected with each other with an insulating layer interposed therebetween at the periphery of the thin film transistor, an interval between the wiring formed of the same layer as the gate electrode layer and the wiring formed of the same layer as the source and drain electrode layers can be increased; thus, parasitic capacitance can be reduced.

The semiconductor device illustrated in FIGS. 1A1, 1A2, 1B, and 1C can have, in the thin film transistor in the driver circuit, a conductive layer which is overlapped with a channel formation region with the oxide insulating layer and the planarizing insulating layer interposed therebetween and formed using a light-transmitting material; thus, threshold voltage of the thin film transistor can be controlled.

Figure 6:
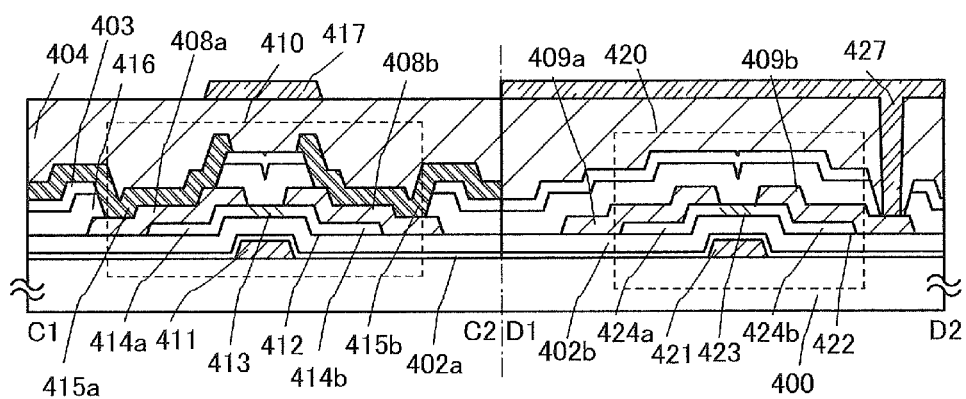
FIG. 6 is a view illustrating a semiconductor device.

Further, the transistor of this embodiment can have a structure illustrated in FIG. 6. The semiconductor device illustrated in FIG. 6 is different from the semiconductor device illustrated in FIGS. 1A1, 1A2, 1B, and 1C in the following points: a gate insulating layer is formed using a stacked layer of a plurality of insulating layers; and a protective insulating layer is formed over an oxide insulating layer which is in contact with a semiconductor layer. That is, the semiconductor device illustrated in FIG. 6 has a stacked layer of a gate insulating layer 402a and a gate insulating layer 402b instead of the gate insulating layer 402 illustrated in FIGS. 1A1, 1A2, 1B, and 1C, and has a protective insulating layer 403 over the oxide insulating layer 416 illustrated in FIGS. 1A1, 1A2, 1B, and 1C. The description of the other components of the semiconductor device illustrated in FIG. 6 which is the same as the description of corresponding components of the semiconductor device illustrated in FIGS. 1A1, 1A2, 1B, and 1C is made using the description of the semiconductor device illustrated in FIGS. 1A1, 1A2, 1B, and 1C thereto as appropriate, and is omitted here.

As the gate insulating layers 402a and 402b, for example, a material which can be applied to the gate insulating layer 402 illustrated in FIGS. 1A1, 1A2, 1B, and 1C can be used. For example, a nitride insulating layer can be used for the gate insulating layer 402a, and an oxide insulating layer can be used for the gate insulating layer 402b.

An example of a manufacturing process of the thin film transistors 410 and 420 is described below with reference to FIGS. 2A to 2E and FIGS. 3A to 3D.

After a light-transmitting conductive film is formed over the substrate 400 having an insulating surface, a resist mask is formed over part of the conductive film by a first photolithography process, and then, the conductive film is etched using the resist mask; thus, the gate electrode layers 411 and 421 are formed. In the pixel portion, a capacitor wiring (also referred to as a capacitor wiring layer) is formed using the same material as the gate electrode layers 411 and 421 by the same first photolithography process. When a capacitor is required for not only a pixel but also a driver circuit, a capacitor wiring is also formed in the driver circuit. Note that the resist mask may be formed by an inkjet method. When the resist mask is formed by an inkjet method, a photomask is not used, which leads to reduction in manufacturing cost.

Although there is no particular limitation on a substrate which can be used for the substrate 400 having an insulating surface, it is necessary that the substrate have at least enough heat resistance to heat treatment to be performed later. For example, a glass substrate or the like can be used as the substrate 400 having an insulating surface.

As the glass substrate, in the case where the temperature of the heat treatment to be performed later is high, the one whose strain point is 730° C. or higher is preferably used. Further, as a material of the glass substrate, for example, a glass material such as aluminosilicate glass, aluminoborosilicate glass, or barium borosilicate glass is used. Note that by containing a larger amount of barium oxide (BaO) than boric acid, more-practical heat resistant glass can be obtained. Therefore, it is preferable that a glass substrate containing more BaO than $B_2O_3$ be used.

Note that a substrate formed of an insulator such as a ceramic substrate, a quartz substrate, or a sapphire substrate may be used for the substrate 400, instead of the glass substrate. Alternatively, crystallized glass or the like may be used for the substrate 400.

An insulating film serving as a base film may be provided between the substrate 400 and the gate electrode layers 411 and 421. The base film has a function of preventing diffusion of an impurity element from the substrate 400, and can be formed to have a single film or stacked film using one or more of a silicon nitride film, a silicon oxide film, a silicon nitride oxide film, and a silicon oxynitride film.

As a material of the gate electrode layers 411 and 421, a conductive material having a light-transmitting property to visible light can be applied. For example, a conductive metal oxide such as an In—Sn—Zn—O-based conductive metal oxide, an In—Al—Zn—O-based conductive metal oxide, a Sn—Ga—Zn—O-based conductive metal oxide, an Al—Ga—Zn—O-based conductive metal oxide, a Sn—Al—Zn—O-based conductive metal oxide, an In—Zn—O-based conductive metal oxide, a Sn—Zn—O-based conductive metal oxide, an Al—Zn—O-based conductive metal oxide, an In—Sn—O-based condutive metal oxide, an In—O-based conductive metal oxide, a Sn—O-based conductive metal oxide, and a Zn—O-based conductive metal oxide. The thickness of the gate electrode layers 411 and 421 are in the range of 50 nm to 300 nm. For a formation method of the metal oxide used for the gate electrode layers 411 and 421, a sputtering method, a vapor evaporation method (such as an electron beam evaporation method), an arc discharge ion plating method, or a splay method can be used. When a sputtering method is employed, the conductive film which is to be the gate electrode layers 411 and 421 are formed using a target containing $SiO_2$ at 2 wt % to 10 wt % inclusive, so that the light-transmitting conductive film which is to be formed may include $SiO_x$ (x>0) which suppresses crystallization. Accordingly, crystallization can be suppressed in heat treatment for dehydration or dehydrogenation which is to be performed later.

Next, the resist mask is removed, and the gate insulating layer 402 is formed over the gate electrode layers 411 and 421.

The gate insulating layer 402 can be formed using a single layer or stacked layer of a silicon oxide layer, a silicon nitride layer, a silicon oxynitride layer, and/or a silicon nitride oxide layer with a plasma CVD method, a sputtering method, or the like. For example, when a silicon oxynitride layer is formed, it may be formed with a plasma CVD method using $SiH_4$, oxygen, and nitrogen as a deposition gas. The thickness of the gate insulating layer 402 is set to 100 nm to 500 nm, inclusive. In the case of a stacked-layer structure, for example, a stacked-layer structure of the first gate insulating layer with a thickness of 50 nm to 200 nm, inclusive, and the second gate insulating layer with a thickness of 5 nm to 300 nm, inclusive.

In this embodiment, the gate insulating layer 402 is a silicon nitride layer with a thickness of 200 nm or less formed with a plasma CVD method.

Then, an oxide semiconductor film 430 is formed, over the gate insulating layer 402, to a thickness of 2 nm to 200 nm, inclusive (see FIG. 2A). Since the oxide semiconductor layer which is to be formed later is in an amorphous state even when heat treatment for dehydration or dehydrogenation is performed after formation of the oxide semiconductor film 430, the thickness is preferably as thin as 50 nm or less. By decreasing the thickness of the oxide semiconductor film 430, the oxide semiconductor layer which is to be formed later can be prevented from being crystallized when heat treatment is performed after formation of the oxide semiconductor film 430.

Note that before the oxide semiconductor film 430 is formed by a sputtering method, dust attached to a surface of the gate insulating layer is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that a nitrogen atmosphere, a helium atmosphere, an oxygen atmosphere, or the like may be used instead of an argon atmosphere.

As the oxide semiconductor film 430, any of the following can be applied: an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—Sn—O-based oxide semiconductor film, an In—O-based oxide semiconductor film, a Sn—O-based oxide semiconductor film, and a Zn—O-based oxide semiconductor film. In this embodiment, the oxide semiconductor film 430 is formed using an In—Ga—Zn—O-based oxide semiconductor target by a sputtering method. Alternatively, the oxide semiconductor film 430 can be formed by a sputtering method under a rare gas (typically argon) atmosphere, an oxygen atmosphere, or an atmosphere including a rare gas (typically argon) and oxygen. When a sputtering method is employed, the oxide semiconductor film 430 is formed using a target containing $SiO_2$ at 2 wt % to 10 wt % inclusive, so that the oxide semiconductor film 430 may include $SiO_x$ (x>0) which suppresses crystallization. Accordingly, crystallization of the oxide semiconductor layer can be suppressed in heat treatment for dehydration or dehydrogenation which is to be performed later.

Next, a resist mask is formed over the oxide semiconductor film 430 by a second photolithography process. Etching is selectively performed using the resist mask, whereby the oxide semiconductor film 430 is processed into an island-shaped oxide semiconductor layer. Alternatively, the resist mask for forming an island-shaped oxide semiconductor layer may be formed by an inkjet method. When the resist mask is formed by an inkjet method, a photomask is not used, which leads to reduction in manufacturing cost.

The resist mask is removed, and the oxide semiconductor layer is dehydrated or dehydrogenated. First heat treatment for dehydration or dehydrogenation is performed at higher than or equal to 400° C. and lower than a strain point of the substrate, for example, higher than or equal to 400° C. and lower than or equal to 700° C., preferably higher than or equal to 425° C. and lower than or equal to 700° C. Note that when the temperature is higher than or equal to 425° C. and lower than or equal to 700° C., heat treatment may be performed for one hour or less; however, when the temperature is lower than 425° C., heat treatment is performed for longer than one hour. Here, the substrate 400 over which the oxide semiconductor layer is formed is introduced into an electric furnace, which is one of heat treatment apparatuses. After heat treatment is performed on the oxide semiconductor layers under a nitrogen atmosphere, the oxide semiconductor layer is not exposed to the air and water or hydrogen are prevented from being mixed into the oxide semiconductor layer again; thus, an oxide semiconductor layer 431 and an oxide semiconductor layer 432 whose resistance is reduced are obtained (see FIG. 2B). In this embodiment, the same furnace is used from a heat temperature T at which dehydration or dehydrogenation of the oxide semiconductor layer is performed to a temperature low enough to prevent water or hydrogen from entering again; specifically, slow cooling is performed under a nitrogen atmosphere until the temperature becomes lower than heating temperature T by 100° C. or more. There is no limitation on a nitrogen atmosphere, and dehydration or dehydrogenation may be performed under a rare gas atmosphere such as helium, neon, or argon.

Note that it is preferable that in the first heat treatment, water, hydrogen, and the like be not contained in nitrogen or a rare gas such as helium, neon, or argon. Alternatively, it is preferable that nitrogen or a rare gas such as helium, neon, or argon introduced into a heat treatment apparatus have purity of 6N (99.9999%) or more, preferably, 7N (99.99999%) or more; that is, an impurity concentration of nitrogen or a rare gas such as helium, neon, or argon introduced into a heat treatment apparatus is set to 1 ppm or lower, preferably 0.1 ppm or lower.

The oxide semiconductor layer becomes a microcrystalline layer or a polycrystalline layer by crystallization in some cases, depending on a condition of the first heat treatment or a material of the oxide semiconductor layer.

The first heat treatment can be performed on the oxide semiconductor film which has not yet been processed into the island-shaped oxide semiconductor layer. In that case, the substrate is taken out from the heating apparatus after the first heat treatment. A photolithography process is performed, and a resist mask is formed. Etching is selectively performed using the resist mask, whereby the oxide semiconductor film is processed.

When heat treatment (at higher than or equal to 400° C. and lower than a strain point of the substrate) is performed under an inert gas atmosphere (nitrogen or a rare gas such as helium, neon, or argon) or under an oxygen atmosphere before formation of the oxide semiconductor film, impurities such as hydrogen and water contained in the gate insulating layer may be removed.

Next, an oxide conductive film is formed over the oxide semiconductor layers 431 and 432 and the gate insulating layer 402. A third photolithography process is performed to form a resist mask 433a and a resist mask 433b. Accordingly, etching is selectively performed to form an oxide conductive layer 406 and an oxide conductive layer 407 (see FIG. 2C). As a material of the oxide conductive film, a conductive material having a light-transmitting property to visible light can be applied. For example, a conductive metal oxide such as an In—Sn—Zn—O-based conductive metal oxide, an In—Al—Zn—O-based conductive metal oxide, a Sn—Ga—Zn—O-based conductive metal oxide, an Al—Ga—Zn—O-based conductive metal oxide, a Sn—Al—Zn—O-based conductive metal oxide, an In—Zn—O-based conductive metal oxide, a Sn—Zn—O-based conductive metal oxide, an Al—Zn—O-based conductive metal oxide, an In—Sn—O-based conductive metal oxide, an Al—Zn—O—N-based conductive metal oxide, an In—O-based conductive metal oxide, a Sn—O-based conductive metal oxide, and a Zn—O-based conductive metal oxide. The thickness of the oxide conductive film is selected in the range of 50 nm to 300 nm, as appropriate. When a sputtering method is employed as a formation method of the oxide conductive film, the oxide conductive film is formed using a target containing $SiO_2$ at 2 wt % to 10 wt % inclusive, so that the light-transmitting conductive film may include $SiO_x$ (x>0) which suppresses crystallization. Accordingly, crystallization of the oxide conductive layers 406 and 407 which are to be formed later can be suppressed in heat treatment for dehydration or dehydrogenation which is to be performed later.

Note that in the method for manufacturing a semiconductor device in this embodiment, the above-described dehydration or dehydrogenation of the oxide semiconductor layer (first heat treatment) can be performed after the oxide conductive film or the oxide conductive layers 406 and 407 are formed.

An oxide semiconductor target including In, Ga, and Zn ($In_2O_3$:$Ga_2O_3$:ZnO=1:1:1 [in a molar ratio], In:Ga:Zn=1:1:0.5 [in an atomic ratio]) is used. The oxide semiconductor film 430 is formed under the following condition: the distance between the substrate and the target is 100 mm, the pressure is 0.2 Pa, the direct current (DC) power is 0.5 kW, and the atmosphere is a mixed atmosphere of argon and oxygen (argon:oxygen=30 sccm:20 sccm and the oxygen flow rate is 40%). Note that a pulse direct current (DC) power supply is preferable because dust can be reduced and the film thickness can be uniform. The In—Ga—Zn—O-based non-single-crystal film is formed to have a thickness of 5 nm to 200 nm. In this embodiment, as the oxide semiconductor film, an In—Ga—Zn—O-based non-single-crystal film with a thickness of 20 nm is formed using an In—Ga—Zn—O-based oxide semiconductor target by a sputtering method. A target material including such as In:Ga:ZnO=1:1:1 or In:Ga:ZnO=1:1:4 can be used for the oxide semiconductor target material.

Examples of a sputtering method include an RF sputtering method in which a high-frequency power source is used for a sputtering power supply, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is a multi-source sputtering apparatus in which a plurality of targets of different materials can be set. With the multi-source sputtering apparatus, films of different materials can be deposited to be stacked in the same chamber, and a film of plural kinds of materials can be deposited by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a deposition method by a sputtering method, there are also a reactive sputtering method in which a target substance and a sputtering gas component are chemically reacted with each other during deposition to form a thin compound film thereof, and a bias sputtering method in which voltage is also applied to a substrate during deposition.

Next, the resist masks 433a and 433b are removed, and a fourth photolithography process is performed to form a resist mask 436a and a resist mask 436b. Etching is selectively performed, so that the low-resistance source region 408a, the low-resistance drain region 408b, and the source and drain electrode layers 409a and 409b are formed using the oxide conductive layer (see FIG. 2D). Note that the resist masks for forming the low-resistance source region 408a, the low-resistance drain region 408b, and the source and drain electrode layers 409a and 409b may be formed by an inkjet method. When the resist masks are formed by an inkjet method, a photomask is not used, which leads to reduction in manufacturing cost.

Note that in this etching step, the etching condition is preferably determined as appropriate so as not to etch the oxide semiconductor layer 431 and the oxide semiconductor layer 432, which are lower layers. For example, the etching time may be controlled.

Further, each for a material of the oxide semiconductor layers 431 and 432 and a material of the oxide conductive layers 406 and 407, a material having a high etching selection ratio is preferably used. For example, a metal oxide material containing Sn (e.g., $SnZnO_x$ (x>0), $SnGaZnO_x$ (x>0), or the like) may be used for a material of the oxide semiconductor layers 431 and 432, an Al—Zn—O-based material, an Al—Zn—O—N-based material, a Zn—O-based material, or the like may be used for a material of the oxide conductive layers 406 and 407. Such a material containing zinc oxide as its main component can be etched using an alkaline solution, for example. When a material containing aluminum such as an Al—Zn—O-based material or an Al—Zn—O—N-based material is used, the resist mask is preferably removed using a method in which the oxide conductive layer is not removed at the time when the resist mask used for etching is removed. For example, by employing dry etching, the resist mask can be removed and the oxide conductive layer is not removed.

Next, the oxide insulating layer 416 which is in contact with exposed surfaces of the oxide semiconductor layers 431 and 432 is formed.

The oxide insulating layer 416, which has a thickness of at least 1 nm or more, can be formed as appropriate using a sputtering method or the like, that is a method with which impurities such as water or hydrogen are not mixed into the oxide insulating layer 416. In this embodiment, a silicon oxide film with a thickness of 300 nm is formed using a sputtering method to form the oxide insulating layer 416. The substrate temperature in the film formation may be higher than or equal to room temperature and lower than or equal to 300° C., and is set at 100° C. in this embodiment. The silicon oxide film can be formed using a sputtering method under a rare gas (typically argon) atmosphere, an oxygen atmosphere, or an atmosphere containing a rare gas (typically argon) and oxygen. Further, a silicon oxide target or a silicon target can be used for the target. For example, the silicon oxide film can be formed using a silicon target by a sputtering method under an atmosphere containing oxygen and nitrogen. The oxide insulating layer 416 which is in contact with the oxide semiconductor layers 431 and 432 whose resistance is reduced is formed using an inorganic insulating film which does not contain impurities such as moisture, hydrogen ions, and OH$^-$ and prevents entry of these from the outside. Specifically, a silicon oxide film, a silicon nitride oxide film, an aluminum oxide film, an aluminum oxynitride film, or the like is used. A silicon oxide film which is formed using a silicon target doped with boron is used for the oxide insulating layer 416, whereby entry of impurities (such as moisture, hydrogen ions, and OH$^-$) can be suppressed.

Next, second heat treatment (preferably at higher than or equal to 200° C. and lower than or equal to 400° C., for example, higher than or equal to 250° C. and lower than or equal to 350° C.) is performed under an inert gas atmosphere or an oxygen gas atmosphere. For example, the second heat treatment is performed at 250° C. for one hour under a nitrogen atmosphere. By the second heat treatment, part of the oxide semiconductor layers 431 and 432 is heated while being in contact with the oxide insulating layer 416.

Through the above steps, the resistance of the oxide semiconductor layers 431 and 432 is reduced, and the part of the oxide semiconductor layers 431 and 432 selectively becomes an oxygen-excess state. As a result, the channel formation region 413 overlapped with the gate electrode layer 411 becomes i-type, and the channel formation region 423 overlapped with the gate electrode layer 421 becomes i-type. The high-resistance source region 414a is formed in a self-aligning manner in a portion of the oxide semiconductor layer 431 overlapped with the source electrode layer 415a. The high-resistance drain region 414b is formed in a self-aligning manner in a portion of the oxide semiconductor layer 431 overlapped with the drain electrode layer 415b. The high-resistance source region 424a is formed in a self-aligning manner in a portion of the oxide semiconductor layer 432 overlapped with the source electrode layer 409a. The high-resistance drain region 424b is formed in a self-aligning manner in a portion of the oxide semiconductor layer 432 overlapped with the drain electrode layer 409b (see FIG. 2E).

The high-resistance drain region 414b (or the high-resistance source region 414a) is formed in the oxide semiconductor layer 431 overlapped with the low-resistance drain region 408b (and the low-resistance source region 408a), which leads to improvement in reliability of the driver circuit. Specifically, when the high-resistance drain region 414b is formed, a transistor can have a structure in which conductivity is gradually changed from the drain electrode layer 415b to the high-resistance drain region 414b and the channel formation region 413. Thus, in the case where the transistor is operated while the drain electrode layer is electrically connected to a wiring for supplying a high power source potential VDD, the high-resistance drain region 414b (or the high-resistance source region 414a) serves as a buffer so that a local high electric field is not applied even when a high electric field is applied between the gate electrode layer 411 and the drain electrode layer 415b, which can lead to improvement in withstand voltage of the transistor.

In addition, by forming the high-resistance drain region 414b (or the high-resistance source region 414a) in the oxide semiconductor layer 431 overlapped with the low-resistance drain region 408b (and the low-resistance source region 408a), leakage current of the transistor in the driver circuit can be reduced.

The high-resistance drain region 424b (or the high-resistance source region 424a) is formed in the oxide semiconductor layer 432 overlapped with the drain electrode layer 409b (and the source electrode layer 409a), which can lead to improvement in reliability of the pixel. Specifically, when the high-resistance drain region 424b is formed, a transistor can have a structure in which conductivity is gradually changed from the drain electrode layer 409b to the high-resistance drain region 424b and the channel formation region 423. Thus, in a transistor which operates while being electrically connected to a wiring which supplies the drain electrode layer 409b with a high power source potential VDD, the high-resistance drain region 424b serves as a buffer so that a local high electric field is not applied even when a high electric field is applied between the gate electrode layer 421 and the drain electrode layer 409b, which can lead to improvement in withstand voltage of the transistor.

In addition, by forming the high-resistance drain region 424b (or the high-resistance source region 424a) in the oxide semiconductor layer 432 overlapped with the drain electrode layer 409b (and the source electrode layer 409a), leakage current of the transistor in the pixel can be reduced.

Note that in the semiconductor device of this embodiment, a protective insulating layer can be provided over the oxide insulating layer 416. When a protective insulating layer is provided, the protective insulating layer is preferably formed by forming a silicon nitride film using an RF sputtering method in this embodiment. An RF sputtering method is preferable as a formation method of the protective insulating layer because of high productivity. The protective insulating layer is formed using an inorganic insulating film which does not contain impurities such as moisture, hydrogen ions, and $OH^-$ and prevents entry of these from the outside. A silicon nitride film, an aluminum nitride film, a silicon nitride oxide film, an aluminum oxynitride film, or the like is used. Needless to say, the protective insulating layer is a light-transmitting insulating film.

Next, a fifth photolithography process is performed. A resist mask is formed, and the oxide insulating layer 416 is etched to form a region 418 in which part of the low-resistance source region 408a is exposed, a region 419 in which part of the low-resistance drain region 408b is exposed, and a contact hole 426 which reaches the drain electrode layer 409b. The oxide insulating layer 416 is in contact with an upper surface of the oxide semiconductor layer 431 and peripheries and side surfaces of the low-resistance source region 408a and the low-resistance drain region 408b (see FIG. 3A). Note that the resist mask in this case may be formed by an inkjet method. When the resist mask is formed by an inkjet method, a photomask is not used, which leads to reduction in manufacturing cost.

Next, after the resist mask is removed, a conductive film is formed at least over the oxide insulating layer 416 and over the low-resistance source region 408a and the low-resistance drain region 408b which are exposed. A sixth photolithography process is performed to form resist masks 438a and 438b are formed over the conductive film. Accordingly, the conductive film is selectively etched to form the source and drain electrode layers 415a and 415b (see FIG. 3B).

As a material of the conductive film for forming the source and drain electrode layers 415a and 415b, an element selected from Al, Cr, Cu, Ta, Ti, Mo, and W, an alloy containing any of these elements as its component, an alloy containing a combination of any of these elements, and the like can be given.

As the conductive film, a three-layer film in which a titanium film, an aluminum film, and a titanium film are stacked in that order or a three-layer film in which a molybdenum film, an aluminum film, and a molybdenum film are stacked in that order is preferably used. Needless to say, a single-layer film, a two-layer film, or a four-or-more-layer film may be used for the metal conductive film. When a stacked conductive film of a titanium film, an aluminum film, and a titanium film is used, etching can be performed by a dry etching method using a chlorine gas.

A resist mask for forming a conductive layer may be formed by an inkjet method. When the resist mask is formed by an inkjet method, a photomask is not used, which can lead to reduction in manufacturing cost.

Next, the planarizing insulating layer 404 is formed over the oxide insulating layer 416. As the planarizing insulating layer 404, an organic material having heat resistance, such as polyimide, acrylic resin, benzocyclobutene resin, polyamide, or epoxy resin can be used. Other than such organic materials, a low-dielectric constant material (low-k material), a siloxane-based resin, phosphosilicate glass (PSG), borophosphosilicate glass (BPSG), or the like can be used for the planarizing insulating layer 404. Note that the planarizing insulating layer 404 may be formed by stacking a plurality of insulating films formed of these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. The organic group may contain a fluoro group.

There is no particular limitation on the method for forming the planarizing insulating layer 404, and the planarizing insulating layer 404 can be formed, depending on the material, by a method such as a sputtering method, an SOG method, spin coating, dip coating, spray coating, or a droplet discharge method (e.g., an inkjet method, screen printing, offset printing, or the like), or a tool (equipment) such as a doctor knife, a roll coater, a curtain coater, or a knife coater.

Then, a seventh photolithography process is performed, and a resist mask is formed. The planarizing insulating layer 404 is etched to form a contact hole 441 that reaches the drain electrode layer 409b (see FIG. 3C). Note that contact holes that reach the gate electrode layers 411 and 421 are also formed by this etching. The resist mask for forming the contact hole 441 that reaches the drain electrode layer 409b may be formed by an inkjet method. When the resist mask is formed by an inkjet method, a photomask is not used, which leads to reduction in manufacturing cost.

After the resist mask is removed, a light-transmitting conductive film is formed. For example, the light-transmitting conductive film is formed using indium oxide ($In_2O_3$) film, an indium oxide-tin oxide alloy ($In_2O_3$—$SnO_2$, abbreviated as ITO) film, or the like by a sputtering method, a vacuum evaporation method, or the like. An Al—Zn—O-based non-single-crystal film containing nitrogen, that is, an Al—Zn—O—N-based non-single-crystal film, a Zn—O—N-based non-single-crystal film, and a Sn—Zn—O—N-based non-single-crystal film, may be used as the light-transmitting conductive film. Note that the relative proportion (atomic %) of zinc in an Al—Zn—O—N-based non-single-crystal film is less than or equal to 47 atomic % and is larger than the relative proportion (atomic %) of aluminum in the non-single-crystal film. The relative proportion (atomic %) of aluminum in the Al—Zn—O—N-based non-single-crystal film is larger than the relative proportion (atomic %) of nitrogen in the Al—Zn—O—N-based non-single-crystal film. Etching treatment of a film having such a material is performed with a hydrochloric acid based solution. However, since etching of an ITO film particularly tends to leave residue, an indium oxide-zinc oxide alloy (In$_2$O$_3$—ZnO) may be used in order to improve etching processability.

Note that the unit of a relative proportion in the light-transmitting conductive film is atomic percent and the relative proportion in the light-transmitting conductive film is evaluated by analysis using an electron probe X-ray microanalyzer (EPMA).

Next, an eighth photolithography process is performed, and a resist mask is formed. Then, an unnecessary portion of the light-transmitting conductive film is removed by etching to form the pixel electrode layer 427 and the conductive layer 417, and the resist mask is removed (see FIG. 3D).

Through the above steps, the thin film transistors 410 and 420 can be separately formed in the driver circuit and the pixel portion, respectively, over one substrate with the use of eight masks, so that the manufacturing cost can be reduced as compared to the case where the pixel portion and the driver circuit are formed in different steps. The thin film transistor 410, which is a transistor for a driver circuit, includes the oxide semiconductor layer 412 having the high-resistance source region 414*a*, the high-resistance drain region 414*b*, and the channel formation region 413. The thin film transistor 420, which is a transistor for a pixel, includes the oxide semiconductor layer 422 having the high-resistance source region 424*a*, the high-resistance drain region 424*b*, and the channel formation region 423. Even when a high electric field is applied to the thin film transistors 410 and 420, the high-resistance source region 414*a*, the high-resistance drain region 414*b*, the high-resistance source region 424*a*, and the high-resistance drain region 424*b* serve as buffers so that a local high electric field is not applied, which can lead to improvement in withstand voltage of the transistors.

In the method for manufacturing a semiconductor device as illustrated in FIGS. 2A to 2E and FIGS. 3A to 3D, a storage capacitor can be formed, over the same substrate as the thin film transistors 410 and 420, with a capacitor wiring and a capacitor electrode (also referred to as a capacitor electrode layer) using the gate insulating layer 402 as a dielectric. By arranging the thin film transistors 420 and the storage capacitors in a matrix corresponding to respective pixels to form a pixel portion and arranging the driver circuit having the thin film transistor 410 at the periphery of the pixel portion, one of the substrates for manufacturing an active matrix display device can be obtained. In this specification, such a substrate is referred to as an active matrix substrate for convenience.

Note that the pixel electrode layer 427 is electrically connected to the capacitor electrode layer through the contact hole 441 formed in the planarizing insulating layer 404 and the contact hole 426 formed in the oxide insulating layer 416. By electrically connecting the lower electrode layer and the upper electrode layer to each other through a plurality of contact holes, a contact hole can be easily formed even when the insulating layer is made thick, whereby defective contact can be suppressed. Note that the capacitor electrode layer can be formed using the same material and in the same step as the source and drain electrode layers 409*a* and 409*b*.

In addition, by providing the conductive layer 417 in a portion overlapped with the channel formation region 413 of the oxide semiconductor layer, in a bias-temperature stress test (hereinafter, referred to as a BT test) for examining reliability of a thin film transistor, the amount of shift in threshold voltage of the thin film transistor 410 between before and after the BT test can be reduced. The conductive layer 417 may have a potential which is the same as or different from that of the gate electrode layer 411, and can function as a gate electrode layer. The conductive layer 417 may be in a GND state, a state in which a potential of 0 V is applied, or a floating state.

A resist mask for forming the conductive layer 417 and the pixel electrode layer 427 may be formed by an inkjet method. When the resist mask is formed by an inkjet method, a photomask is not used, which can lead to reduction in manufacturing cost.

(Embodiment 2)

Figure 3A:
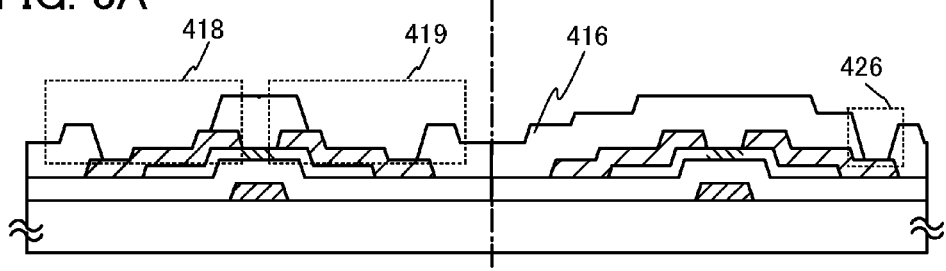
FIGS. 3A to 3D are views illustrating a method for manufacturing a semiconductor device.
Figure 3B:
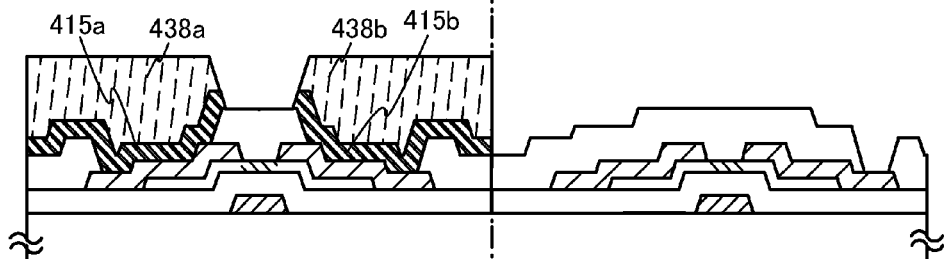
Figure 3C:
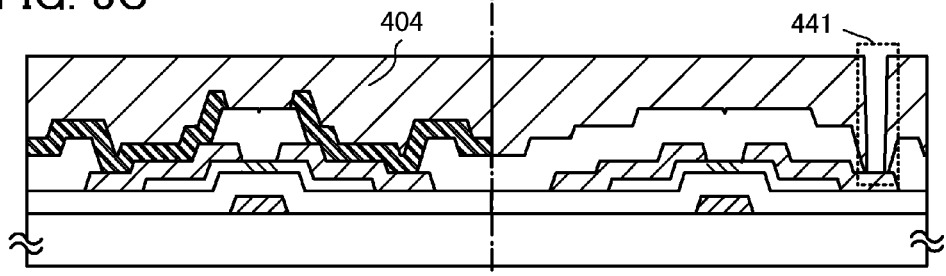
Figure 3D:
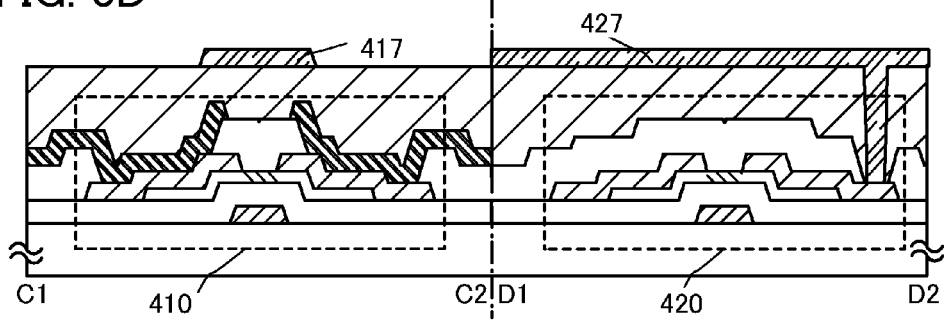
Figure 4A:
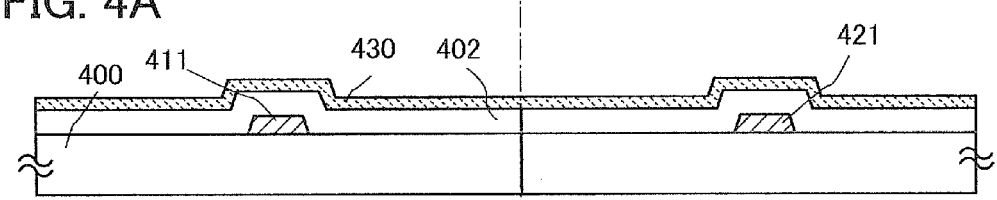
FIGS. 4A to 4C are views illustrating a method for manufacturing a semiconductor device.
Figure 4B:
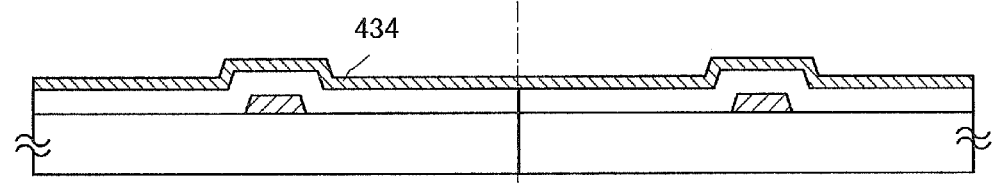
Figure 4C:
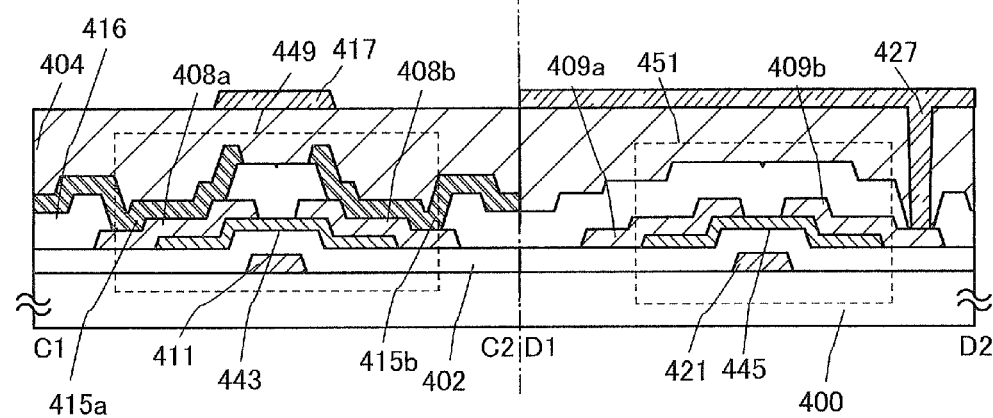

In this embodiment, FIGS. 4A to 4C illustrates an example in which a first heat treatment is different from that of Embodiment 1. This embodiment is almost the same as Embodiment 1 except that a process is partly different from that of FIGS. 2A to 2E and FIGS. 3A to 3D. Therefore, the same portions are denoted by the same reference numerals and detailed description is omitted.

FIGS. 4A to 4C are cross-sectional views illustrating a manufacturing process of two thin film transistors.

First, according to the manufacturing process described in Embodiment 1, the gate electrode layers 411 and 421 are formed over the substrate 400 having an insulating surface.

The gate insulating layer 402 is formed over the gate electrode layers 411 and 421.

Next, the oxide semiconductor film 430 is formed to a thickness of greater than or equal to 2 nm and less than or equal to 200 nm over the gate insulating layer 402 (see FIG. 4A). Note that the process up to here is the same as that of Embodiment 1, and FIG. 4A corresponds to FIG. 2A.

Next, the oxide semiconductor film 480 is subjected to dehydration or dehydrogenation under an inert gas atmosphere or under a reduced pressure. The temperature of first heat treatment for dehydration or dehydrogenation is higher than or equal to 350° C. and lower than the strain point of the substrate, preferably higher than or equal to 400° C. Here, the substrate is introduced into an electric furnace which is one of heat treatment apparatuses, heat treatment is performed on the oxide semiconductor film 480 under a nitrogen atmosphere, and then, entry of water or hydrogen into the oxide semiconductor film 480 is prevented with the oxide semiconductor film 480 not exposed to the air. Accordingly, the oxide semiconductor film 480 is changed into an oxygen-deficient semiconductor film. Thus, the resistance of the oxide semiconductor film 480 is reduced, that is, the oxide semiconductor film 480 becomes an n-type semiconductor film (e.g., an n⁻ semiconductor film). After that, a high-purity oxygen gas, a high-purity N$_2$O gas, or an ultra-dry air (with a dew point of −40° C. or lower, preferably −60° C. or lower) is introduced into the same furnace and cooling is performed. It is preferable that moisture, hydrogen, and the like be not contained in an oxygen gas or a N$_2$O gas. Alternatively, the purity of an oxygen gas or a N$_2$O gas which is introduced into the heat treatment apparatus is preferably 6N (99.9999%) or more, more preferably 7N (99.99999%) or more (i.e., the impurity concentration of the oxygen gas or the N$_2$O gas is preferably 1 ppm or lower, more preferably 0.1 ppm or lower).

Moreover, after the first heat treatment for dehydration or dehydrogenation, heat treatment may be performed at from 200° C. to 400° C., preferably from 200° C. to 300° C., under an oxygen gas atmosphere, an N$_2$O gas atmosphere, or an ultra-dry air (the dew point is −40° C. or lower, preferably −60° C. or lower).

Through the above process, the entire oxide semiconductor film 430 is placed into an oxygen-excess state so as to have a higher resistance, i.e., to become i-type, whereby an oxide semiconductor film 434 is formed (see FIG. 4B). As a result, reliability of the thin film transistor to be formed later can be improved.

Note that in this embodiment, an example in which dehydration or dehydrogenation is performed after formation of the oxide semiconductor film is shown; however, there is no limitation thereto. The first heat treatment can be performed after the oxide semiconductor film is processed into an island-shaped oxide semiconductor layer as in Embodiment 1.

The oxide semiconductor film may be dehydrated or dehydrogenated under an inert gas atmosphere and be cooled under an inert gas atmosphere, and then, a resist mask may be formed by a photolithography process. The oxide semiconductor film 434 may be selectively etched using the resist mask to form an oxide semiconductor layer which is an island-shaped oxide semiconductor layer. Then, heat treatment may be performed at higher than or equal to 200° C. and lower than or equal to 400° C., preferably higher than or equal to 200° C. and lower than or equal to 300° C. under an oxygen gas atmosphere, an $N_2O$ gas atmosphere, or an ultra-dry air (the dew point of lower than or equal to −40° C., preferably lower than or equal to −60° C.) atmosphere.

When heat treatment (at higher than or equal to 400° C. and lower than a strain point of the substrate) is performed under an inert gas atmosphere (nitrogen, helium, neon, argon, or the like), an oxygen atmosphere, or an ultra-dry air (the dew point of lower than or equal to −40° C., preferably lower than or equal to −60° C.) atmosphere before formation of the oxide semiconductor film 434, impurities such as hydrogen and water contained in the gate insulating layer may be removed.

Next, a resist mask is formed over the oxide semiconductor film 434 by the second photolithography process. The oxide semiconductor film 434 is selectively etched using the resist mask, so that oxide semiconductor layers 443 and 445 which are island-shaped oxide semiconductor layers are formed.

The resist mask is removed. As illustrated in FIGS. 2C to 2E and FIGS. 3A to 3C of Embodiment 1, the low-resistance source region 408a and the low-resistance drain region 408b which are in contact with the oxide semiconductor layer 443 are formed, and the oxide insulating layer 416, which is in contact with an upper surface of the oxide semiconductor layer 443 and peripheries and side surfaces of the low-resistance source region 408a and the low-resistance drain region 408b, is formed. On the other hand, in the pixel portion, the source and drain electrode layers 409a and 409b which are light-transmitting conductive layers are formed so as to be in contact with the oxide semiconductor layer 445, and the oxide insulating layer 416 which is in contact with the oxide semiconductor layer 445 is formed.

Next, the second heat treatment is performed under an inert gas atmosphere or an oxygen gas atmosphere. A condition of the second heat treatment can be the same as that of the method for manufacturing a semiconductor device described in Embodiment 1. For example, the second heat treatment is performed at 250° C. for one hour under a nitrogen atmosphere.

The low-resistance source region 408a and the low-resistance drain region 408b are partly exposed, whereby a contact hole that reaches the drain electrode layer 409b is formed in the oxide insulating layer 416. Moreover, a conductive film is formed over the oxide insulating layer 416. The conductive film is selectively etched to form the source electrode layer 415a which is in contact with the low-resistance source region 408a and the drain electrode layer 415b which is in contact with the low-resistance drain region 408b. Next, the planarizing insulating layer 404 is formed in contact with the oxide insulating layer 416, a contact hole that reaches the drain electrode layer 409b is formed in the planarizing insulating layer 404, and a light-transmitting conductive film is formed over the contact hole and the planarizing insulating layer 404. The light-transmitting conductive film is selectively etched to form the conductive layer 417 and the pixel electrode layer 427 which is electrically connected to the drain electrode layer 409b (see FIG. 4C).

Through the above steps, a thin film transistor 449 and a thin film transistor 451 in each of which the entire oxide semiconductor layer is i-type can be separately formed in the driver circuit and the pixel portion, respectively, over one substrate with the use of eight masks. The thin film transistor 449 for a driver circuit includes the oxide semiconductor layer 443 which is entirely intrinsic, and the thin film transistor 451 for a pixel includes the oxide semiconductor layer 445 which is entirely intrinsic.

A storage capacitor can be formed, over the same substrate as the thin film transistors 449 and 451, with a capacitor wiring and a capacitor electrode using the gate insulating layer 402 as a dielectric. By arranging the thin film transistors 451 and the storage capacitors in a matrix corresponding to respective pixels to form a pixel portion and arranging a driver circuit having the thin film transistor 449 at the periphery of the pixel portion, one of the substrates for manufacturing an active matrix display device can be obtained.

In addition, by providing the conductive layer 417 in a portion overlapped with the channel formation region of the oxide semiconductor layer 443, in a BT test, the amount of shift in threshold voltage of the thin film transistor 449 between before and after the BT test can be reduced. The conductive layer 417 may have a potential which is the same as or different from that of the gate electrode layer 411, and can function as a gate electrode layer. The conductive layer 417 may be in a GND state, a state in which a potential of 0 V is applied, or a floating state.

(Embodiment 3)

A method for manufacturing a semiconductor device which is different from that in Embodiment 1 will be described with reference to FIGS. 5A to 5C. The same portions as Embodiment 1 or portions having functions similar to those of Embodiment 1 can be formed in a manner similar to that of Embodiment 1, and repetitive description thereof is omitted.

Figure 5A:
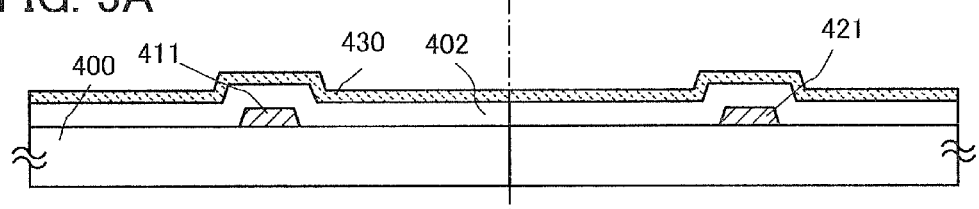
FIGS. 5A to 5C are views illustrating a method for manufacturing a semiconductor device.
Figure 5B:
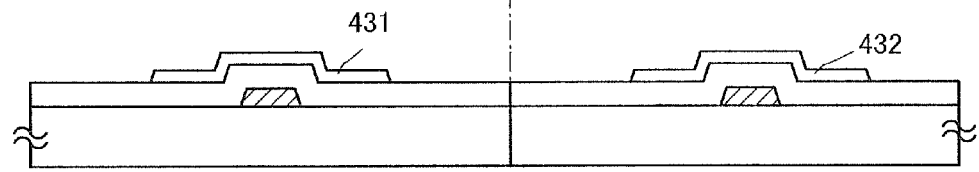
Figure 5C:
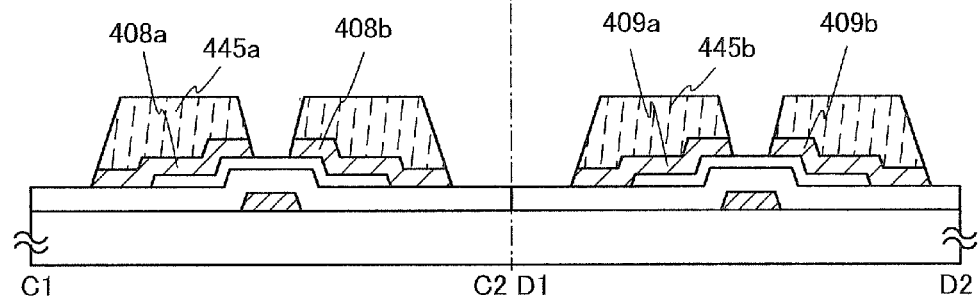

FIGS. 5A to 5C are cross-sectional views illustrating a manufacturing process of two thin film transistors.

First, in a similar manner to FIG. 2A of Embodiment 1, the gate electrode layers 411 and 421 are formed over the substrate 400 having an insulating surface, the gate insulating layer 402 is formed over the gate electrode layers 411 and 421, and the oxide semiconductor film 430 is formed over the gate insulating layer 402 (see FIG. 5A).

Next, a resist mask is formed over the oxide semiconductor film 430 by the second photolithography process. The oxide semiconductor film 430 is selectively etched using the resist mask, so that an oxide semiconductor layer which is an island-shaped oxide semiconductor layer is formed.

Figure 2B:
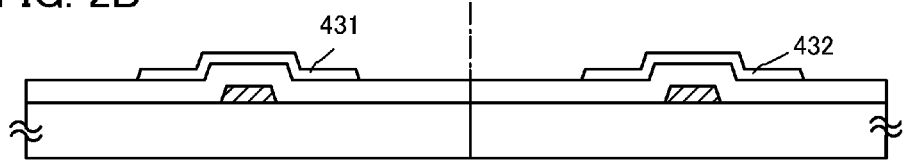
Figure 2C:
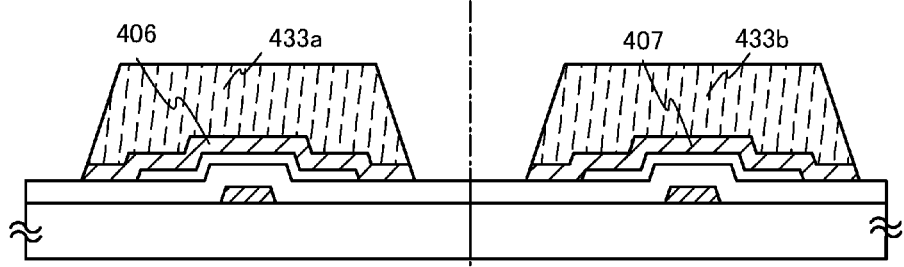
Figure 2D:
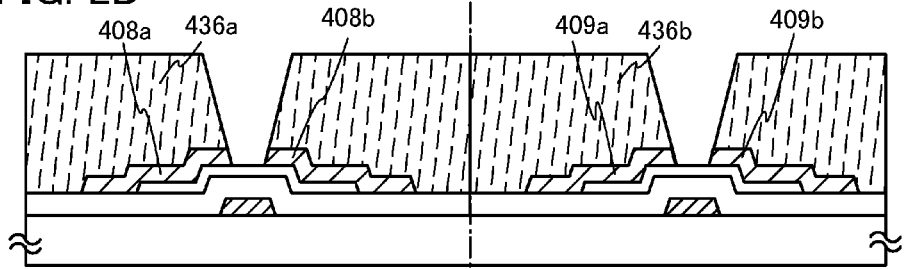

Then, the resist mask is removed, and the first heat treatment is performed in a similar manner to FIG. 2B of Embodiment 1, whereby the oxide semiconductor layer is dehydrated or dehydrogenated. A condition of the first heat treatment for dehydration or dehydrogenation can be the same as that of the method for manufacturing a semiconductor device described in Embodiment 1. Here, the substrate over which the oxide semiconductor layer is formed is introduced into an electric furnace, which is one of heat treatment apparatuses. After heat treatment is performed on the oxide semiconductor layers under a nitrogen atmosphere, the oxide semiconductor layer is not exposed to the air and water and hydrogen are prevented from being mixed into the oxide semiconductor layer again; thus, the oxide semiconductor layers 431 and 432 are obtained (see FIG. 5B).

Next, an oxide conductive film is formed over the oxide semiconductor layers 431 and 432 and the gate insulating layer 402. Accordingly, resist masks 445a and 445b are formed by the third photolithography process. The oxide conductive film is selectively etched using the resist masks 445a and 445b to form the low-resistance source region 408a, the low-resistance drain region 408b, and the source and drain electrode layers 409a and 409b (see FIG. 5C). As a material of the oxide conductive film, a material similar to that of the oxide conductive film in Embodiment 1 can be used.

Note that in this etching step, the etching condition is preferably determined as appropriate so as not to etch the oxide semiconductor layer 431 and the oxide semiconductor layer 432 which are lower layers. For example, the etching time may be controlled.

Further, each for a material of the oxide semiconductor layers 431 and 432 and a material of the low-resistance source region 408a, the low-resistance drain region 408b, and the source and drain electrode layers 409a and 409b, a material having a high etching selection ratio is preferably used. For example, a metal oxide material containing Sn (e.g., $SnZnO_x$ (x>0), $SnGaZnO_x$ (x>0), or the like) may be used for a material of the oxide semiconductor layers, an Al—Zn—O-based material, an Al—Zn—O—N-based material, a Zn—O-based material, or the like may be used for a material of the oxide conductive layers. Such a material containing zinc oxide as its main component can be etched using an alkaline solution, for example. When a material containing aluminum such as an Al—Zn—O-based material, an Al—Zn—O—N-based material is used, the resist mask is preferably removed using a method in which the oxide conductive layers are not removed at the time when the resist mask used for etching is removed. For example, by employing dry etching, the resist mask can be removed while the oxide conductive layer is not removed.

The oxide semiconductor layers preferably have a thickness of less than or equal to 50 nm in order to be kept in an amorphous state. For example, the average thickness of the completed thin film transistor is preferably greater than or equal to 5 nm and less than or equal to 20 nm.

Figure 2E:
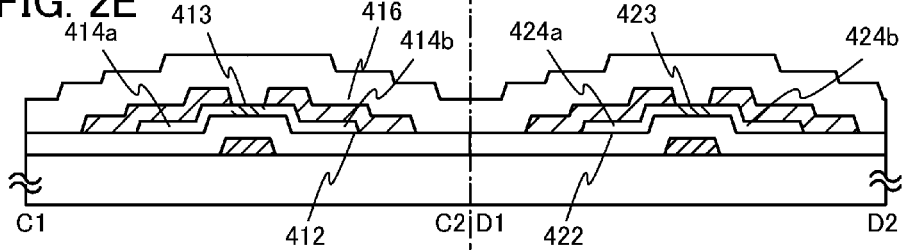

In a manner similar to FIG. 2E of Embodiment 1, the oxide insulating layer 416 is formed in contact with the oxide semiconductor layers 431 and 432; the second heat treatment is performed so that the channel formation region 413 overlapped with the gate electrode layer 411 and the channel formation region 423 overlapped with the gate electrode layer 421 become i-type; the high-resistance source region 414a overlapped with the low-resistance source region 408a is formed in a self-aligning manner; the high-resistance drain region 414b overlapped with the low-resistance drain region 408b is formed in a self-aligning manner; the high-resistance source region 424a overlapped with the source electrode layer 409a is formed in a self-aligning manner; and the high-resistance drain region 424b overlapped with the drain electrode layer 409b is formed in a self-aligning manner. A condition of the second heat treatment can be the same as that of the method for manufacturing a semiconductor device described in Embodiment 1.

In a similar manner to FIG. 3A of Embodiment 1, the fourth photolithography process is performed, and a resist mask is formed. Accordingly, the region 418 in which part of the low-resistance source region 408a is exposed, the region 419 in which part of the low-resistance drain region 408b is exposed, and the contact hole 426 which is located over the drain electrode layer 409b are formed by etching the oxide insulating layer 416. The oxide insulating layer 416 is set to be in contact with part of the oxide semiconductor layer 431 and peripheries and side surfaces of the low-resistance source region 408a and the low-resistance drain region 408b.

In a manner similar to FIG. 3B of Embodiment 1, after the resist mask is removed, a conductive film is formed at least over the low-resistance source region 408a and the low-resistance drain region 408b which are exposed, over the contact hole 426, and over the oxide insulating layer 416. The resist masks 438a and 438b are formed over the conductive film by the fifth photolithography process. Etching is selectively performed to form the source and drain electrode layers 415a and 415b.

In a manner similar to FIG. 3C of Embodiment 1, after the resist masks 438a and 438b are removed, the planarizing insulating layer 404 is formed over the source and drain electrode layers 415a and 415b and over the oxide insulating layer 416. The sixth photolithography process is performed, and a resist mask is formed. The planarizing insulating layer 404 is etched to form the contact hole 441 that reaches the drain electrode layer 409b.

in a similar manner to FIG. 3D of Embodiment 1, after the contact hole is formed, a light-transmitting conductive film is formed. The seventh photolithography process is performed, and a resist mask is formed. Accordingly, an unnecessary portion is removed by etching, so that the pixel electrode layer 427 and the conductive layer 417 are formed.

Through the above steps, the thin film transistors 410 and 420 can be separately formed in the driver circuit and the pixel portion, respectively, over one substrate with the use of seven masks. In addition, the number of masks can be reduced in comparison with the manufacturing process of Embodiment 1. The thin film transistor 410 in the driver circuit includes the oxide semiconductor layer 412 having the high-resistance source region 414a, the high-resistance drain region 414b, and the channel formation region 413. The thin film transistor 420 in the pixel portion includes the oxide semiconductor layer 422 having the high-resistance source region 424a, the high-resistance drain region 424b, and the channel formation region 423. Even when a high electric field is applied to the thin film transistors 410 and 420, the high-resistance source region 414a, the high-resistance drain region 414b, the high-resistance source region 424a, and the high-resistance drain region 424b serve as buffers so that a local high electric field is not applied, which can lead to improvement in withstand voltage of the transistors.

(Embodiment 4)

A semiconductor device and a method for manufacturing the semiconductor device which are different from those in Embodiment 1 will be described with reference to FIGS. 38A1, 38A2, 38C, and 38C, FIGS. 39A to 39E, and FIGS. 40A to 40D. FIGS. 38B and 38C are each an example of a cross-sectional structure of two thin film transistors having structures different from each other which are formed over one substrate. A thin film transistor 460 and a thin film transistor 470 illustrated in FIGS. 38A1, 38A2, 38B, and 38C are bottom gate transistors.

FIG. 38A1 is a plan view of the thin film transistor 460 provided in a driver circuit. FIG. 38A2 is a plan view of the thin film transistor 470 provided in a pixel.

FIG. 38B is a cross-sectional view illustrating a cross-sectional structure taken along line G1-G2 of FIG. 38A1 and a cross-sectional structure taken along line H1-H2 of FIG. 38A2. FIG. 38C is a cross-sectional view illustrating a cross-sectional structure taken along line G3-G4 of FIG. 38A1 and a cross-sectional structure taken along line H3-H4 of FIG. 38A2.

The thin film transistor 460 provided in the driver circuit includes a gate electrode layer 461, a gate insulating layer 452, an oxide semiconductor layer 462 which includes at least a channel formation region 463, a high-resistance source region 464a, and a high-resistance drain region 464b, a low-resistance source region 446a, a low-resistance drain region 446b, a source electrode layer 465a, and a drain electrode layer 465b over a substrate 450 having an insulating surface. In addition, the thin film transistor 460 is provided with an oxide insulating layer 466 which is in contact with peripheries and side surfaces of the low-resistance source region 446a and the low-resistance drain region 446b and which is in contact with part of the oxide semiconductor layer 462.

Note that the high-resistance source region 464a is formed in contact with a lower surface of the low-resistance source region 446a in a self-aligning manner. The high-resistance drain region 464b is formed in contact with a lower surface of the low-resistance drain region 446b in a self-aligning manner. In addition, the channel formation region 463 is in contact with the oxide insulating layer 466 and serves as a high-resistance region (i-type region) in comparison with the high-resistance source region 464a and the high-resistance drain region 464b.

The source electrode layer 465a is in contact with the low-resistance source region 446a, whereas the drain electrode layer 465b is in contact with the low-resistance drain region 446b.

When the low-resistance source region 446a and the low-resistance drain region 446b are provided, the thin film transistor 460 has higher operation stability than Schottky junction in terms of heat. The low-resistance source region and the low-resistance drain region each having higher carrier concentration than the oxide semiconductor layer are provided intentionally in this manner, so that an ohmic contact is formed.

It is preferable that a metal material be used as the source and drain electrode layers 465a and 465b in order to reduce resistance of a wiring of the thin film transistor 460.

Above the channel formation region 463, a conductive layer 467 which overlaps with the channel formation region 463 is provided. The conductive layer 467 is electrically connected to the gate electrode layer 461 so as to have the same potential, so that gate voltage can be applied from above and below the oxide semiconductor layer 462 provided between the gate electrode layer 461 and the conductive layer 467. When the potential of the gate electrode layer 461 is different from that of the conductive layer 467, for example, either the potential of the gate electrode layer 461 or the potential of the conductive layer 467 is any one of a predetermined potential, a GND potential, or 0 V, electric characteristics of the TFT such as threshold voltage can be controlled. That is, one of the gate electrode layer 461 and the conductive layer 467 functions as a first gate electrode layer, and the other of the gate electrode layer 461 and the conductive layer 467 functions as a second gate electrode layer, whereby the thin film transistor 460 can be used as a thin film transistor having four terminals.

A planarizing insulating layer 454 is provided between the conductive layer 467, the source and drain electrode layers 465a and 465b, and the oxide insulating layer 466.

The thin film transistor 470 provided in the pixel includes a gate electrode layer 471, the gate insulating layer 452, an oxide semiconductor layer 472 which includes at least a channel formation region 473, a high-resistance source region 474a, and a high-resistance drain region 474b, a source electrode layer 447a, and a drain electrode layer 447b over the substrate 450 having an insulating surface.

Note that the high-resistance source region 474a is formed in contact with a lower surface of the source electrode layer 447a in a self-aligning manner. The high-resistance drain region 474b is formed in contact with a lower surface of the drain electrode layer 447b in a self-aligning manner. In addition, the channel formation region 473 is in contact with the oxide insulating layer 466 and serves as a high-resistance region (i-type region) in comparison with the high-resistance source region 474a and the high-resistance drain region 474b.

Note that the oxide semiconductor layer 462 is formed below and partly overlaps with the source and drain electrode layers 465a and 465b. In addition, the oxide semiconductor layer 462 overlaps with the gate electrode layer 461 with the gate insulating layer 452 interposed therebetween. That is, the oxide semiconductor layer 462 is provided over the gate electrode layer 461 with the gate insulating layer 452 interposed therebetween. In addition, the oxide semiconductor layer 472 is formed below and partly overlaps with the source and drain electrode layers 447a and 447b. The oxide semiconductor layer 472 overlaps with the gate electrode layer 471 with the gate insulating layer 452 interposed therebetween. That is, the oxide semiconductor layer 472 is provided over the gate electrode layer 471 with the gate insulating layer 452 interposed therebetween.

In order to realize a display device having a high aperture ratio, each of the source and drain electrode layers 447a and 447b of the thin film transistor 470 is formed using a light-transmitting conductive film.

The gate electrode layer 471 of the thin film transistor 470 is also formed using a light-transmitting conductive film.

In the pixel in which the thin film transistor 470 is arranged, a pixel electrode layer 477, another electrode layer (a capacitor electrode layer or the like), and a wiring layer (capacitor wiring layer or the like) are formed using a conductive film having a light-transmitting property to visible light, whereby a display device having a high aperture ratio is formed. Needless to say, the gate insulating layer 452 and the oxide insulating layer 466 are preferably formed using a film having a light-transmitting property to visible light.

The pixel electrode layer 477 is in contact with the drain electrode layer 447b through an opening provided in the oxide insulating layer 466 and an opening provided in the planarizing insulating layer 454. Note that the opening provided in the oxide insulating layer 466 is not necessarily provided.

Note that the oxide semiconductor layers 462 and 472 are subjected to heat treatment (heat treatment for dehydration or dehydrogenation) which reduces impurities such as moisture at least after the oxide semiconductor film is formed. After heat treatment for dehydration or dehydrogenation and slow cooling, the carrier concentration of the oxide semiconductor layers is reduced by formation of an oxide insulating film to be in contact with the oxide semiconductor layer or the like, which leads to improvement in electric characteristics and reliability of the thin film transistors 460 and 470.

Note that in the semiconductor device illustrated in FIGS. 38A1, 38A2, 38B, and 38C, the channel length of the thin film transistor 460 is the same as that of the thin film transistor 470 as an example; however, this embodiment is not limited thereto. For example, since a thin film transistor in the driver circuit requires higher speed operation than a thin film transistor in the pixel portion, the channel length of the thin film transistor 460 may be smaller than that of the thin film transistor 470. In this case, for example, it is preferable that the channel length of the thin film transistor 460 be approximately 1 μm to 5 μm and the channel length of the thin film transistor 470 be approximately 5 μm to 20 μm.

As described above, the semiconductor device illustrated in FIGS. 38A1, 38A2, 38B, and 38C includes a driver circuit having a first thin film transistor and a pixel portion having a second thin film transistor over one substrate. The second thin film transistor is formed using a light-transmitting material, and the first thin film transistor is formed using a lower resistance material than the light-transmitting material. Accordingly, an aperture ratio in the pixel portion and operation speed of the driver circuit can be improved. When the driver circuit and the pixel portion are provided over one substrate, the number of wirings which connect the driver circuit and the pixel portion to each other can be reduced and the length of the wiring can be shortened; therefore, the size and cost of a semiconductor device can be reduced.

As for the thin film transistor in the driver circuit of the semiconductor device illustrated in FIGS. 38A1, 38A2, 38B, and 38C, the low-resistance source region and the low-resistance drain region are provided between the source and drain electrode layers and the oxide semiconductor layer in which the channel formation region is formed. When the low-resistance source region and the low-resistance drain region are provided, frequency characteristics of a peripheral circuit (driver circuit) can be improved. Compared with contact between a metal electrode layer and the oxide semiconductor layer, contact between the metal electrode layer and the low-resistance source region and the low-resistance drain region can reduce contact resistance. An electrode layer using molybdenum (such as a stacked layer of a molybdenum layer, an aluminum layer, and a molybdenum layer) has high contact resistance to the oxide semiconductor layer because molybdenum is difficult to oxidize in comparison with titanium and operation of extracting oxygen from the oxide semiconductor layer is weak and a contact interface between a molybdenum layer and the oxide semiconductor layer does not become n-type. However, when the low-resistance source region and the low-resistance drain region are interposed between the oxide semiconductor layer and the source and drain electrode layers, contact resistance can be reduced and frequency characteristics of the peripheral circuit (driver circuit) can be improved. In addition, when the low-resistance source region and the low-resistance drain region are provided, the channel length of the thin film transistor is determined at the time when a layer to serve as the low-resistance source region and the low-resistance drain region is etched; therefore, the channel length can be shortened further.

In the semiconductor device illustrated in FIGS. 38A1, 38A2, 38B, and 38C, an end portion of the oxide semiconductor layer of the first thin film transistor extends beyond the end portions of the low-resistance source region and the low-resistance drain region, and an end portion of the oxide semiconductor layer of the second thin film transistor also extends beyond the end portions of the source and drain electrode layers.

The semiconductor device illustrated in FIGS. 38A1, 38A2, 38B, and 38C has a structure in which an oxide insulating layer is in contact with part of the oxide semiconductor layer and a periphery and side surfaces of an oxide conductive layer which is in contact with the source and drain electrode layers. With the structure, when a portion in which a wiring formed of the same layer as the gate electrode layer and a wiring formed of the same layer as the source and drain electrodes are intersected with each other with an insulating layer interposed therebetween at the periphery of the thin film transistor, an interval between the wiring formed of the same layer as the gate electrode layer and the wiring formed of the same layer as the source and drain electrodes can be increased; thus, parasitic capacitance can be reduced.

Figure 42:
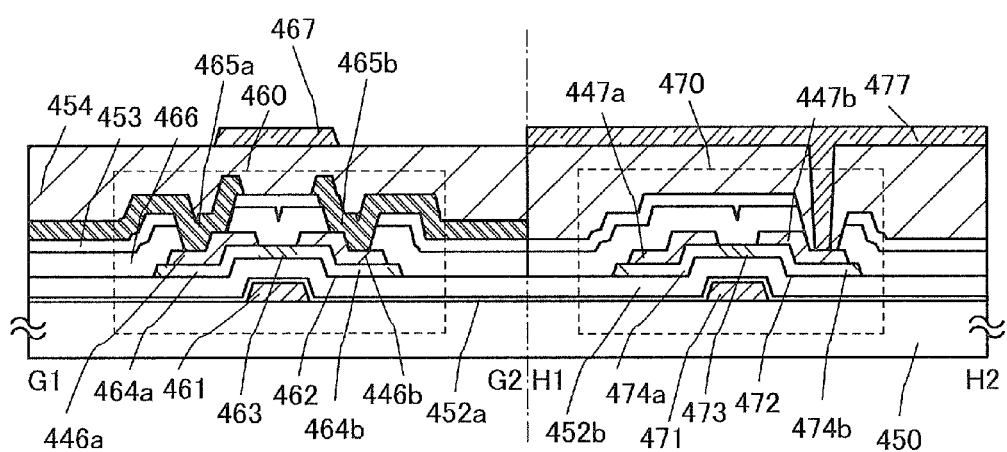
FIG. 42 is a view illustrating a semiconductor device.

A transistor of this embodiment can have a structure illustrated in FIG. 42. A semiconductor device illustrated in FIG. 42 is different from the semiconductor device illustrated in FIG. 38B in that a gate insulating layer is formed using a stacked layer of a plurality of insulating layers and a protective insulating layer is provided over an oxide insulating layer which is in contact with a semiconductor layer. That is, the semiconductor device illustrated in FIG. 42 has a stacked layer of a gate insulating layer 452a and a gate insulating layer 452b instead of the gate insulating layer 452 illustrated in FIG. 38B, and a protective insulating layer 453 which is formed over the oxide insulating layer 466 illustrated in FIG. 38B. Description of the other components of the semiconductor device illustrated in FIG. 42 which is the same as the description of corresponding components of the semiconductor device illustrated in FIGS. 38A1, 38A2, 38B, and 38C is applied thereto as appropriate and is omitted here.

For example, the material which can be applied to the gate insulating layer 452 illustrated in FIGS. 38B and 38C can be used for the gate insulating layer 452a and the gate insulating layer 452b. For example, a nitride insulating layer can be used for the gate insulating layer 452a, and an oxide insulating layer can be used for the gate insulating layer 452b.

It is preferable that the protective insulating layer 453 be in contact with the gate insulating layer 452a or an insulating film serving as a base each of which is provided below the oxide insulating layer 466, so that impurities such as moisture, hydrogen ions, and OH⁻ from close to side surfaces of a substrate are prevented from entering. In particular, it is effective to use a silicon nitride film for the gate insulating layer 452a or the insulating film serving as a base each of which is in contact with the oxide insulating layer 466. That is, when the silicon nitride layer is provided to surround a lower surface, an upper surface, and side surfaces of the oxide semiconductor layer, reliability of the semiconductor device is improved.

A manufacturing process of the thin film transistors 460 and 470 over one substrate will be described below with reference to FIGS. 39A to 39E and FIGS. 40A to 40D.

First, a light-transmitting conductive film is formed over the substrate 450 having an insulating surface, and then a resist mask is formed over the conductive film by a first photolithography process, and etching is selectively performed with the use of the resist mask, whereby the gate electrode layers 461 and 471 are formed. In addition, a capacitor wiring is formed using the same material by the same first photolithography process as the gate electrode layers 461 and 471 in the pixel portion. In the case where capacitance is needed not only for the pixel portion but also for the driver circuit, a capacitor wiring is also formed for the driver circuit. Note that the resist mask may be formed by an inkjet method. When the resist mask is formed by an inkjet method, a photomask is not used; therefore, manufacturing cost can be reduced.

Although there is no particular limitation on a substrate which can be used for the substrate 450 having an insulating surface, it is necessary that the substrate have at least enough heat resistance to heat treatment to be performed later. A glass substrate or the like can be used as the substrate 450 having an insulating surface, for example.

As the glass substrate, a substrate having a strain point of 730° C. or higher may be used when the temperature of later heat treatment is high. As a material of the glass substrate, a glass material such as aluminosilicate glass, aluminoborosilicate glass, or barium borosilicate glass is used, for example. Note that by containing a larger amount of barium oxide (BaO) than boric acid, a glass substrate is heat-resistant and of more practical use. Therefore, a glass substrate containing BaO and $B_2O_3$ so that the amount of BaO is larger than that of $B_2O_3$ is preferably used.

Note that a substrate formed of an insulator such as a ceramic substrate, a quartz substrate, or a sapphire substrate may be used as the substrate 450 instead of the glass substrate. Alternatively, crystallized glass or the like may be used as the substrate 450.

An insulating film serving as a base film may be provided between the substrate 450 and the gate electrode layers 461 and 471. The base film has a function of preventing diffusion of an impurity element from the substrate 450, and can be formed to have a single film or stacked film using one or more of a silicon nitride film, a silicon oxide film, a silicon nitride oxide film, and a silicon oxynitride film.

As a material of the gate electrode layers 461 and 471, the following conductive materials having light-transmitting properties to visible light can be used as examples: an In—Sn—Zn—O-based conductive metal oxide, an In—Al—Zn—O-based conductive metal oxide, a Sn—Ga—Zn—O-based conductive metal oxide, an Al—Ga—Zn—O-based conductive metal oxide, a Sn—Al—Zn—O-based conductive metal oxide, an In—Zn—O-based conductive metal oxide, a Sn—Zn—O-based conductive metal oxide, an Al—Zn—O-based conductive metal oxide, an In—Sn—O-based conductive metal oxide, an In—O-based conductive metal oxide, a Sn—O-based conductive metal oxide, or a Zn—O-based conductive metal oxide. The thickness of each of the gate electrode layers 461 and 471 lies within the range of greater than or equal to 50 nm and less than or equal to 300 nm. For a film formation method of the conductive film which is used for the gate electrode layers 461 and 471, a sputtering method, a vacuum evaporation method (such as an electron beam evaporation method), an arc discharge ion plating method, or a spray method is employed. When a sputtering method is employed, film deposition is performed with the use of a target in which $SiO_2$ is included at greater than or equal to 2 wt % and less than or equal to 10 wt %, and a light-transmitting conductive film to be formed may include $SiO_x$ (x>0) which suppresses crystallization. Thus, crystallization can be suppressed at the time of heat treatment for dehydration or dehydrogenation to be performed in a later process.

Next, the resist mask is removed, and the gate insulating layer 452 is formed over the gate electrode layer 461.

The gate insulating layer 452 can be formed by a plasma CVD method, a sputtering method, or the like to have a single layer of a silicon oxide layer, a silicon nitride layer, a silicon oxynitride layer, or a silicon nitride oxide layer or a stacked layer thereof. For example, in the case of forming a silicon oxynitride layer, a silicon oxynitride layer may be formed by a plasma CVD method using $SiH_4$, oxygen, and nitrogen as a deposition gas.

The thickness of the gate insulating layer 452 is greater than or equal to 100 nm and less than or equal to 500 nm In the case of using a stacked layer, for example, a second gate insulating layer having a thickness of greater than or equal to 5 nm and less than or equal to 300 nm is stacked over a first gate insulating layer having a thickness of greater than or equal to 50 nm and less than or equal to 200 nm.

In this embodiment, the gate insulating layer 452 is formed using a silicon nitride layer to a thickness of less than or equal to 200 nm by a plasma CVD method.

Figure 39A:
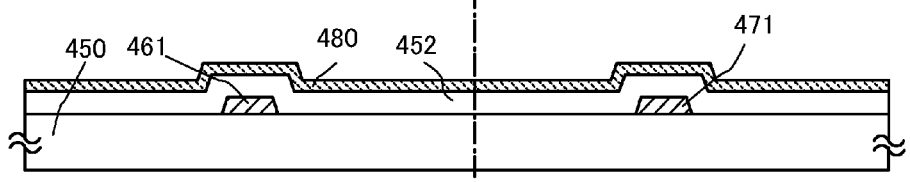
FIGS. 39A to 39E are views illustrating a method for manufacturing a semiconductor device.
Figure 39B:
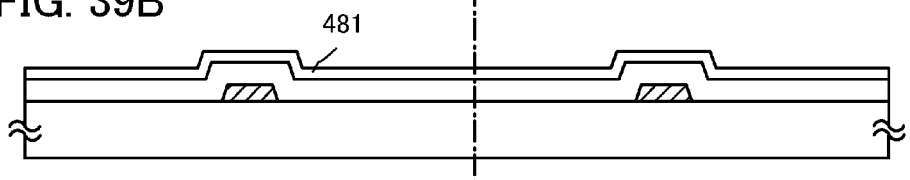
Figure 39C:
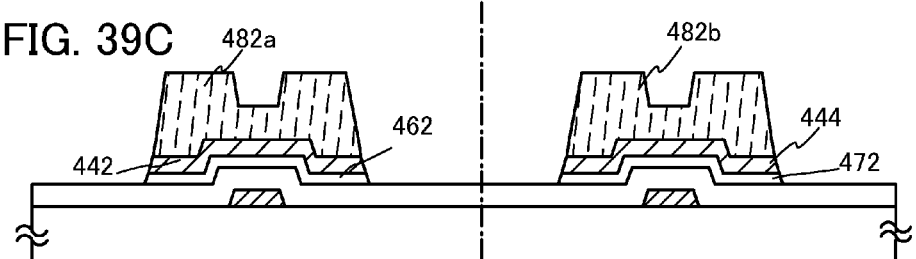

Next, over the gate insulating layer 452, an oxide semiconductor film 480 is formed to a thickness of greater than or equal to 2 nm and less than or equal to 200 nm (see FIG. 39A). Even when heat treatment for dehydration or dehydrogenation is performed after the oxide semiconductor film 480 is formed, it is preferable that the thickness thereof be less than or equal to 50 nm in order to keep the oxide semiconductor layer to be formed later an amorphous state. When the oxide semiconductor film 480 has a small thickness, crystallization of the oxide semiconductor layer to be formed later can be suppressed in the case where heat treatment is performed after the oxide semiconductor film 480 is formed.

Note that before the oxide semiconductor film 480 is formed by a sputtering method, dust attached to a surface of the gate insulating layer 452 is preferably removed by reverse sputtering in which an argon gas is introduced and plasma is generated. The reverse sputtering refers to a method in which, without application of voltage to a target side, an RF power source is used for application of voltage to the substrate side under an argon atmosphere so that plasma is generated around the substrate to modify a surface. Note that a nitrogen atmosphere, a helium atmosphere, an oxygen atmosphere, or the like may be used instead of an argon atmosphere.

The oxide semiconductor film 480 is formed using an In—Ga—Zn—O-based non-single-crystal film; or an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—Sn—O-based oxide semiconductor film, an In—O-based oxide semiconductor film, a Sn—O-based oxide semiconductor film, or a Zn—O-based oxide semiconductor film. In this embodiment, the oxide semiconductor film 480 is formed using an In—Ga—Zn—O-based oxide semiconductor target by a sputtering method. Alternatively, the oxide semiconductor film 480 can be formed by a sputtering method under a rare gas (typically argon) atmosphere, an oxygen atmosphere, or an atmosphere containing a rare gas (typically argon) and oxygen. When a sputtering method is employed, the oxide semiconductor film 480 is formed with the use of a target in which $SiO_2$ is included at greater than or equal to 2 wt % and less than or equal to 10 wt %, and the oxide semiconductor film 480 may include $SiO_x$ (x>0) which suppresses crystallization. Thus, crystallization of an oxide semiconductor layer to be formed later can be suppressed at the time of heat treatment for dehydration or dehydrogenation to be performed in a later process.

The oxide semiconductor film 480 is dehydrated or dehydrogenated. First heat treatment for dehydration or dehydrogenation is performed at higher than or equal to 400° C. and lower than a strain point of the substrate, for example, higher than or equal to 400° C. and lower than or equal to 700° C., preferably higher than or equal to 425° C. and lower than or equal to 700° C. Note that when the temperature is higher than or equal to 425° C. and lower than or equal to 700° C., heat treatment may be performed for one hour or less; however, when the temperature is lower than 425° C., heat treatment is performed for longer than one hour. Here, the substrate 450 over which the oxide semiconductor film is formed is introduced into an electric furnace, which is one of heat treatment apparatuses. After heat treatment is performed on the oxide semiconductor film under a nitrogen atmosphere, the oxide semiconductor film is not exposed to the air and water or hydrogen are prevented from being mixed into the oxide semiconductor layer again; thus, an oxide semiconductor layer whose resistance is reduced is obtained (see FIG. 39B). In this embodiment, the same furnace is used from a heat temperature T at which dehydration or dehydrogenation of the oxide semiconductor film 480 is performed to a temperature low enough to prevent water or hydrogen from entering again; specifically, slow cooling is performed under a nitrogen atmosphere until the temperature becomes lower than heating temperature T by 100° C. or more. There is no limitation on a nitrogen atmosphere, and dehydration or dehydrogenation may be performed under a rare gas atmosphere such as helium, neon, or argon.

Note that it is preferable that in the first heat treatment, water, hydrogen, and the like be not contained in nitrogen or a rare gas such as helium, neon, or argon. Alternatively, it is preferable that nitrogen or a rare gas such as helium, neon, or argon introduced into an apparatus for heat treatment have purity of 6N (99.9999%) or more, preferably, 7N (99.99999%) or more; that is, an impurity concentration is set to 1 ppm or lower, preferably, 0.1 ppm or lower.

Depending on a condition of the first heat treatment or a material of the oxide semiconductor film 480, crystallization is performed so that a microcrystalline film or a polycrystalline film is formed in some cases.

Before the oxide semiconductor film 480 is formed, heat treatment (higher than or equal to 400° C. and lower than a strain point of the substrate) may be performed under an inert atmosphere (nitrogen, helium, neon, argon, or the like) or an oxygen atmosphere, so that impurities such as hydrogen and water contained in the gate insulating layer 452 may be removed.

Next, an oxide conductive film is formed over the oxide semiconductor film 480, and a resist mask 482a and a resist mask 482b are formed by a second photolithography process. Then, the oxide conductive film and the oxide semiconductor film 480 are selectively etched at the same time with the use of the resist masks 482a and 482b. The oxide semiconductor layers 462 and 472 which are island-shaped oxide semiconductor layers, and an oxide conductive layer 442 and an oxide conductive layer 444 are formed (see FIG. 38C). Note that the resist masks 482a and 482b may be formed by an inkjet method. When the resist masks are formed by an inkjet method, a photomask is not used; therefore, manufacturing cost can be reduced.

For a formation method of the oxide conductive film, a sputtering method, a vacuum evaporation method (electron beam evaporation method or the like), an arc discharge ion plating method, or a spray method is employed. For a material of the oxide conductive film, a material which has higher resistance than the oxide semiconductor film 480 and lower resistance than the source and drain electrode layers 465a and 465b can be used. For example, an In—Sn—Zn—O-based conductive metal oxide, an In—Al—Zn—O-based conductive metal oxide, a Sn—Ga—Zn—O-based conductive metal oxide, an Al—Ga—Zn—O-based conductive metal oxide, a Sn—Al—Zn—O-based conductive metal oxide, an In—Zn—O-based conductive metal oxide, a Sn—Zn—O-based conductive metal oxide, an Al—Zn—O-based conductive metal oxide, an In—Sn—O-based conductive metal oxide, an In—O-based conductive metal oxide, a Sn—O-based conductive metal oxide, or a Zn—O-based conductive metal oxide can be used. The thickness of the oxide conductive film is selected within the range from greater than or equal to 50 nm and less than or equal to 300 nm, as appropriate. When a sputtering method is employed, film deposition is performed with the use of a target in which $SiO_2$ is included at from greater than or equal to 2 wt % and less than or equal to 10 wt %, and the light-transmitting conductive film may include $SiO_x$ (x>0) which suppresses crystallization. Thus, crystallization of the oxide conductive film can be suppressed.

An oxide semiconductor target containing In, Ga, and Zn ($In_2O_3$:$Ga_2O_3$:ZnO=1:1:1 [in a molar ratio], In:Ga:Zn=1:1:0.5 [in an atomic ratio]) is used. The oxide conductive film is formed under the following condition: the distant between the substrate 450 and the target is 100 mm, the pressure is 0.2 Pa, the direct current (DC) power is 0.5 kW, and the atmosphere is a mixed atmosphere of argon and oxygen (argon:oxygen=30 sccm:20 sccm and the oxygen flow rate is 40%). Note that a pulse direct current (DC) power supply is preferable because dust can be reduced and the film thickness can be uniform. The In—Ga—Zn—O-based non-single-crystal film is formed to a thickness of 5 nm to 200 nm In this embodiment, as the oxide semiconductor film, an In—Ga—Zn—O-based non-single-crystal film having a thickness of 20 nm is formed with the use of an In—Ga—Zn—O-based oxide semiconductor target by a sputtering method. As a material of the oxide semiconductor target, a target material such as In:Ga:ZnO=1:1:1 or In:Ga:ZnO=1:1:4 can be used.

Note that the resist masks 482a and 482b in this embodiment are each a resist mask having a depression or a projection. In other words, each of the resist masks can also be referred to as a resist mask including a plurality of regions (here, two regions) having different thicknesses. As for the resist masks 482a and 482b, thick regions are referred to as projections of the resist masks 482a and 482b, whereas thin regions are referred to as depressions of the resist masks 482a and 482b.

In the resist masks 482a and 482b, projections are formed in portions where a source electrode layer and a drain electrode layer are formed below each of the resist masks 482a and 482b, and depressions are formed in portions where a channel formation region is formed later below each of the resist masks 482a and 482b.

Each of the resist masks 482a and 482b can be formed using a multi-tone mask. The multi-tone mask is a mask capable of light exposure with multi-level light intensity, and typically, light exposure is performed with three levels of light intensity to provide an exposed region, a half-exposed region, and an unexposed region. When the multi-tone mask is used, one-time light exposure and development process allow a resist mask with plural thicknesses (typically, two kinds of thicknesses) to be formed. Therefore, by the usage of a multi-tone mask, the number of photomasks can be reduced.

By light exposure using the multi-tone mask and development, the resist masks 482a and 482b each of which includes regions having different thicknesses can be formed. Note that without limitation thereto, the resist masks 482a and 482b may be formed without a multi-tone mask.

Next, the resist masks 482a and 482b are made to recede (are reduced) to form a resist mask 487a and a resist mask 487b. In order to make the resist masks recede (reduce), ashing using oxygen plasma or the like may be performed. The resist masks are made to recede (are reduced) to partly expose the oxide semiconductor layers 462 and 472.

Figure 39D:
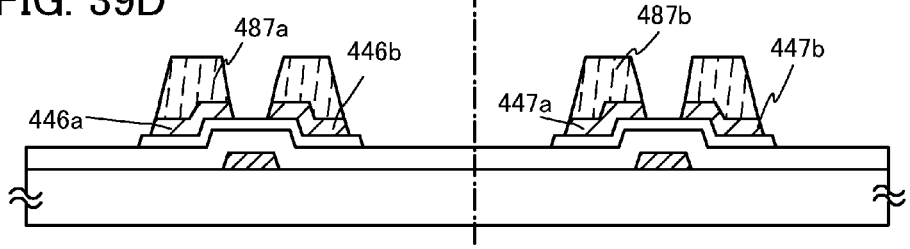
Figure 39E:
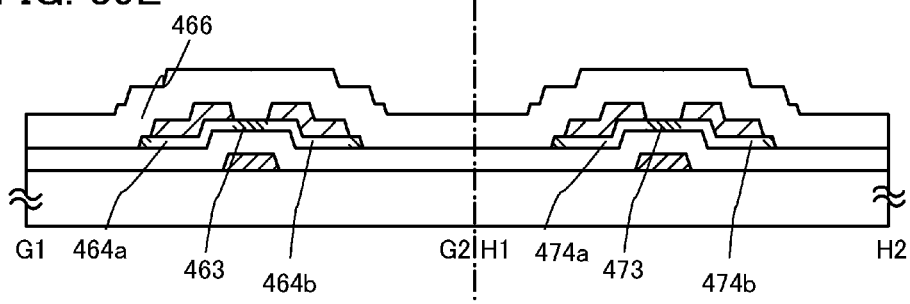
Figure 40A:
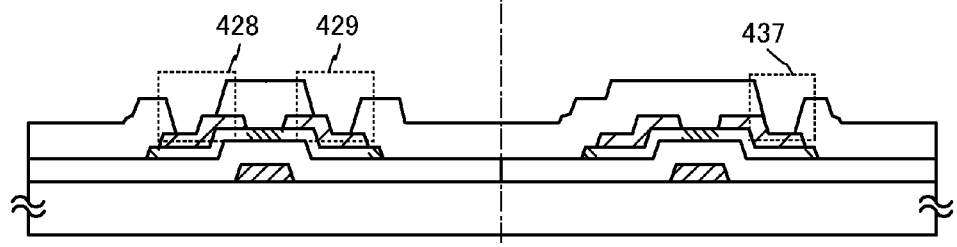
FIGS. 40A to 40D are views illustrating a method for manufacturing a semiconductor device.
Figure 40B:
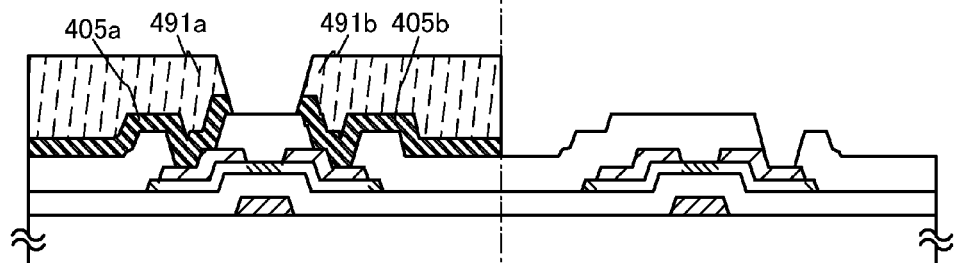
Figure 40C:
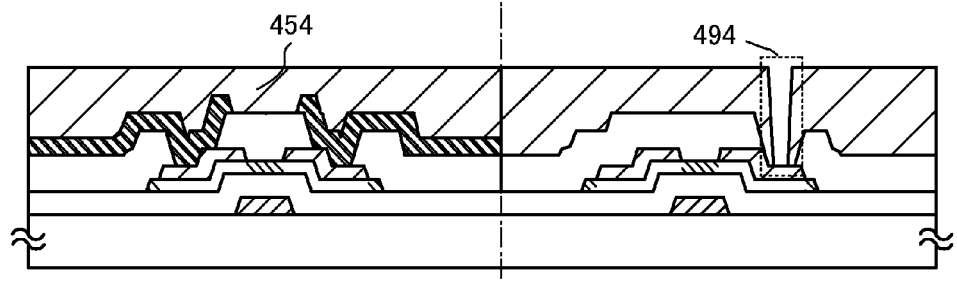
Figure 40D:
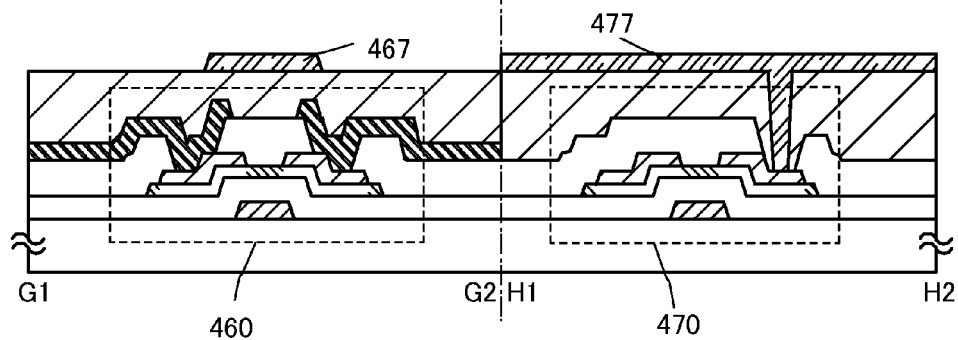

Next, selective etching is performed with the use of the resist masks 487a and 487b, so that the low-resistance source region 446a, the low-resistance drain region 446b, and the source and drain electrode layers 447a and 447b are formed (FIG. 39D).

Note that as illustrated in FIG. 39D, etching is performed with the use of the resist masks 487a and 487b which are formed in such a way that the resist masks 482a and 482b are made to recede (are reduced), whereby end portions of the oxide semiconductor layer 462 extend beyond end portions of the low-resistance source region 446a and the low-resistance drain region 446b, whereas end portions of the oxide semiconductor layer 472 extend beyond end portions of the source and drain electrode layers 447a and 447b.

Note that etching conditions of an etching step at this time may be set as appropriate so that the lower oxide semiconductor layer 462 and the lower oxide semiconductor layer 472 remain. For example, the etching time may be controlled.

It is preferable that the oxide semiconductor layers 462 and 472 and the oxide conductive layers 442 and 444 be formed using a material having high etching selection ratio. For example, a metal oxide material containing Sn (such as $SnZnO_x$ (x>0) or $SnGaZnO_x$ (x>0)) is used as a material which is used to form the oxide semiconductor layers, whereas an Al—Zn—O-based material, an Al—Zn—O—N-based material, a Zn—O-based material, or the like may be used as a material which is used for a material of the oxide conductive layers. Such a material containing zinc oxide as its main component can be etched using an alkaline solution, for example. In the case where a material containing aluminum such as an Al—Zn—O-based material or an Al—Zn—O—N-based material is used, it is preferable that the resist masks which are used for etching be removed using a method in which the oxide conductive layers are not removed together. For example, the resist masks can be removed by dry etching without the oxide conductive layers being removed.

Next, the resist masks 487a and 487b are removed, and then the oxide insulating layer 466 which is partly in contact with the oxide semiconductor layers 462 and 472 is formed.

The oxide insulating layer 466 has a thickness of at least 1 nm or more, and the oxide insulating layer 466 can be formed by a method in which impurities such as water or hydrogen are prevented from entering the oxide insulating layer 466, such as a sputtering method, as appropriate. In this embodiment, a silicon oxide film is formed to a thickness of 300 nm as the oxide insulating layer 466. The substrate temperature in the film formation may be higher than or equal to room temperature and lower than or equal to 300° C., and is set at 100° C. in this embodiment. The silicon oxide film can be formed by a sputtering method under a rare gas (typically argon) atmosphere, an oxygen atmosphere, or an atmosphere containing a rare gas (typically argon) and oxygen. A silicon oxide target or a silicon target can be used as a target. For example, the silicon oxide film can be formed using a silicon target by a sputtering method under an atmosphere containing oxygen and nitrogen. The oxide insulating layer 466 which is partly in contact with the oxide semiconductor layers 462 and 472 does not contain impurities such as moisture, hydrogen ions, and OW and is formed using an inorganic insulating film which prevents the impurities from entering from the outside. Typically, the oxide insulating layer 466 is formed using a silicon oxide film, a silicon nitride oxide film, an aluminum oxide film, an aluminum oxynitride film, or the like. A silicon oxide film is formed using a silicon target material which is doped with boron, and the oxide insulating layer 466 is formed using the silicon oxide film, so that entry of impurities (moisture, hydrogen ions, OH$^-$, and the like) can be suppressed.

Next, second heat treatment (preferably, higher than or equal to 200° C. and lower than or equal to 400° C., for example, higher than or equal to 250° C. and lower than or equal to 350° C.) is performed. For example, the second heat treatment is performed at 250° C. for one hour under a nitrogen atmosphere. When the second heat treatment is performed, the oxide semiconductor layers 462 and 472 which are partly in contact with the oxide insulating layer 466 are heated.

Through the above process, each resistance of the oxide semiconductor layers 462 and 472 is reduced, and parts of the oxide semiconductor layers 462 and 472 are selectively made to be in an oxygen-excess state. As a result, the channel formation region 463 which overlaps with the gate electrode layer 461 has an i-type. The channel formation region 473 which overlaps with the gate electrode layer 471 has an i-type. The high-resistance source region 464a is formed in a self-aligning manner in a portion of the oxide semiconductor layer 462 which overlaps with the low-resistance source region 446a. The high-resistance drain region 464b is formed in a self-aligning manner in a portion of the oxide semiconductor layer 462 which overlaps with the low-resistance drain region 446b. The high-resistance source region 474a is formed in a self-aligning manner in a portion of the oxide semiconductor layer 472 which overlaps with the source electrode layer 447a. The high-resistance drain region 474b is formed in a self-aligning manner in a portion of the oxide semiconductor layer 472 which overlaps with the drain electrode layer 447b (see FIG. 39E).

Note that by the formation of the high-resistance drain region 464b (or the high-resistance source region 464a) in part of the oxide semiconductor layer 462, which overlaps with the low-resistance source region 446a (and the low-resistance drain region 446b), reliability of a driver circuit can be improved. Specifically, when the high-resistance drain region 464b is formed, a transistor can have a structure in which conductivity is gradually changed from the drain electrode layer 465b to the high-resistance drain region 464b and the channel formation region 463. Thus, in the case where the transistor is operated with the drain electrode layer electrically connected to a wiring for supplying a high power supply potential VDD, the high-resistance drain region serves as a buffer, and thus local concentration of an electric field does not occur even if the high electric field is applied between the gate electrode layer 461 and the drain electrode layer 465b, which leads to an increase in the withstand voltage of the transistor.

In the oxide semiconductor layer 462 which overlaps with the low-resistance source region 446a (and the low-resistance drain region 446b), the high-resistance drain region 464b (or the high-resistance source region 464a) is formed, whereby leakage current of the transistor in the driver circuit can be reduced.

Note that by the formation of the high-resistance drain region 474b (or the high-resistance source region 474a) in part of the oxide semiconductor layer 472, which overlaps with the drain electrode layer 447b (and the source electrode layer 447a), reliability of a pixel can be improved. Specifically, when the high-resistance drain region 474b is formed, a transistor can have a structure in which conductivity is gradually changed from the drain electrode layer 447b to the high-resistance drain region 474b and the channel formation region 473. Thus, in the case where operation is performed with the drain electrode layer 447b electrically connected to a wiring for supplying a high power supply potential VDD, the high-resistance drain region 474b serves as a buffer, and thus local concentration of an electric field does not occur even if the high electric field is applied between the gate electrode layer 471 and the drain electrode layer 447b, which leads to an increase in the withstand voltage of the transistor.

When the high-resistance drain region 474b (or the high-resistance source region 474a) is formed in the oxide semiconductor layer 472 which overlaps with the drain electrode layer 447b (and the source electrode layer 447a), leakage current of a transistor in the pixel can be reduced.

Note that in a semiconductor device of this embodiment, a protective insulating layer can be provided over the oxide insulating layer 466. In this embodiment, when the protective insulating layer is provided, a silicon nitride film is formed by an RF sputtering method. An RF sputtering method has the advantage of productivity; therefore, the method is preferable as a film formation method of the protective insulating layer. For example, the protective insulating layer in which impurities such as moisture, hydrogen ions, and OH⁻ are not contained can be formed using an inorganic insulating film which prevents these from entering from the outside. The protective insulating layer can be formed using a silicon nitride film, an aluminum nitride film, a silicon nitride oxide film, an aluminum oxynitride film, or the like. Needless to say, the protective insulating layer is a light-transmitting insulating layer.

Next, a third photolithography process is performed, and a resist mask is formed. When the oxide insulating layer 466 is etched, a region 428 in which part of the low-resistance source region 446a is exposed, a region 429 in which part of the low-resistance drain region 446b is exposed, and a contact hole 437 which reaches the drain electrode layer 447b are formed, so that the oxide insulating layer 466 is in contact with the upper surface of the oxide semiconductor layer 462, and peripheries and side surfaces of the low-resistance source region 446a and the low-resistance drain region 446b (see FIG. 40A). Note that the resist mask here may be formed by an inkjet method. When the resist mask is formed by an inkjet method, a photomask is not used; therefore, manufacturing cost can be reduced.

Next, after the resist mask is removed, a conductive film is formed over at least the exposed low-resistance source region 446a, the exposed low-resistance drain region 446b, and the oxide insulating layer 466. A resist mask 491a and a resist mask 491b are formed over the conductive film by a fourth photolithography process, and the conductive film is selectively etched, whereby a source electrode layer 405a and a drain electrode layer 405b are formed (see FIG. 40B).

As a material of the conductive film used for forming the source and drain electrode layers 405a and 405b, an element selected from Al, Cr, Cu, Ta, Ti, Mo, and W, an alloy containing any of these elements as a component, an alloy containing these elements in combination, or the like can be given.

As the conductive film, a stacked film of three layers in which a titanium film, an aluminum film, and a titanium film are stacked in that order; or a stacked film of three layers in which a molybdenum film, an aluminum film, and a molybdenum film are stacked in that order is preferably used. Needless to say, a single-layer film, a two-layer film, or a four-or-more layer film may be used as the conductive film. When a stacked conductive film of a titanium film, an aluminum film, and a titanium film is used as the conductive film, etching can be performed by a dry etching step using a chlorine gas.

Next, the planarizing insulating layer 454 is formed over the oxide insulating layer 466. As the planarizing insulating layer 454, an organic material having heat resistance, such as polyimide, an acrylic resin, a benzocyclobutene resin, polyamide, or an epoxy resin can be used. Other than such organic materials, it is also possible to use a low-dielectric constant material (low-k material), a siloxane-based resin, phosphosilicate glass (PSG), borophosphosilicate glass (BPSG), or the like as the planarizing insulating layer 454. Note that the planarizing insulating layer 454 may be formed by stacking a plurality of insulating films formed using these materials.

There is no particular limitation on the method for forming the planarizing insulating layer 454, and the planarizing insulating layer 454 can be formed, depending on the material, by a method such as a sputtering method, an SOG method, spin coating, dip coating, spray coating, or a droplet discharge method (such as an inkjet method, screen printing, offset printing, or the like), or a tool (equipment) such as a doctor knife, a roll coater, a curtain coater, or a knife coater.

Next, a fifth photolithography process is performed. A resist mask is formed, and the planarizing insulating layer 454 is etched to form a contact hole 494 that reaches the drain electrode layer 447b (see FIG. 39B). In addition, contact holes that reach the gate electrode layers 461 and 471 are formed by this etching. The resist mask used for forming the contact hole that reaches the drain electrode layer 447b may be formed by an inkjet method. When the resist mask is formed by an inkjet method, a photomask is not used; therefore, manufacturing cost can be reduced.

Next, the resist mask is removed, and then a light-transmitting conductive film is formed. For example, indium oxide ($In_2O_3$), an indium oxide-tin oxide alloy ($In_2O_3$—$SnO_2$, abbreviated as ITO), or the like is deposited by a sputtering method, a vacuum evaporation method, or the like so that the light-transmitting conductive film is formed. As the light-transmitting conductive film, an Al—Zn—O-based non-single-crystal film containing nitrogen, that is, an Al—Zn—O—N-based non-single-crystal film, a Zn—O—N-based non-single-crystal film, or a Sn—Zn—O—N-based non-single-crystal film may be used. Note that the relative proportion (atomic %) of zinc in an Al—Zn—O—N-based non-single-crystal film is less than or equal to 47 atomic % and is larger than the relative proportion (atomic %) of aluminum in the Al—Zn—O—N-based non-single-crystal film. The relative proportion (atomic %) of aluminum in the Al—Zn—O—N-based non-single-crystal film is larger than the relative proportion (atomic %) of nitrogen in the Al—Zn—O—N-based non-single-crystal film. A film having such a material is etched with a hydrochloric acid-based solution. Instead, because a residue tends to be generated particularly in etching of ITO, an indium oxide-zinc oxide ($In_2O_3$—ZnO) alloy may be used in order to improve etching processability.

Next, a sixth photolithography process is performed, and a resist mask is formed. An unnecessary portion of the light-transmitting conductive film is removed by etching and the resist mask is removed, so that the pixel electrode layer 477 and the conductive layer 467 are formed (see FIG. 39D).

Through the above process, with the use of six masks, the thin film transistors 460 and 470 can be separately formed in the driver circuit and the pixel portion, respectively over one substrate. The thin film transistor 460 in the driver circuit includes the oxide semiconductor layer 462 having the high-resistance source region 464a, the high-resistance drain region 464b, and the channel formation region 463. The thin film transistor 470 in the pixel includes the oxide semiconductor layer 472 having the high-resistance source region 474a, the high-resistance drain region 474b, and the channel formation region 473. Even when a high electric field is applied to the thin film transistors 460 and 470, the high-resistance source region 464a, the high-resistance drain region 464b, the high-resistance source region 474a, and the high-resistance drain region 474b serve as buffers, so that the local electric field concentration is not applied, and withstand voltage of the transistors is improved.

By the method for manufacturing a semiconductor device illustrated in FIGS. 39A to 39E and FIGS. 40A to 40D, the gate insulating layer 452 serves as a dielectric, and a storage capacitor formed using a capacitor wiring and a capacitor electrode can also be formed over the same substrate as the thin film transistors 460 and 470. The thin film transistors 470 and the storage capacitors are arranged in a matrix corresponding to respective pixels to form a pixel portion, and the driver circuit having the thin film transistor 460 is arranged at the periphery of the pixel portion, whereby one of the substrates for manufacturing an active matrix display device can be obtained.

Note that the pixel electrode layer 477 is electrically connected to a capacitor electrode layer through the contact hole 494 formed in the planarizing insulating layer 454 and the contact hole 437 formed in the oxide insulating layer 466. Note that the capacitor electrode layer can be formed using the same material in the same step as the source and drain electrode layers 447a and 447b.

In addition, when the conductive layer 467 is provided in a portion overlapped with the channel formation region 463 of the oxide semiconductor layer 462, in a bias-temperature stress test (hereinafter referred to as a BT test) for examining reliability of a thin film transistor, the amount of shift in threshold voltage of the thin film transistor 460 between before and after the BT test can be reduced. The conductive layer 467 may have a potential which is the same as or different from that of the gate electrode layer 461, and can function as a gate electrode layer. The conductive layer 467 may be in a GND state, a state where a potential of 0 V is applied, or a floating state.

The resist mask for forming the pixel electrode layer 477 and the conductive layer 467 may be formed by an inkjet method. When the resist mask is formed by an inkjet method, a photomask is not used; therefore, manufacturing cost can be reduced.

(Embodiment 5)

Figure 41A:
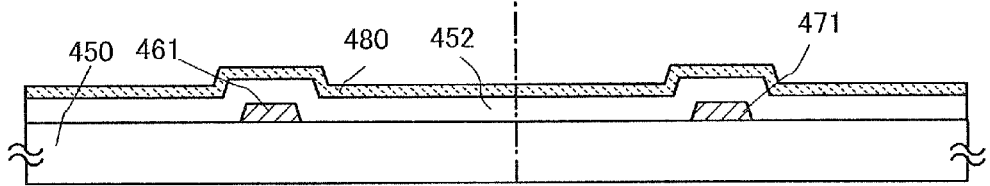
FIGS. 41A to 41C are views illustrating a method for manufacturing a semiconductor device.
Figure 41B:
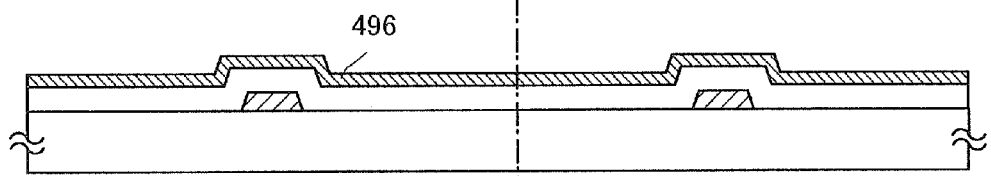
Figure 41C:
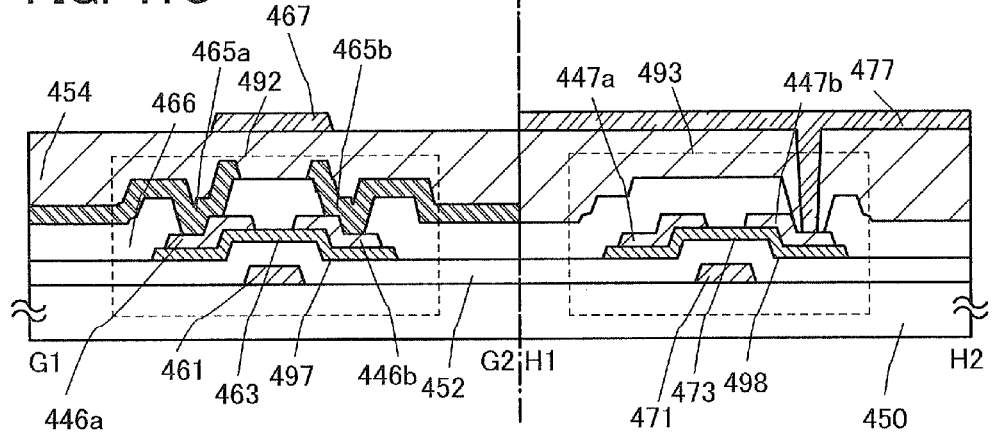

In this embodiment, an example in which the first heat treatment is different from that in Embodiment 4 is illustrated in FIGS. 41A to 41C. Since only part of the process described in this embodiment is different from the process illustrated in FIGS. 39A to 39E and FIGS. 40A to 40C, the same reference symbols are used for the same portions as FIGS. 39A to 39E and FIGS. 40A to 40C in FIGS. 41A to 41C, and detailed description of the same portions will be omitted.

FIGS. 41A to 41C are cross-sectional views illustrating a manufacturing process of two thin film transistors.

First, according to Embodiment 4, the gate electrode layers 461 and 471 are formed over the substrate 450 having an insulating surface.

Next, the gate insulating layer 452 is formed over the gate electrode layers 461 and 471.

Then, the oxide semiconductor film 480 is formed to a thickness of greater than or equal to 2 nm and less than or equal to 200 nm over the gate insulating layer 452 (see FIG. 41A). Note that the process up to this stage is the same as that described in Embodiment 4, and FIG. 41A corresponds to FIG. 39A.

Next, the oxide semiconductor film 480 is subjected to dehydration or dehydrogenation under an inert gas atmosphere or under a reduced pressure. The temperature of first heat treatment for dehydration or dehydrogenation is higher than or equal to 350° C. and lower than the strain point of the substrate, preferably higher than or equal to 400° C. Here, the substrate is introduced into an electric furnace which is one of heat treatment apparatuses, heat treatment is performed on the oxide semiconductor film 480 under a nitrogen atmosphere, and then, entry of water or hydrogen into the oxide semiconductor film 480 is prevented with the oxide semiconductor film 480 not exposed to the air. Accordingly, the oxide semiconductor film 480 is changed into an oxygen-deficient semiconductor film. Thus, the resistance of the oxide semiconductor film 480 is reduced, that is, the oxide semiconductor film 480 becomes an n-type semiconductor film (e.g., an n⁻ semiconductor film). After that, a high-purity oxygen gas, a high-purity $N_2O$ gas, or an ultra-dry air (with a dew point of −40° C. or lower, preferably −60° C. or lower) is introduced into the same furnace and cooling is performed. It is preferable that moisture, hydrogen, and the like be not contained in an oxygen gas or a $N_2O$ gas. Alternatively, the purity of an oxygen gas or a $N_2O$ gas which is introduced into the heat treatment apparatus is preferably 6N (99.9999%) or more, more preferably 7N (99.99999%) or more (i.e., the impurity concentration of the oxygen gas or the $N_2O$ gas is preferably 1 ppm or lower, more preferably 0.1 ppm or lower).

Moreover, after the first heat treatment for dehydration or dehydrogenation, heat treatment may be performed at from 200° C. to 400° C., preferably from 200° C. to 300° C., under an oxygen gas atmosphere, an $N_2O$ gas atmosphere, or an ultra-dry air (the dew point is −40° C. or lower, preferably −60° C. or lower).

Through the above process, the entire oxide semiconductor layer is made to be in an oxygen-excess state and to increase resistance, that is, to have an i-type, whereby an oxide semiconductor film 496 is formed (see FIG. 41B). As a result, reliability of the thin film transistor to be completed later can be improved.

Dehydration or dehydrogenation of the oxide semiconductor film may be performed under an inert gas atmosphere, and then cooling may be performed under an inert gas atmosphere. A resist mask may be formed by a photolithography process, and the oxide semiconductor film 496 may be selectively etched using the resist mask. An oxide semiconductor layer which is an island-shaped oxide semiconductor layer may be formed, and then heat treatment may be performed under an oxygen gas atmosphere, a $N_2O$ gas atmosphere, or an ultra-dry air (the dew point is lower than or equal to −40° C., preferably lower than or equal to −60° C.) at a temperature of higher than or equal to 200° C. and lower than or equal to 400° C., preferably, higher than or equal to 200° C. and lower than or equal to 300° C.

Alternatively, before the oxide semiconductor film 480 is formed, heat treatment (higher than or equal to 400° C. and lower than a strain point of a substrate) may be performed under an inert atmosphere (nitrogen, helium, neon, argon, or the like), an oxygen atmosphere, or an ultra-dry air (the dew point is lower than or equal to −40° C., preferably lower than or equal to −60° C.) atmosphere, and impurities such as hydrogen and water contained in the gate insulating layer may be removed.

In a manner to similar to FIGS. 39C to 39E and FIGS. 40A to 40C of Embodiment 4, an oxide semiconductor layer 497 and an oxide semiconductor layer 498 are formed. The low-resistance source region 446a and the low-resistance drain region 446b which are in contact with the oxide semiconductor layer 497 are formed. The oxide insulating layer 466 which is in contact with part of the oxide semiconductor layer 497 and peripheries and side surfaces of the low-resistance source region 446a and the low-resistance drain region 446b is formed. On the other hand, in a pixel portion, the source and drain electrode layers 447a and 447b which are light-transmitting conductive layers are formed so as to be in contact with the oxide semiconductor layer 498. The oxide insulating layer 466 which is in contact with part of the oxide semiconductor layer 498 is formed.

Next, the second heat treatment (preferably, higher than or equal to 200° C. and lower than or equal to 400° C., for example, higher than or equal to 250° C. and lower than or equal to 350° C.) is performed under an inert atmosphere or an oxygen gas atmosphere. The condition of the second heat treatment can be the same condition as the method for manufacturing a semiconductor device described in Embodiment 4. For example, the second heat treatment is performed under a nitrogen atmosphere at 250° C. for one hour.

Next, parts of the low-resistance source region 446a and the low-resistance drain region 446b are exposed, and a contact hole that reaches the drain electrode layer 447b is formed in the oxide insulating layer 466. A conductive film is formed over the oxide insulating layer 466, and the conductive film is etched selectively to form the source electrode layer 465a in contact with the low-resistance source region 446a and the drain electrode layer 465b in contact with the low-resistance drain region 446b. The planarizing insulating layer 454 is formed in contact with the oxide insulating layer 466, and a contact hole that reaches the drain electrode layer 447b is formed in the planarizing insulating layer 454. A light-transmitting conductive film is formed over the contact hole and the planarizing insulating layer 454. The light-transmitting conductive film is selectively etched to form the pixel electrode layer 477 which is electrically connected to the drain electrode layer 447b, and the conductive layer 467 is formed (see FIG. 41C).

Through the above process, with the use of six masks, a thin film transistor 492 and a thin film transistor 493 each having the oxide semiconductor layer which is entirely intrinsic can be separately formed in a driver circuit and the pixel portion, respectively over one substrate. The thin film transistor 492 for the driver circuit includes the oxide semiconductor layer 497 which is entirely intrinsic. The thin film transistor 493 for the pixel includes the oxide semiconductor layer 498 which is entirely intrinsic.

The gate insulating layer 452 serves as a dielectric, and a storage capacitor formed using a capacitor wiring layer and a capacitor electrode can also be formed over the same substrate as the thin film transistors 492 and 493. The thin film transistors 493 and the storage capacitors are arranged in a matrix corresponding to respective pixels to form the pixel portion, and the driver circuit having the thin film transistor 492 is arranged at the periphery of the pixel portion, whereby one of the substrates for manufacturing an active matrix display device can be obtained.

In addition, when the conductive layer 467 is provided in a portion overlapped with the channel formation region of the oxide semiconductor layer 497, in a BT test, the amount of shift in threshold voltage of the thin film transistor 492 between before and after the BT test can be reduced. The conductive layer 467 may have a potential which is the same as or different from that of the gate electrode layer 461, and can function as a gate electrode layer. The conductive layer 467 may be in a GND state, a state where a potential of 0 V is applied, or a floating state.

(Embodiment 6)

A semiconductor device and a method for manufacturing the semiconductor device which are different from those in Embodiment 1 will be described with reference to FIGS. 43A1, 43A2, 43B, and 43C and FIGS. 44A to 44C.

The structure of a conductive layer which overlaps with a source electrode, a drain electrode, and a channel formation region of a thin film transistor in a driver circuit of the semiconductor device illustrated in FIGS. 43A1, 43A2, 43B, and 43C is different from that of the semiconductor device illustrated in FIGS. 1A1, 1A2, 1B, and 1C. Thus, as for the same portions as the semiconductor device illustrated in FIGS. 1A1, 1A2, 1B, and 1C, description of the semiconductor device illustrated in FIGS. 1A1, 1A2, 1B, and 1C is applied thereto as appropriate and is omitted here.

FIG. 43A1 is a plan view of a thin film transistor 440 provided in the driver circuit. FIG. 43A2 is a plan view of the thin film transistor 420 provided in a pixel. FIG. 43B is a cross-sectional view illustrating a cross-sectional structure taken along line C5-C6 of FIG. 43A1 and a cross-sectional structure taken along line D5-D6 of FIG. 43A2. FIG. 43C is a cross-sectional view illustrating a cross-sectional structure taken along line C7-C8 of FIG. 43A1 and a cross-sectional structure taken along line D7-D8 of FIG. 43A2.

In a similar manner to FIGS. 1A1, 1A2, 1B, and 1C, the thin film transistor 440 provided in the driver circuit includes the gate electrode layer 411, the gate insulating layer 402, the oxide semiconductor layer 412 which includes at least the channel formation region 413, the high-resistance source region 414a, and the high-resistance drain region 414b, the low-resistance source region 408a, the low-resistance drain region 408b, and the source and drain electrode layers 405a and 405b over the substrate 400 having an insulating surface. In addition, the thin film transistor 440 is provided with the oxide insulating layer 416 which is in contact with peripheries and side surfaces of the low-resistance source region 408a and the low-resistance drain region 408b and which is in contact with part of the oxide semiconductor layer.

Note that the high-resistance source region 414a is formed in contact with a lower surface of the low-resistance source region 408a in a self-aligning manner. The high-resistance drain region 414b is formed in contact with a lower surface of the low-resistance drain region 408b in a self-aligning manner. In addition, the channel formation region 413 is in contact with part of the oxide insulating layer 416 and serves as a high-resistance region (i-type region) in comparison with the high-resistance source region 414a and the high-resistance drain region 414b.

Note that the semiconductor device illustrated in FIGS. 43A1, 43A2, 43B, and 43C has the high-resistance source region and the high-resistance drain region in the oxide semiconductor layer of the thin film transistor; however, the structure is not limited thereto, and the entire oxide semiconductor layer is a high-resistance region (i-type region) without a high-resistance source region and a high-resistance drain region.

The source electrode layer 405a is in contact with the low-resistance source region 408a, whereas the drain electrode layer 405b is in contact with the low-resistance drain region 408b.

Above the channel formation region 413 in the driver circuit illustrated in FIGS. 43A1, 43A2, 43B, and 43C, a conductive layer 405c which overlaps with the channel formation region 413 is provided. The conductive layer 405c is electrically connected to the gate electrode layer 411 so as to have the same potential, so that gate voltage can be applied from above and below the oxide semiconductor layer 412 provided between the gate electrode layer 411 and the conductive layer 405c. When the potential of the gate electrode layer 411 is different from that of the conductive layer 405c, for example, either the potential of the gate electrode layer 411 or the potential of the conductive layer 405c is any one of a predetermined potential, a GND potential, or 0 V, electric characteristics of the TFT such as threshold voltage can be controlled.

The source and drain electrode layers 405a and 405b and the conductive layer 405c can be formed using the same material, and for example, a metal material is preferably used.

The driver circuit is provided with the planarizing insulating layer 404 over the conductive layer 405c, the source and drain electrode layers 405a and 405b, and the oxide insulating layer 416.

The structure of the thin film transistor 420 provided in the pixel is the same as that of the semiconductor device illustrated in FIGS. 1A1, 1A2, 1B, and 1C; therefore, description of the semiconductor device illustrated in FIGS. 1A1, 1A2, 1B, and 1C is used and is omitted here.

Note that in the semiconductor device illustrated in FIGS. 43A1, 43A2, 43B, and 43C, the channel length of the thin film transistor 440 is the same as that of the thin film transistor 420 as an example; however, this embodiment is not limited thereto. For example, the thin film transistor in the driver circuit requires higher speed operation than the thin film transistor in the pixel portion; therefore, the channel length of the thin film transistor 440 may be smaller than the channel length of the thin film transistor 420. At this time, for example, it is preferable that the channel length of the thin film transistor 440 be approximately 1 µm to 5 µm, and it is preferable that the channel length of the thin film transistor 420 be approximately 5 µm to 20 µm.

As described above, the semiconductor device illustrated in FIGS. 43A1, 43A2, 43B, and 43C includes a driver circuit having a first thin film transistor and a pixel portion having a second thin film transistor over one substrate. The second thin film transistor is formed using a light-transmitting material, and the first thin film transistor is formed using a lower resistance material than the light-transmitting material. Accordingly, an aperture ratio in the pixel portion and operation speed of the driver circuit can be improved. When the driver circuit and the pixel portion are provided over one substrate, the number of wirings which connect the driver circuit and the pixel portion to each other can be reduced and the length of the wiring can be shortened; therefore, the size and cost of a semiconductor device can be reduced.

The semiconductor device illustrated in FIGS. 43A1, 43A2, 43B, and 43C has a structure in which an oxide insulating layer is in contact with part of the oxide semiconductor layer and a periphery and side surfaces of an oxide conductive layer which is in contact with the source and drain electrode layers. With the structure, when an portion in which a wiring formed of the same layer as the gate electrode layer and a wiring formed of the same layer as the source and drain electrodes are intersected with each other with an insulating layer interposed therebetween at the periphery of the thin film transistor, an interval between the wiring formed of the same layer as the gate electrode layer and the wiring formed of the same layer as the source and drain electrodes can be increased; thus, parasitic capacitance can be reduced.

As for the thin film transistor in the driver circuit of the semiconductor device illustrated in FIGS. 43A1, 43A2, 43B, and 43C, the low-resistance source region and the low-resistance drain region are provided between the source and drain electrode layers, and the oxide semiconductor layer in which the channel formation region is formed. When the low-resistance source region and the low-resistance drain region are provided, frequency characteristics of a peripheral circuit (driver circuit) can be improved. Compared with contact between the metal electrode layer and the oxide semiconductor layer, contact between the metal electrode layer and the low-resistance source region and the low-resistance drain region can reduce contact resistance. An electrode layer using molybdenum (such as a stacked layer of a molybdenum layer, an aluminum layer, and a molybdenum layer) has high contact resistance to the oxide semiconductor layer because molybdenum is difficult to oxidize in comparison with titanium and operation of extracting oxygen from the oxide semiconductor layer is weak and a contact interface between a molybdenum layer and the oxide semiconductor layer does not become n-type. However, when the low-resistance source region and the low-resistance drain region are interposed between the oxide semiconductor layer and the source and drain electrode layers, contact resistance can be reduced and frequency characteristics of the peripheral circuit (driver circuit) can be improved. In addition, when the low-resistance source region and the low-resistance drain region are provided, the channel length (L) of the thin film transistor is determined at the time when a layer to serve as the low-resistance source region and the low-resistance drain region is etched; therefore, the channel length can be shortened further.

As for the thin film transistor in the driver circuit of the semiconductor device illustrated in FIGS. 43A1, 43A2, 43B, and 43C, a conductive layer which overlaps with the channel formation region with the oxide insulating layer interposed therebetween and which is formed using the same material as the source and drain electrode layers can be provided; thus, threshold voltage of the thin film transistor can be controlled. Since the conductive layer is formed using the same material as the source and drain electrode layers of the thin film transistor in the driver circuit, the wiring resistance can be reduced. Note that the conductive layer is the same layer as the source and drain electrode layers; therefore, it is preferable that the conductive layer be provided so as not to be in contact with the source or drain electrode layer. For example, another conductive layer is provided over the conductive layer with the insulating layer interposed therebetween and is electrically connected to the conductive layer through a contact hole provided in the insulating layer, whereby the conductive layer can be led.

In a similar manner to Embodiment 1, the semiconductor device of this embodiment has a thin film transistor in which two gate insulating layers are provided and a protective insulating layer is provided over an oxide insulating layer.

An example of a method for manufacturing the thin film transistors 440 and 420 over one substrate will be described with reference to FIGS. 44A to 44C.

First, similarly to FIGS. 2A to 2E and FIG. 3A described in Embodiment 1, the gate electrode layers 411 and 421 are formed over the substrate 400, and the gate insulating layer 402 is formed over the gate electrode layers 411 and 421. The oxide semiconductor layer 412 is formed over the gate electrode layer 411 with the gate insulating layer 402 interposed therebetween, and the oxide semiconductor layer 422 is formed over the gate electrode layer 421 with the gate insulating layer 402 interposed therebetween. The first heat treatment is performed, and dehydration or dehydrogenation of the oxide semiconductor layer 412 and the oxide semiconductor layer 422 are performed. The low-resistance source region 408*a* and the low-resistance drain region 408*b* are formed using the oxide conductive layer over the oxide semiconductor layer 412. The source electrode layer 409*a* and the drain electrode layer 409*b* are formed using the oxide conductive layer over the oxide semiconductor layer 422. The oxide insulating layer 416 is formed in contact with part of the oxide semiconductor layer 412, in contact with peripheries and side surfaces of the low-resistance source region 408*a* and the low-resistance drain region 408*b*, and in contact with the source and drain electrode layers 409*a* and 409*b*, and the second heat treatment is performed. Part of the oxide insulating layer 416 is removed, and parts of the low-resistance source region 408*a* and the low-resistance drain region 408*b* are exposed, and the contact hole 426 that reaches the drain electrode layer 409*b* is formed in the oxide insulating layer 416.

A conductive film is formed over the oxide insulating layer 416, and a resist mask 448*a*, a resist mask 448*b*, and a resist mask 448*c* are formed by a photolithography process. Etching is performed using the resist masks 448*a*, 448*b*, and 448*c* to form the source and drain electrode layers 405*a* and 405*b* and the conductive layer 405*c* (see FIG. 44A).

Note that as for an etching step at this time, it is preferable that the low-resistance source region 408a, the low-resistance drain region 408b, the source and drain electrode layers 409a and 409b, and the oxide semiconductor layers 412 and 422 be not etched, and etching conditions may be set as appropriate so as not to etch the low-resistance source region 408a, the low-resistance drain region 408b, the source and drain electrode layers 409a and 409b, and the oxide semiconductor layers 412 and 422. For example, the etching time may be controlled.

It is preferable that a material with high etching selection ratio be used as materials used for forming the oxide semiconductor layers 412 and 422 and as materials used for forming the low-resistance source region 408a, the low-resistance drain region 408b, the source and drain electrode layers 409a and 409b. For example, a metal oxide material containing Sn (such as $SnZnO_x$ (x>0) or $SnGaZnO_x$ (x>0) may be used as the materials used for forming the oxide semiconductor layers, and an Al—Zn—O-based material, an Al—Zn—O—N-based material, a Zn—O-based material, or the like may be used as a material used for forming the oxide conductive layers. Such a material containing zinc oxide as its main component can be etched using an alkaline solution, for example. In the case where a material containing aluminum such as an Al—Zn—O-based material or an Al—Zn—O—N-based material is used, it is preferable that a resist mask be removed by a method in which the oxide conductive layers are not removed together when the resist mask which has been used for etching is removed. For example, the resist mask is removed by dry etching, whereby the resist mask can be removed without the oxide conductive layers being removed.

Next, the resist masks 448a to 448c are removed, and then the planarizing insulating layer 404 is formed over the source and drain electrode layers 405a and 405b, the conductive layer 405c, and the oxide insulating layer 416. A photolithography process is performed, and a resist mask is formed. The planarizing insulating layer 404 is etched, so that the contact hole 441 that reaches the drain electrode layer 409b is formed (see FIG. 44B).

Next, the resist mask is removed, and then a light-transmitting conductive film is formed. A photolithography process is performed, and a resist mask is formed. An unnecessary portion is removed by etching, so that the pixel electrode layer 427 is formed (see FIG. 44C).

Figure 44A:
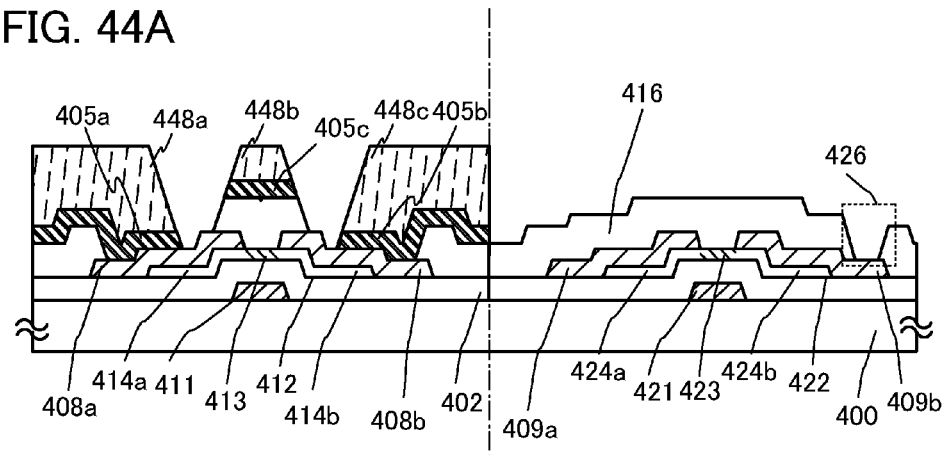
FIGS. 44A to 44C are views illustrating a method for manufacturing a semiconductor device.
Figure 44B:
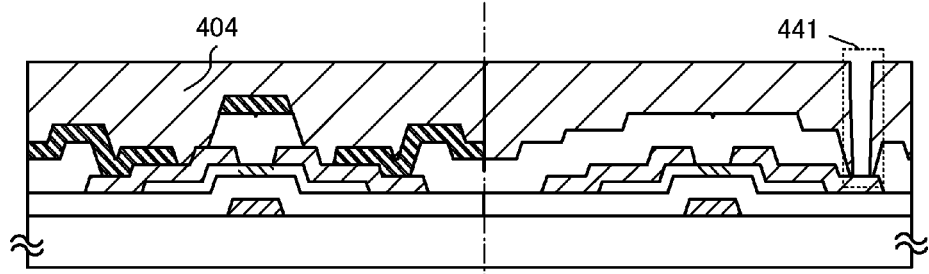
Figure 44C:
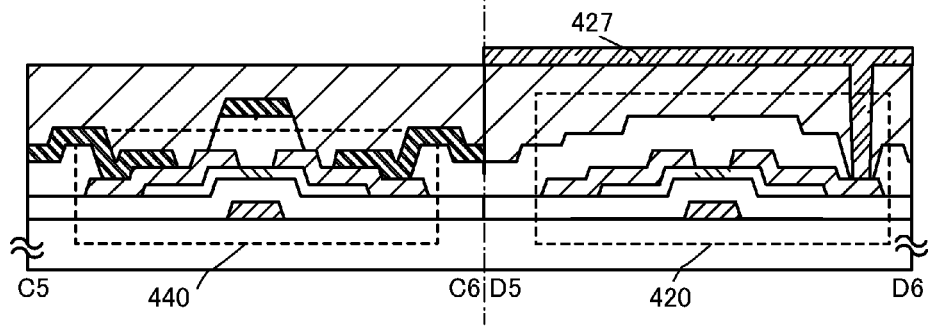

In the method for manufacturing a semiconductor device of this embodiment, as illustrated in FIGS. 44A to 44C, the low-resistance source region 408a, the low-resistance drain region 408b, the source and drain electrode layers 409a and 409b can be formed using one mask.

Through the above process, with the use of seven or eight masks, the thin film transistors 440 and 420 can be separately formed in the driver circuit and the pixel portion, respectively over one substrate. The thin film transistor 440 in the driver circuit includes the oxide semiconductor layer 412 having the high-resistance source region 414a, the high-resistance drain region 414b, and the channel formation region 413. The thin film transistor 420 in the pixel portion includes the oxide semiconductor layer 422 having the high-resistance source region 424a, the high-resistance drain region 424b, and the channel formation region 423. Even when a high electric field is applied to the thin film transistors 440 and 420, the high-resistance source region 414a, the high-resistance drain region 414b, the high-resistance source region 424a, and the high-resistance drain region 424b serve as buffers, so that the local electric field concentration is not applied, and withstand voltage of the transistors is improved.

In the method for manufacturing a semiconductor device of this embodiment, in the thin film transistor in the driver circuit, the conductive layer which overlaps with the channel formation region of the semiconductor layer can be formed in the same step as the source and drain electrode layers. Accordingly, the semiconductor device can be formed without increase in the number of manufacturing steps.

(Embodiment 7)

A semiconductor device and a method for manufacturing the semiconductor device which are different from those in Embodiment 6 will be described with reference to FIGS. 45A1, 45A2, 45B, and 45C and FIGS. 46A to 46C.

The structure of a conductive layer which overlaps with a source electrode, a drain electrode, and a channel formation region of a thin film transistor in a driver circuit of the semiconductor device illustrated in FIGS. 45A1, 45A2, 45B, and 45C is different from that of the semiconductor device illustrated in FIGS. 38A1, 38A2, 38B, and 38C of Embodiment 4. Thus, as for the same portions as the semiconductor device illustrated in FIGS. 38A1, 38A2, 38B, and 38C, description of the semiconductor device illustrated in FIGS. 38A1, 38A2, 38B, and 38C is applied thereto as appropriate and is omitted here.

FIG. 45A1 is a plan view of a thin film transistor 490 provided in the driver circuit. FIG. 45A2 is a plan view of the thin film transistor 470 provided in a pixel. FIG. 45B is a cross-sectional view illustrating a cross-sectional structure taken along line G5-G6 of FIG. 45A1 and a cross-sectional structure taken along line H5-H6 of FIG. 45A2. FIG. 45C is a cross-sectional view illustrating a cross-sectional structure taken along line G7-G8 of FIG. 45A1 and a cross-sectional structure taken along line H7-H8 of FIG. 45A2.

As illustrated in FIGS. 38A1, 38A2, 38B, and 38C, the thin film transistor 490 provided in the driver circuit includes the gate electrode layer 461, the gate insulating layer 452, the oxide semiconductor layer 462 which includes at least the channel formation region 463, the high-resistance source region 464a, and the high-resistance drain region 464b, the low-resistance source region 446a, the low-resistance drain region 446b, a source electrode layer 495a, and a drain electrode layer 495b over the substrate 450 having an insulating surface. In addition, the thin film transistor 490 is provided with the protective insulating layer 453 which is in contact with peripheries and side surfaces of the low-resistance source region 446a and the low-resistance drain region 446b and which is in contact with part of the oxide semiconductor layer 462.

The high-resistance source region 464a is formed in contact with a lower surface of the low-resistance source region 446a in a self-aligning manner. The high-resistance drain region 464b is formed in contact with a lower surface of the low-resistance drain region 446b in a self-aligning manner. In addition, the channel formation region 463 is in contact with the protective insulating layer 453 and serves as a high-resistance region (i-type region) in comparison with the high-resistance source region 464a and the high-resistance drain region 464b.

Note that the semiconductor device illustrated in FIGS. 45A1, 45A2, 45B, and 45C has the high-resistance source region and the high-resistance drain region in the oxide semiconductor layer of the thin film transistor; however, the structure is not limited thereto, and the entire oxide semiconductor layer is a high-resistance region (i-type region) without a high-resistance source region and a high-resistance drain region.

The source electrode layer 495a is in contact with the low-resistance source region 446a, whereas the drain electrode layer 495b is in contact with the low-resistance drain region 446b.

Above the channel formation region 463 in the driver circuit illustrated in FIGS. 45A1, 45A2, 45B, and 45C, a conductive layer 495c which overlaps with the channel formation region 463 is provided. The conductive layer 495c is electrically connected to the gate electrode layer 461 so as to have the same potential, so that gate voltage can be applied from above and below the oxide semiconductor layer 462 provided between the gate electrode layer 461 and the conductive layer 495c. When the potential of the gate electrode layer 461 is different from that of the conductive layer 495c, for example, either the potential of the gate electrode layer 461 or the potential of the conductive layer 495c is any one of a predetermined potential, a GND potential, or 0 V, electric characteristics of the TFT such as threshold voltage can be controlled.

The source and drain electrode layers 495a and 495b and the conductive layer 495c can be formed using the same material, and for example, a metal material is preferably used.

The driver circuit is provided with the planarizing insulating layer 454 over the conductive layer 495c, the source and drain electrode layers 495a and 495b, and the oxide insulating layer 466.

FIG. 45A2 is a plan view of the thin film transistor 470 provided in the pixel. The structure of the thin film transistor 470 is the same as that of the semiconductor device illustrated in FIGS. 38A1, 38A2, 38B, and 38C; therefore, description of the semiconductor device illustrated in FIGS. 38A1, 38A2, 38B, and 38C is used and is omitted here.

Note that in the semiconductor device illustrated in FIGS. 45A1, 45A2, 45B, and 45C, the channel length of the thin film transistor 490 is the same as that of the thin film transistor 470 as an example; however, this embodiment is not limited thereto. For example, since a thin film transistor in the driver circuit requires higher speed operation than a thin film transistor in the pixel portion, the channel length of the thin film transistor 490 may be smaller than that of the thin film transistor 470. In this case, for example, it is preferable that the channel length of the thin film transistor 490 be approximately 1 μm to 5 μm and the channel length of the thin film transistor 470 be approximately 5 μm to 20 μm.

As described above, the semiconductor device illustrated in FIGS. 45A1, 45A2, 45B, and 45C includes a driver circuit having a first thin film transistor and a pixel portion having a second thin film transistor over one substrate. The second thin film transistor is formed using a light-transmitting material, and the first thin film transistor is formed using a lower resistance material than the light-transmitting material. Accordingly, an aperture ratio in the pixel portion and operation speed of the driver circuit can be improved. When the driver circuit and the pixel portion are provided over one substrate, the number of wirings which connect the driver circuit and the pixel portion to each other can be reduced and the length of the wiring can be shortened; therefore, the size and cost of a semiconductor device can be reduced.

In the semiconductor device illustrated in FIGS. 45A1, 45A2, 45B, and 45C, an end portion of the oxide semiconductor layer of the first thin film transistor extends beyond the end portions of the low-resistance source region and the low-resistance drain region, and an end portion of the oxide semiconductor layer of the second thin film transistor extends beyond the end portions of the source and drain electrode layers.

As for the thin film transistor in the driver circuit of the semiconductor device illustrated in FIGS. 45A1, 45A2, 45B, and 45C, the low-resistance source region and the low-resistance drain region are provided between the source and drain electrode layers and the oxide semiconductor layer in which the channel formation region is formed. When the low-resistance source region and the low-resistance drain region are provided, frequency characteristics of a peripheral circuit (driver circuit) can be improved. Compared with contact between a metal electrode layer and the oxide semiconductor layer, contact between the metal electrode layer and the low-resistance source region and the low-resistance drain region can reduce contact resistance. An electrode layer using molybdenum (such as a stacked layer of a molybdenum layer, an aluminum layer, and a molybdenum layer) has high contact resistance to the oxide semiconductor layer because molybdenum is difficult to oxidize in comparison with titanium and operation of extracting oxygen from the oxide semiconductor layer is weak and a contact interface between a molybdenum layer and the oxide semiconductor layer does not become n-type. However, when the low-resistance source region and the low-resistance drain region are interposed between the oxide semiconductor layer and the source and drain electrode layers, contact resistance can be reduced and frequency characteristics of the peripheral circuit (driver circuit) can be improved. In addition, when the low-resistance source region and the low-resistance drain region are provided, the channel length (L) of the thin film transistor is determined at the time when a layer to serve as the low-resistance source region and the low-resistance drain region is etched; therefore, the channel length can be shortened further.

The semiconductor device illustrated in FIGS. 45A1, 45A2, 45B, and 45C has a structure in which an oxide insulating layer is in contact with part of the oxide semiconductor layer and a periphery and side surfaces of an oxide conductive layer which is in contact with the source and drain electrode layers. With the structure, when an portion in which a wiring formed of the same layer as the gate electrode layer and a wiring formed of the same layer as the source and drain electrodes are intersected with each other with an insulating layer interposed therebetween at the periphery of the thin film transistor, an interval between the wiring formed of the same layer as the gate electrode layer and the wiring formed of the same layer as the source and drain electrodes can be increased; thus, parasitic capacitance can be reduced.

As for the thin film transistor in the driver circuit of the semiconductor device illustrated in FIGS. 45A1, 45A2, 45B, and 45C, a conductive layer which overlaps with the channel formation region with the oxide insulating layer interposed therebetween and which is formed using the same material as the source and drain electrode layers can be provided; thus, threshold voltage of the thin film transistor can be controlled. Since the conductive layer is formed using the same material as the source and drain electrode layers of the thin film transistor in the driver circuit, the wiring resistance can be reduced.

In a similar manner to Embodiment 4, the semiconductor device of this embodiment has a thin film transistor in which two gate insulating layers are provided and a protective insulating layer is provided over an oxide insulating layer.

Figure 46A:
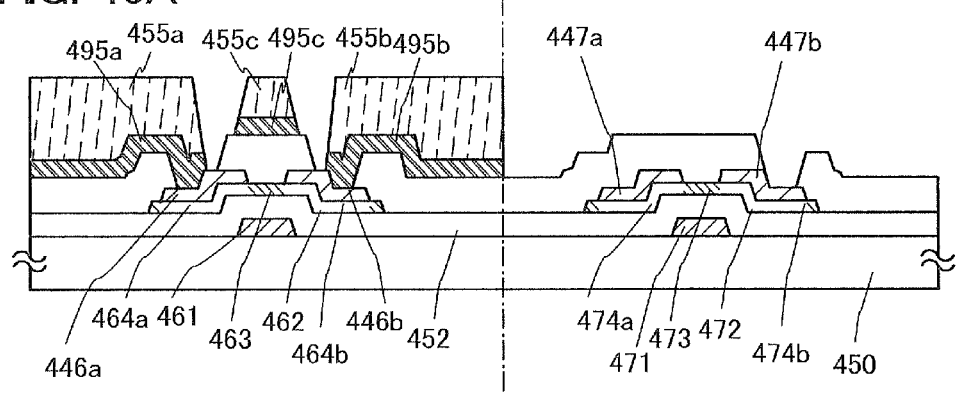
FIGS. 46A to 46C are views illustrating a method for manufacturing a semiconductor device.
Figure 46B:
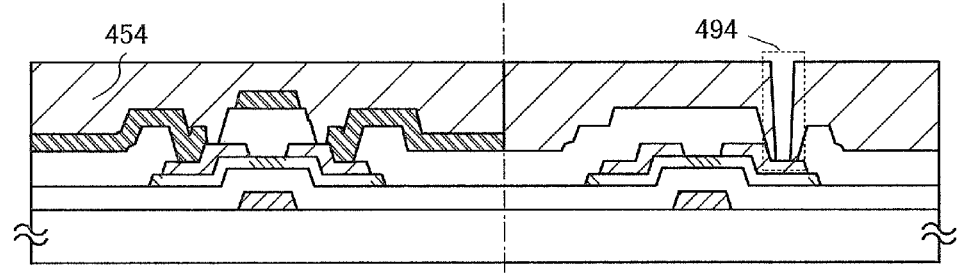
Figure 46C:
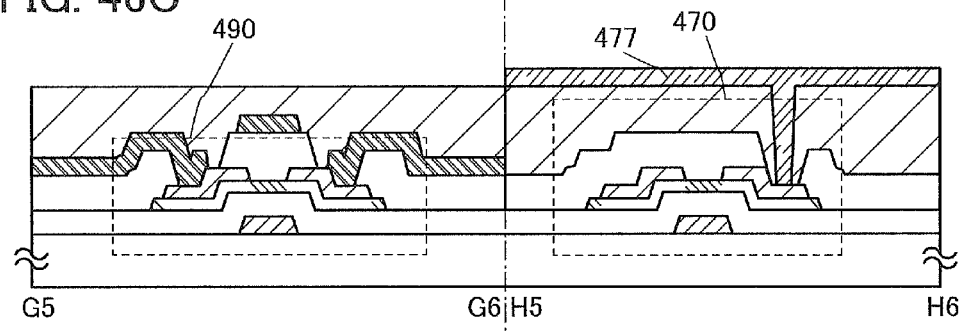

An example of a method for manufacturing the thin film transistors 490 and 470 over one substrate will be described with reference to FIGS. 46A to 46C.

First, in a similar manner to FIGS. 39A to 39E and FIG. 40A of Embodiment 4, the gate electrode layer 461 and the gate electrode layer 471 are formed over the substrate 450, and the gate insulating layer 452 is formed over the gate electrode layer 461 and the gate electrode layer 471. The oxide semiconductor film 480 is formed over the gate insulating layer 452, and the first heat treatment is performed. Dehydration or dehydrogenation of the oxide semiconductor film is performed, so that an oxide semiconductor film 481 is obtained. An oxide conductive film is formed over the oxide semiconductor film 481, and the resist masks 482a and 482b are formed using a multi-tone mask. The oxide semiconductor film 481 and the oxide conductive film are etched using the resist masks 482a and 482b, so that the oxide semiconductor layer 462 is formed over the gate electrode layer 461 with the gate insulating layer 452 interposed therebetween and the oxide semiconductor layer 472 is formed over the gate electrode layer 471 with the gate insulating layer 452 interposed therebetween. The resist masks 482a and 482b are removed, and the low-resistance source region 446a and the low-resistance drain region 446b are formed using the oxide conductive layer over the oxide semiconductor layer 462, and the source and drain electrode layers 447a and 447b are formed using the oxide conductive layer over the oxide semiconductor layer 472. The oxide insulating layer 466 is formed in contact with part of the oxide semiconductor layer, peripheries and side surfaces of the low-resistance source region 446a and the low-resistance drain region 446b, and the source and drain electrode layers 447a and 447b. The second heat treatment is performed and part of the oxide insulating layer 466 is removed. Parts of the low-resistance source region 446a and the low-resistance drain region 446b are exposed, and the contact hole 437 that reaches the drain electrode layer 409b is formed in the oxide insulating layer 466.

A conductive film is formed over the oxide insulating layer 466, and a resist mask 455a, a resist mask 455b, and a resist mask 455c are formed by a photolithography process. Etching is selectively performed to form the source and drain electrode layers 495a and 495b and the conductive layer 495c (see FIG. 46A).

Note that as for an etching step at this time, it is preferable that the low-resistance source region 446a and the low-resistance drain region 446b which are lower layers, the source and drain electrode layers 447a and 447b, and the oxide semiconductor layers 462 and 472 be not etched, and etching conditions may be set as appropriate so as not to etch the low-resistance source region 446a, the low-resistance drain region 446b, the source and drain electrode layers 447a and 447b, and the oxide semiconductor layers 462 and 472. For example, the etching time may be controlled.

It is preferable that a material with high etch selection ratio be used as materials used for forming the oxide semiconductor layers 462 and 472 and as materials used for forming the low-resistance source region 446a, the low-resistance drain region 446b, the source and drain electrode layers 447a and 447b. For example, a metal oxide material containing Sn (such as $SnZnO_x$ or $SnGaZnO_x$ may be used as the materials used for forming the oxide semiconductor layers, and an Al—Zn—O-based material, an Al—Zn—O—N-based material, a Zn—O-based material, or the like may be used as a material used for forming the oxide conductive layers. Such a material containing zinc oxide as its main component can be etched using an alkaline solution, for example. In the case where a material containing aluminum such as an Al—Zn—O-based material or an Al—Zn—O—N-based material is used, it is preferable that a resist mask be removed by a method in which the oxide conductive layers are not removed together when the resist mask which has been used for etching is removed. For example, the resist mask is removed by dry etching, whereby the resist mask can be removed without the oxide conductive layers being removed.

Next, the resist masks 455a to 455c are removed, and then the planarizing insulating layer 454 is formed over the source and drain electrode layers 495a and 495b, the conductive layer 495c, and the oxide insulating layer 466. A photolithography process is performed, and a resist mask is formed. The planarizing insulating layer 454 is etched, so that the contact hole 494 that reaches the drain electrode layer 447b is formed (see FIG. 46B).

Next, the resist mask is removed, and then a light-transmitting conductive film is formed. A photolithography process is performed, and a resist mask is formed. An unnecessary portion is removed by etching, so that the pixel electrode layer 477 is formed.

Through the above process, with the use of six masks, the thin film transistors 490 and 470 can be separately formed in the driver circuit and the pixel portion, respectively over one substrate, and the number of masks can be reduced as compared to that of the manufacturing process described in Embodiment 6. The thin film transistor 490 in the driver circuit includes the oxide semiconductor layer 462 having the high-resistance source region 464a, the high-resistance drain region 464b, and the channel formation region 463. The thin film transistor 470 in the pixel portion includes the oxide semiconductor layer 472 having the high-resistance source region 474a, the high-resistance drain region 474b, and the channel formation region 473. Even when a high electric field is applied to the thin film transistors 490 and 470, the high-resistance source region 464a, the high-resistance drain region 464b, the high-resistance source region 474a, and the high-resistance drain region 474b serve as buffers, so that the local electric field concentration is not applied, and withstand voltage of the transistors is improved.

By a method for manufacturing a semiconductor device of this embodiment, in the thin film transistor in the driver circuit, the conductive layer which overlaps with the channel formation region of the semiconductor layer can be formed in the same step as the source and drain electrode layers. Accordingly, the semiconductor device can be formed without increase in the number of manufacturing steps. Note that this embodiment can be combined with any of the other embodiments, as appropriate.

(Embodiment 8)

In this embodiment, an example in which an active matrix liquid crystal display device is manufactured with the active matrix substrate described in Embodiment 1 will be described. Note that this embodiment can also be applied to any of the active matrix substrates described in any of Embodiments 2 to 7.

FIG. 7A illustrates an example of a cross-sectional structure of an active matrix substrate.

The thin film transistor in the driver circuit and the thin film transistor in the pixel portion over one substrate are described in Embodiments 1 to 7; in this embodiment, a terminal portion and a wiring intersection of a storage capacitor, a gate wiring, and a source wiring are illustrated in addition to those thin film transistors for description. The terminal portion and the wiring intersection of the capacitor, the gate wiring, and the source wiring can be formed in the same manufacturing process of a semiconductor device as in any of Embodiments 1 to 7 and can be manufactured without an increase in the number of photomasks and increase in the number of steps. Moreover, in a portion to serve as a display region in a pixel portion, all the gate wiring, the source wiring, and a capacitor wiring layer are formed using a light-transmitting conductive film, resulting in a high aperture ratio. Furthermore, a metal wiring can be used for a source wiring layer in a portion that does not serve as the display region in order to reduce the wiring resistance. Note that in this embodiment, the case where the thin film transistor 440 illustrated in FIGS. 43A1, 43A2, 43B, and 43C is used as an example of the thin film transistor in the driver circuit, and the thin film transistor 420 illustrated in FIGS. 43A1, 43A2, 43B, and 43C is used as an example of the thin film transistor in the pixel portion is described; however, there is no particular limitation thereto.

In FIG. 7A, a thin film transistor 210 is a thin film transistor provided in a driver circuit, and a thin film transistor 220 which is electrically connected to a pixel electrode layer 227 is a thin film transistor provided in a pixel portion.

The thin film transistor 220 which is formed above a substrate 200, in this embodiment, has the same structure as the thin film transistor 440 in FIGS. 43A1, 43A2, 43B, and 43C.

A capacitor wiring layer 230 which is formed using the same light-transmitting material in the same step as a gate electrode layer of the thin film transistor 220 overlaps with a capacitor electrode layer 231, with a gate insulating layer 202 serving as a dielectric therebetween; thus, a storage capacitor is formed. The capacitor electrode layer 231 is formed using the same light-transmitting material in the same step as a source electrode layer or a drain electrode layer of the thin film transistor 220. Since the storage capacitor has a light-transmitting property as well as the thin film transistor 220, the aperture ratio can be increased.

The light-transmitting property of the storage capacitor is important in increasing the aperture ratio. For small liquid crystal display panels of 10 inches or smaller in particular, a high aperture ratio can be achieved even when the pixel size is reduced in order to realize higher definition of display images by an increase in the number of gate wirings, for example. Moreover, the use of a light-transmitting film for components of the thin film transistor 220 and the storage capacitor makes it possible to achieve a high aperture ratio even when one pixel is divided into a plurality of subpixels in order to realize a wide viewing angle. That is, a high aperture ratio can be maintained even when a group of high-density thin film transistors is arranged, and the display region can have a sufficient area. For example, when one pixel includes two to four subpixels and storage capacitors, the storage capacitors have light-transmitting properties as well as the thin film transistors, so that the aperture ratio can be increased.

Note that the storage capacitor is provided below the pixel electrode layer 227, and the capacitor electrode layer 231 is electrically connected to the pixel electrode layer 227.

Although the example in which the storage capacitor is constituted by the capacitor electrode layer 231 and the capacitor wiring layer 230 is described in this embodiment, there is no particular limitation on the structure of the storage capacitor. For example, a storage capacitor may be formed in such a manner that, without a capacitor wiring layer, a pixel electrode layer overlaps with a gate wiring in an adjacent pixel, with a planarizing insulating layer, an oxide insulating layer, and a gate insulating layer therebetween.

In FIG. 7A, since the storage capacitor having a large capacitance is formed, only the gate insulating layer 202 is provided between the capacitor wiring and the capacitor electrode. The wiring intersection is provided with the gate insulating layer 202 and the oxide insulating layer 266 between the gate wiring layer 232 and a wiring formed thereover, in order to reduce parasitic capacitance. Note that it is preferable that the thickness of the gate insulating layer be small to increase storage capacitance; therefore, the gate insulating layer over the capacitor wiring may be thinned in the selective etching of the oxide insulating layer 266.

A plurality of gate wirings, source wirings, and capacitor wiring layers are provided in accordance with the pixel density. In the terminal portions, a plurality of terminal electrodes having the same electric potential as the gate wiring, a plurality of terminal electrodes having the same electric potential as the source wiring, a plurality of terminal electrodes having the same electric potential as the capacitor wiring layer, and the like are arranged. There is no particular limitation on the number of each of the terminal electrodes, and the number of the terminals can be determined by a practitioner, as appropriate.

In the terminal portion, the terminal electrode which has the same electric potential as the gate wiring can be formed using the same light-transmitting material as the pixel electrode layer 227. The terminal electrode having the same electric potential as the gate wiring is electrically connected to the gate wiring through a contact hole that reaches the gate wiring. The contact hole that reaches the gate wiring is formed by selective etching of a planarizing insulating layer 204, the oxide insulating layer 266, and the gate insulating layer 202 with the use of the same photomask as that used for forming a contact hole for electrically connecting the drain electrode layer of the thin film transistor 220 and the pixel electrode layer 227.

A gate electrode layer of the thin film transistor 210 in the driver circuit may be electrically connected to a conductive layer 405c provided above an oxide semiconductor layer. In that case, a contact hole is formed by selective etching of the planarizing insulating layer 204, the oxide insulating layer 266, and the gate insulating layer 202 with the use of the same photomask as that used for forming the contact hole for electrically connecting the drain electrode layer of the thin film transistor 220 and the pixel electrode layer 227. The conductive layer 405c and the gate electrode layer of the thin film transistor 210 in the driver circuit are electrically connected to each other through the contact hole.

A terminal electrode layer 235 which has the same electric potential as a terminal electrode layer 234 in the driver circuit can be formed using the same light-transmitting material as the pixel electrode layer 227. The terminal electrode layer 235 is electrically connected to the terminal electrode layer 234 through a contact hole that reaches the terminal electrode layer 234. The terminal electrode layer 234 is a metal wiring, is formed using the same material in the same step as a source electrode layer of the thin film transistor 210, and has the same electric potential as the source electrode layer of the thin film transistor 210.

The third terminal electrode which has the same electric potential as the capacitor wiring layer 230 can be formed using the same light-transmitting material as the pixel electrode layer 227. Moreover, a contact hole that reaches the capacitor wiring layer 230 can be formed in the same step using the same photomask as those for forming a contact hole for electrically connecting the capacitor electrode layer 231 to the pixel electrode layer 227.

In the case of manufacturing an active matrix liquid crystal display device, a liquid crystal layer is provided between an active matrix substrate and a counter substrate provided with a counter electrode (also referred to as a counter electrode layer), and the active matrix substrate and the counter substrate are fixed to each other. A common electrode electrically connected to the counter electrode provided on the counter substrate is provided over the active matrix substrate, and a fourth terminal electrode electrically connected to the common electrode is provided in the terminal portion. The fourth terminal electrode is used for setting the common electrode to a fixed electric potential such as GND or 0 V. The fourth terminal electrode can be formed using the same light-transmitting material as the pixel electrode layer 227.

The gate electrode layer of the thin film transistor 210 in the driver circuit or a terminal electrode having the same electric potential as the gate electrode layer and the drain electrode layer of the thin film transistor 210 in the driver circuit or a terminal electrode having the same electric potential as the drain electrode layer are electrically connected to each other through a contact hole provided by etching of the gate insulating layer 202. For example, as illustrated in FIGS. 7A and 7B, an electrode 272 can be electrically connected to an electrode 271 through a contact hole provided in the gate insulating layer 202. At this time, part of the oxide insulating layer 266 may be removed. Accordingly, favorable contact can be obtained, which leads to a reduction in contact resistance. Thus, the number of openings can be reduced, which results in reducing the area occupied by the driver circuit.

In FIGS. 7A and 7B, an example is described in which the gate electrode layer of the thin film transistor 210 in the driver circuit or the terminal electrode having the same electric potential as the gate electrode layer and the drain electrode layer of the thin film transistor 210 in the driver circuit or the terminal electrode having the same electric potential as the drain electrode layer are electrically connected to each other through the contact hole provided in the gate insulating layer 202; however, there is no limitation thereto. A gate electrode layer of the thin film transistor 220 in the pixel portion or a terminal electrode having the same electric potential as the gate electrode layer and a drain electrode layer or a terminal electrode having the same electric potential as the drain electrode layer can be electrically connected to each other through a contact hole provided in the gate insulating layer 202.

There is no particular limitation on the structure where the source electrode layer of the thin film transistor 220 and the source electrode layer of the thin film transistor 210 are electrically connected to each other; for example, a connection electrode for connecting the source electrode layer of the thin film transistor 220 and the source electrode layer of the thin film transistor 210 may be formed in the same step as the pixel electrode layer 227. Furthermore, in the portion that does not serve as the display region, the source electrode layer of the thin film transistor 220 and the source electrode layer of the thin film transistor 210 may be in contact and overlap with each other.

Note that FIG. 7A illustrates a cross-sectional structure of the gate wiring layer 232 in the driver circuit. Since an example of a small liquid crystal display panel of 10 inches or smaller is described in this embodiment, the gate wiring layer 232 in the driver circuit is formed using the same light-transmitting material as the gate electrode layer of the thin film transistor 220.

When the same material is used for the gate electrode layer, the source electrode layer, the drain electrode layer, the pixel electrode layer, another electrode layer, and another wiring layer, a common sputtering target and a common manufacturing apparatus can be used, and thus the material costs and costs of an etchant (or an etching gas) used for etching can be reduced. Consequently, manufacturing costs can be reduced.

When a photosensitive resin material is used for the planarizing insulating layer 204 in the structure in FIG. 7A, the step for forming a resist mask can be omitted.

FIG. 7B illustrates a cross-sectional structure, part of which is different from the structure in FIG. 7A. FIG. 7B is the same as FIG. 7A except that the planarizing insulating layer 204 is not provided; therefore, the same portions are as those in FIG. 7A are denoted by the same reference numerals, and detailed description of the portions is omitted. In FIG. 7B, the pixel electrode layer 227 and the conductive layer 405c are formed in contact with the oxide insulating layer 266, and the terminal electrode layer 235 is formed over the terminal electrode layer 234.

With the structure in FIG. 7B, the step for forming the planarizing insulating layer 204 can be omitted.

(Embodiment 9)

In this embodiment, an example will be described in which part of a gate wiring is made from a metal wiring so that the wiring resistance is reduced, because there is a possibility that the resistance of a light-transmitting wiring might become a problem in the case where the size of a liquid crystal display panel exceeds 10 inches and reaches 60 inches and even 120 inches.

Note that in FIG. 8A, the same portions as in FIG. 7A are denoted by the same reference numerals and detailed description of the portions is omitted. Note that this embodiment can also be applied to any of the active matrix substrates described in Embodiments 1 to 7.

FIG. 8A illustrates an example in which part of a gate wiring in a driver circuit is made from a metal wiring and formed in contact with a light-transmitting wiring which is the same as the material of the gate electrode layer of the thin film transistor 210. Note that the number of photomasks in this embodiment is larger than that in Embodiment 8 due to the formation of the metal wiring.

First, a heat-resistant conductive material film (with a thickness of 100 nm to 500 nm inclusive) that can withstand first heat treatment for dehydration or dehydrogenation is formed over the substrate 200.

In this embodiment, a 370-nm-thick tungsten film and a 50-nm-thick tantalum nitride film are formed. Although a stack of the tantalum nitride film and the tungsten film is used as the conductive film here, there is no particular limitation and the conductive film may be formed using an element selected from Ta, W, Ti, Mo, Al, and Cu; an alloy containing any of these elements as its component, an alloy film containing the above elements in combination, or a nitride containing any of these elements as its component. The heat-resistant conductive material film is not limited to a single layer containing the above-described element and may be a stack of two or more layers.

In a first photolithography process, metal wirings are formed to form a first metal wiring layer 236 and a second metal wiring layer 237. An inductively coupled plasma (ICP) etching method is preferably used for etching of the tungsten film and the tantalum nitride film. The films can be etched into desired tapered shapes by an ICP etching method with appropriate adjustment of the etching conditions (e.g., the amount of electric power applied to a coiled electrode, the amount of electric power applied to a substrate-side electrode, and the temperature of the substrate-side electrode). The first metal wiring layer 236 and the second metal wiring layer 237 are tapered; thus, defects in forming a light-transmitting conductive film thereon can be reduced.

Then, after the light-transmitting conductive film is formed, a gate wiring layer 238, the gate electrode layer of the thin film transistor 210, and a gate electrode layer of the thin film transistor 220 are formed in a second photolithography process. The light-transmitting conductive film is formed using any of the conductive materials which have light-transmitting properties to visible light, which are described in Embodiment 1.

Note that for example, if there is an interface between the gate wiring layer 238 and the first metal wiring layer 236 or the second metal wiring layer 237, an oxide film could be formed with later heat treatment or the like and the contact resistance could be increased depending on the material of the light-transmitting conductive film. For that reason, the second metal wiring layer 237 is preferably formed using a metal nitride film that prevents oxidation of the first metal wiring layer 236.

Next, a gate insulating layer, an oxide semiconductor layer, and the like are formed in the same steps as in any of Embodiments 1 to 7. Subsequent steps are performed in accordance with Embodiment 1 to form the active matrix substrate.

Further, in this embodiment, an example is described in which after the formation of the planarizing insulating layer 204, the planarizing insulating layer in a terminal portion is selectively removed using a photomask. It is preferable that the planarizing insulating layer be not placed in the terminal portion so that the terminal portion can be connected to an FPC in a favorable manner.

The wiring intersection is provided with the gate insulating layer 202 and the oxide insulating layer 266 between the gate wiring layer 238 and a wiring formed thereover, in order to reduce parasitic capacitance. Note that, it is preferable that the thickness of the gate insulating layer be small to increase storage capacitance; therefore, the gate insulating layer over the capacitor wiring may be thinned in the selective etching of the oxide insulating layer 266.

In FIG. 8A, the terminal electrode layer 235 is formed over the terminal electrode layer 234. FIG. 8A illustrates the gate wiring layer 238 which overlaps with part of the second metal wiring layer 237; alternatively, the gate wiring layer 238 may cover all the first metal wiring layer 236 and the second metal wiring layer 237. In other words, the first metal wiring layer 236 and the second metal wiring layer 237 can be referred to as auxiliary wirings for reducing the resistance of the gate wiring layer 238.

In the terminal portion, the first terminal electrode layer 234 that has the same electric potential as the gate wiring is formed over the protective insulating layer 203 and electrically connected to the second metal wiring layer 237. A wiring led from the terminal portion is also formed using a metal wiring.

Furthermore, in order to reduce the wiring resistance, the metal wirings (i.e., the first metal wiring layer 236 and the second metal wiring layer 237) can be used as the auxiliary wirings for the gate wiring layer and a capacitor wiring layer in a portion that does not serve as a display region.

The gate electrode layer of the thin film transistor in the driver circuit or the terminal electrode having the same electric potential as the gate electrode layer and the drain electrode layer of the thin film transistor in the driver circuit or the terminal electrode having the same electric potential as the drain electrode layer are electrically connected to each other through the contact hole provided by etching of the gate insulating layer 202. For example, as illustrated in FIGS. 8A and 8B, the electrode 272 can be electrically connected to a stack of a metal wiring layer 281 and a metal wiring layer 282 which are provided with a gate wiring layer 283 through the contact hole provided in the gate insulating layer 202. At this time, part of the oxide insulating layer 266 may be removed in advance. Accordingly, favorable contact can be obtained, which leads to a reduction in contact resistance. Thus, the number of openings can be reduced, which results in reducing the area occupied by the driver circuit.

In FIGS. 8A and 8B, an example is described in which the gate electrode layer of the thin film transistor in the driver circuit or the terminal electrode having the same electric potential as the gate electrode layer and the drain electrode layer or the terminal electrode having the same electric potential as the drain electrode layer are electrically connected to each other through the contact hole provided in the gate insulating layer 202; however, there is no limitation thereto. The gate electrode layer of the thin film transistor in the pixel portion or a terminal electrode having the same electric potential as the gate electrode layer and a drain electrode layer or a terminal electrode having the same electric potential as the drain electrode layer can be electrically connected to each other through a contact hole provided in the gate insulating layer 202.

FIG. 8B illustrates a cross-sectional structure, part of which is different from the structure in FIG. 8A. FIG. 8B is the same as FIG. 8A except for a material of the gate electrode layer of the thin film transistor in the driver circuit; therefore, the same portions are denoted by the same reference numerals and detailed description of the same portions is omitted.

FIG. 8B illustrates an example in which the gate electrode layer of the thin film transistor in the driver circuit is made from a metal wiring. In the driver circuit, a material of the gate electrode layer is not limited to a light-transmitting material.

In FIG. 8B, a thin film transistor 240 in the driver circuit includes a gate electrode layer in which a metal wiring layer 242 is stacked over a metal wiring layer 241. Note that the metal wiring layer 241 can be formed using the same material in the same step as the metal wiring layer 236. Moreover, the metal wiring layer 242 can be formed using the same material in the same step as the second metal wiring layer 237.

In the case where the metal wiring layer 241 is electrically connected to the conductive layer 405c, it is preferable to use a metal nitride film for the metal wiring layer 242 for preventing oxidation of the first metal wiring layer 242.

In this embodiment, metal wirings are used for some wirings so that the wiring resistance is reduced; high definition of display images can be achieved and a high aperture ratio can be realized even when the size of a liquid crystal display panel exceeds 10 inches and reaches 60 inches and even 120 inches.

(Embodiment 10)

Figure 9A:
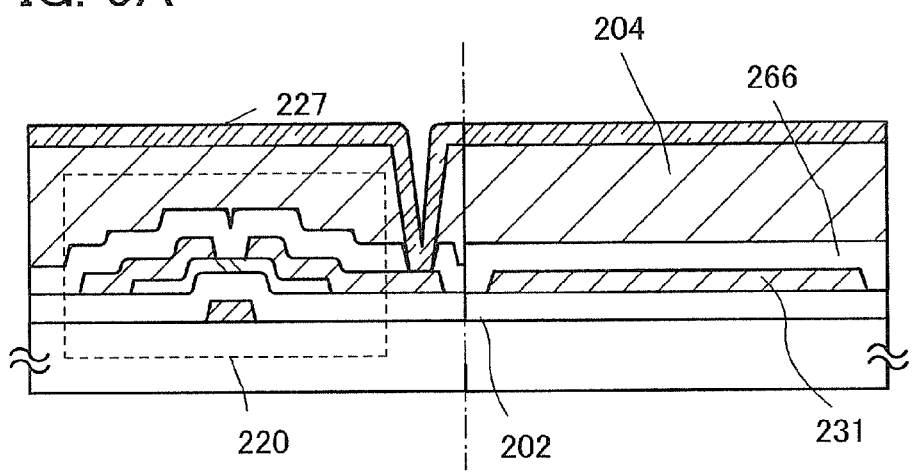
FIGS. 9A and 9B are views each illustrating a semiconductor device.
Figure 9B:
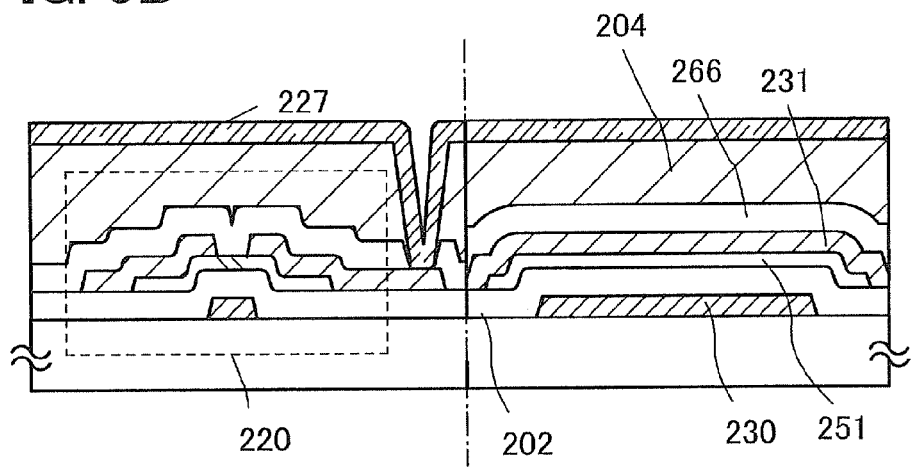

In this embodiment, FIGS. 9A and 9B each illustrate an example in which a structure of a storage capacitor is different from that of Embodiment 8. FIG. 9A is almost the same as FIG. 7A except that the structure of the storage capacitor is different from that of FIG. 7A. Therefore, the same portions are denoted by the same reference numerals and detailed description is omitted. Note that FIG. 9A shows a cross-sectional structure of the thin film transistor 220 in the pixel portion and a storage capacitor.

FIG. 9A shows an example in which a storage capacitor is formed by the pixel electrode layer 227 and the capacitor electrode layer 231 overlapped with the pixel electrode layer 227 using the oxide insulating layer 266, the protective insulating layer 203, and the planarizing insulating layer 204 as a dielectric. Since the capacitor electrode layer 231 is formed using a light-transmitting material and a process which are similar to those of the source electrode layer of the thin film transistor 220 in the pixel portion, the capacitor electrode layer 231 is provided so as not to overlap with a source wiring layer of the thin film transistor 220.

In the storage capacitor illustrated in FIG. 9A, a pair of electrodes and the dielectrics have a light-transmitting property, and thus the storage capacitor as a whole has a light-transmitting property.

FIG. 9B is an example of a structure of a storage capacitor, which is different from that in FIG. 9A. FIG. 9B is almost the same as FIG. 7A except that the structure of the storage capacitor is different from that in FIG. 7A. Therefore, the same portions are denoted by the same reference numerals and detailed description is omitted.

FIG. 9B shows an example in which a storage capacitor is formed by a stacked layer of the capacitor wiring layer 230, the oxide semiconductor layer 251 overlapped with the capacitor wiring layer 230, and the capacitor electrode layer 231. The oxide semiconductor layer 251 is stacked in contact with and below the capacitor electrode layer 231 and functions as one of the electrodes of the storage capacitor. Note that the capacitor electrode layer 231 is formed using a light-transmitting material in the same step as those of the source electrode layer or the drain electrode layer of the thin film transistor 220. Since the capacitor wiring layer 230 is formed using the same light-transmitting material by the same process as those of the gate electrode layer of the thin film transistor 220, the capacitor wiring layer 230 is provided so as not to overlap with the gate wiring layer of the thin film transistor 220.

In addition, the capacitor electrode layer 231 is electrically connected to the pixel electrode layer 227.

In the storage capacitor illustrated in FIG. 9B, a pair of electrodes and the dielectrics have a light-transmitting property, and thus the storage capacitor as a whole has a light-transmitting property.

Each of the storage capacitors illustrated in FIGS. 9A and 9B has a light-transmitting property; thus, sufficient capacitance and high aperture ratio can be obtained even when the size of pixels is decreased in order to realize higher definition of display images by increasing the number of gate wirings, for example.

This embodiment can be combined with any of the other embodiments, as appropriate.

(Embodiment 11)

In this embodiment, an example will be described below in which a semiconductor device to be disposed in a pixel portion and at least part of a driver circuit are formed over one substrate.

The thin film transistor to be disposed in the pixel portion is formed according to any of Embodiments 1 to 7. Further, the thin film transistor described in any of Embodiments 1 to 7 is an n-channel TFT. Thus, part of a driver circuit that can be formed using n-channel TFTs among driver circuits is formed over the same substrate as that for the thin film transistor in the pixel portion.

Figure 14A:
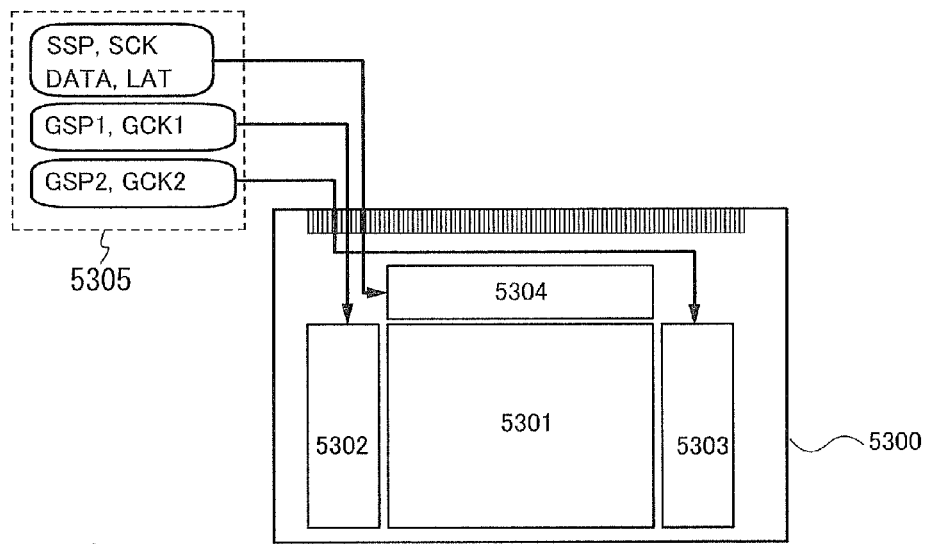
FIGS. 14A and 14B are block diagrams each illustrating a semiconductor device.

FIG. 14A illustrates an example of a block diagram of an active matrix display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines which is extended from the signal line driver circuit 5304 is provided, and a plurality of scan lines which is extended from the first scan line driver circuit 5302 and the second scan line driver circuit 5303 is provided. Note that pixels which include display elements are provided in a matrix in respective regions where the scan lines and the signal lines intersect with each other. Further, the substrate 5300 in the display device is connected to a timing control circuit 5305 (also referred to as a controller or a controller IC) through a connection portion such as a flexible printed circuit (FPC).

In FIG. 14A, the first scan line driver circuit 5302, the second scan line driver circuit 5303, and the signal line driver circuit 5304 are provided over the same substrate 5300 as the pixel portion 5301. Accordingly, the number of components of a drive circuit which is provided outside and the like are reduced, so that reduction in cost can be achieved. In addition, in the case where a driver circuit is provided outside the substrate 5300, the number of the connections in the connection portion can be reduced by extending wirings, whereby improvement in reliability or increase in yield can be achieved.

Note that as an example, the timing control circuit 5305 supplies a first scan line driver circuit start signal (GSP1) and a first scan line driver circuit clock signal (GCK1) to the first scan line driver circuit 5302. Moreover, as an example, the timing control circuit 5305 supplies a second scan line driver circuit start signal (GSP2) (also referred to as a start pulse) and a second scan line driver circuit clock signal (GCK2) to the second scan line driver circuit 5303. The timing control circuit 5305 supplies a signal line driver circuit start signal (SSP), a signal line driver circuit clock signal (SCK), video signal data (DATA) (also simply referred to as a video signal), and a latch signal (LAT) to the signal line driver circuit 5304, as an example. Note that each clock signal may be a plurality of clock signals whose periods are different or may be supplied together with an inverted clock signal (CKB). Note that one of the first scan line driver circuit 5302 and the second scan line driver circuit 5303 can be omitted.

Figure 14B:
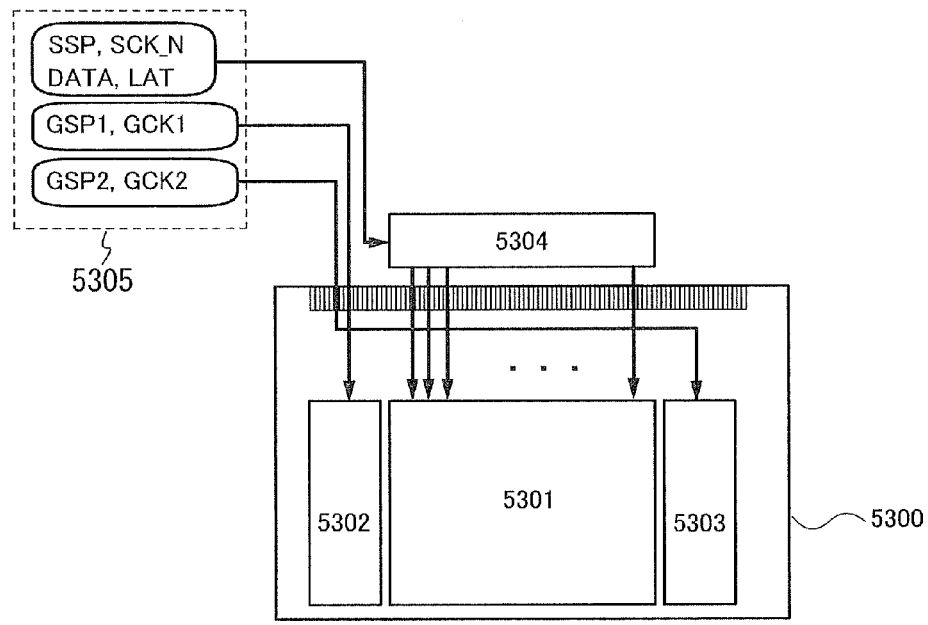

FIG. 14B shows a structure in which circuits with low driving frequency (e.g., the first scan line driver circuit 5302 and the second scan line driver circuit 5303) are formed over the same substrate 5300 as the pixel portion 5301 and the signal line driver circuit 5304 is formed over a substrate which is different from that of the pixel portion 5301. With this structure, a driver circuit formed over the substrate 5300 can be constituted by using thin film transistors with lower field-effect mobility as compared to that of a transistor formed using a single crystal semiconductor. Accordingly, increase in the size of the display device, reduction in the number of steps, reduction in cost, improvement in yield, or the like can be achieved.

Figure 15A:
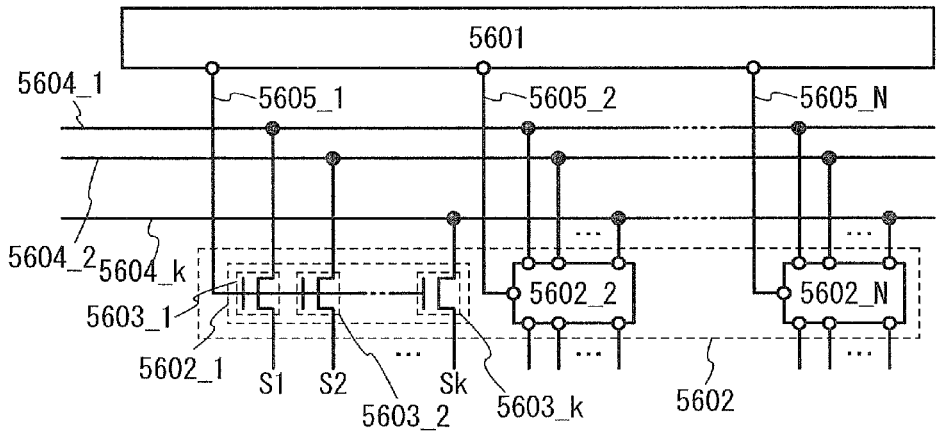
FIGS. 15A and 15B are a configuration and operation of a signal line driver circuit, respectively.
Figure 15B:
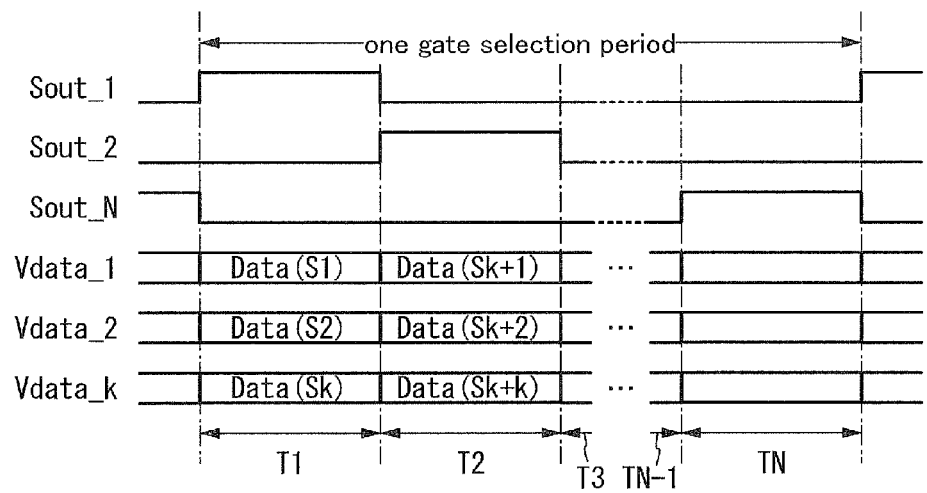

In addition, the thin film transistor described in any of Embodiments 1 to 7 is an n-channel TFT. In FIGS. 15A and 15B, an example of a structure and operation of a signal line driver circuit which is formed using an n-channel TFT is described as an example.

The signal line driver circuit includes a shift register 5601 and a switching circuit 5602. The switching circuit 5602 includes a plurality of switching circuits. The switching circuits 5602_1 to 5602_N(N is a natural number of 2 or more) each include a plurality of thin film transistors 5603_1 to 5603_k (k is a natural number of 2 or more). An example in which the thin film transistors 5603_1 to 5603_k are n-channel TFTs will be described.

A connection relation of the signal line driver circuit will be described by using the switching circuit 5602_1 as an example. First terminals of the thin film transistors 5603_1 to 5603_k are connected to wirings 5604_1 to 5604_k, respectively. Second terminals of the thin film transistors 5603_1 to 5603_k are connected to signal lines S1 to Sk, respectively. Gates of the thin film transistors 5603_1 to 5603_k are connected to a wiring 5605_1.

The shift register 5601 has a function of sequentially outputting an H level signal (also referred to as an H signal or a high power supply potential level) to the wirings 5605_1 to 5605_N and sequentially selecting the switching circuits 5602_1 to 5602_N.

The switching circuit 5602_1 has a function of controlling conduction between the wirings 5604_1 to 5604_k and the signal lines S1 to Sk (conduction between the first terminal and the second terminal), namely a function of controlling whether or not to supply potentials of the wirings 5604_1 to 5604_k to the signal lines S1 to Sk. In this manner, the switching circuit 5602_1 functions as a selector. Further, the thin film transistors 5603_1 to 5603_k each have a function of controlling conduction between the wirings 5604_1 to 5604_k and the signal lines S1 to Sk, namely a function of controlling whether or not to supply the potentials of the wirings 5604_1 to 5604_k to the signal lines S1 to Sk. In this manner, each of the thin film transistors 5603_1 to 5603_k functions as a switch.

Note that video signal data (DATA) is input to each of the wirings 5604_1 to 5604_k. The video signal data (DATA) is an analog signal corresponding to image data or image signals in many cases.

Next, operation of the signal line driver circuit in FIG. 15A will be described with reference to a timing chart in FIG. 15B. In FIG. 15B, an example of signals Sout_1 to Sout_N and signals Vdata_1 to Vdata_k is shown. The signals Sout_1 to Sout_N are examples of output signals of the shift register 5601, and the signals Vdata_1 to Vdata_k are examples of signals which are input to the wirings 5604_1 to 5604_k. Note that one operation period of the signal line driver circuit corresponds to one gate selection period in a display device. For example, one gate selection period is divided into periods T1 to TN. The periods T1 to TN are periods for writing video signal data (DATA) to the pixels which belong to a selected row.

Note that as for some components shown in some of the drawings and the like for this embodiment, signal waveform distortions or the like are exaggerated for purposes of clarity. Thus, this embodiment is not limited to such scales illustrated in the drawings.

In the periods T1 to TN, the shift register 5601 sequentially outputs H level signals to the wirings 5605_1 to 5605_N. For example, in the period T1, the shift register 5601 outputs an H level signal to the wiring 5605_1. Then, the thin film transistors 5603_1 to 5603_k are turned on, so that the wirings 5604_1 to 5604_k and the signal lines S1 to Sk are brought into conduction. In this case, Data (S1) to Data (Sk) are input to the wirings 5604_1 to 5604_k, respectively. The Data (S1) to Data (Sk) are input to pixels in a selected row in a first to k-th columns through the thin film transistors 5603_1 to 5603_k, respectively. Thus, in the periods T1 to TN, video signal data (DATA) is sequentially written to the pixels in the selected row of every k columns.

By writing video signal data (DATA) to pixels of every plurality of columns, the number of video signal data (DATA) or the number of wirings can be reduced. Thus, connections to an external circuit can be reduced. By writing video signals to pixels of every plurality of columns, writing time can be extended and insufficient writing of video signals can be prevented.

Note that as the shift register 5601 and the switching circuit 5602, a circuit including the thin film transistor described in any of Embodiments 1 to 7 can be used. In this case, all the transistors included in the shift register 5601 can be n-channel transistors or all the transistors included in the shift register 5601 can be p-channel transistors.

An example of a shift register which is used for part of a scan line driver circuit and/or a signal line driver circuit will be described.

The scan line driver circuit includes a shift register. The scan line driver circuit may also include a level shifter, a buffer, or the like in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

Further, an example of a shift register which is used for part of a scan line driver circuit and/or a signal line driver circuit will be described with reference to FIGS. 16A to 16C and FIGS. 17A and 17B.

Figure 16A:
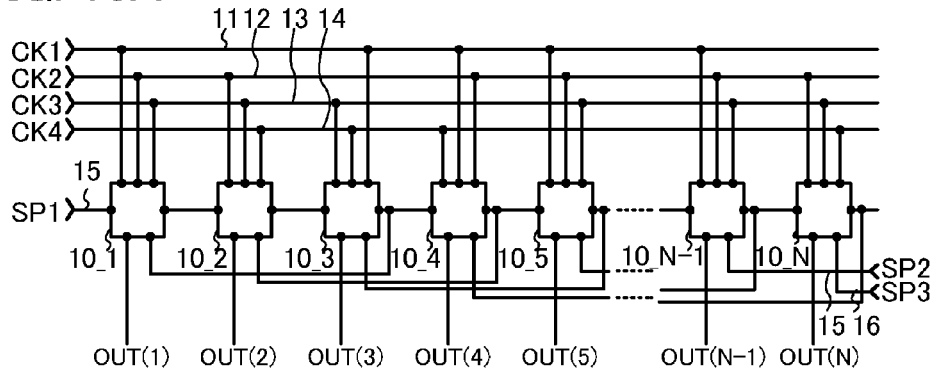
FIGS. 16A to 16C are views each illustrating a configuration of a shift register.

The shift register includes first to N-th pulse output circuits 10_1 to 10_N(N is a natural number of 3 or more) (see FIG. 16A). A first clock signal CK1 from a first wiring 11, a second clock signal CK2 from a second wiring 12, a third clock signal CK3 from a third wiring 13, and a fourth clock signal CK4 from a fourth wiring 14 are supplied to the first to N-th pulse output circuits 10_1 to 10_N of the shift register shown in FIG. 16A. A start pulse SP 1 (a first start pulse) from a fifth wiring 15 is input to the first pulse output circuit 10_1. A signal from a pulse output circuit in the previous stage 10_(n−1) (referred to as a previous stage signal OUT(n−1)) (n is a natural number of more than or equal to 2 and lower than or equal to N) is input to the n-th pulse output circuit in the second stage or its subsequent stages 10_n. A signal from the third pulse output circuit 10_3 which is two stages after the first pulse output circuit 10_1 is input to the first pulse output circuit 10_1. In a similar manner, a signal from the (n+2)-th pulse output circuit 10_(n+2) which is two stages after the n-th pulse output circuit 10_n (referred to as a next stage signal OUT(n+2)) is input to the n-th pulse output circuit in the second stage or its subsequent stages. Therefore, the pulse output circuits in the respective stages output first output signals (OUT(1)(SR) to OUT(N)(SR)) to be input to the pulse output circuit of the subsequent stage and/or the pulse output circuit in the stage before the preceding stage and second output signals (OUT(1) to OUT(N)) to be input to another circuit or the like. Note that as shown in FIG. 16A, the next stage signal OUT(n+2) is not input to last two stages of the shift register; therefore, as an example, a second start pulse SP2 and a third start pulse SP3 may be separately input to the last two stages of the shift register.

Note that a clock signal (CK) is a signal which oscillates between an H level and an L level (referred to as an L signal or a low power supply potential level) at regular intervals. The first to the fourth clock signals (CK1) to (CK4) are delayed by ¼ period sequentially. In this embodiment, by using the first to fourth clock signals (CK1) to (CK4), control or the like of driving of a pulse output circuit is performed. Note that the clock signal is also called GCK or SCK in accordance with an driver circuit to which the clock signal is input; however, description is made using CK as the clock signal.

A first input terminal 21, a second input terminal 22, and a third input terminal 23 are electrically connected to any of the first to fourth wirings 11 to 14. For example, in FIG. 16A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Figure 16B:
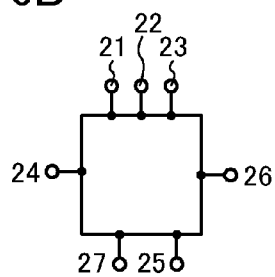

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 16B). In the first pulse output circuit 10_1, the first clock signal CK1 is input to the first input terminal 21; the second clock signal CK2 is input to the second input terminal 22; the third clock signal CK3 is input to the third input terminal 23; the start pulse is input to the fourth input terminal 24; the next stage signal OUT (3) is input to the fifth input terminal 25; the first output signal OUT (1) (SR) is output from the first output terminal 26; and the second output signal OUT (1) is output from the second output terminal 27.

In the first to N-th pulse output circuits 10_1 to 10_N, the thin film transistor (TFT) having four terminals described in the above embodiments can be used in addition to a thin film transistor having three terminals. Note that in this specification, when a thin film transistor has two gate electrodes with a semiconductor layer therebetween, the gate electrode below the semiconductor layer is called a lower gate electrode and the gate electrode above the semiconductor layer is called an upper gate electrode.

When an oxide semiconductor is used for a semiconductor layer including a channel formation region in a thin film transistor, the threshold voltage sometimes shifts in the positive or negative direction depending on a manufacturing process. Therefore, the thin film transistor in which an oxide semiconductor is used for a semiconductor layer including a channel formation region preferably has a structure with which the threshold voltage can be controlled. The threshold voltage of a thin film transistor having four terminals can be controlled to be a desired value by providing the gate electrodes over and under the channel formation region of the thin film transistor with gate insulating films therebetween and controlling a potential of the upper gate electrode and/or the lower gate electrode.

Next, an example of a specific circuit configuration of the pulse output circuit will be described with reference to FIG. 16C.

The first pulse output circuit 10_1 includes a first to thirteenth transistors 31 to 43. Signals or power supply potentials are supplied to the first to thirteenth transistors 31 to 43 from a power supply line 51 to which a first high power supply potential VDD is supplied, a power supply line 52 to which a second high power supply potential VCC is supplied, and a power supply line 53 to which a third low power supply potential VSS is supplied, in addition to the above-described first to fifth input terminals 21 to 25 and the first and second output terminals 26 and 27. Here, a magnitude relation of a power supply potential of each power supply line in FIG. 16C is as follows: the first power supply potential VDD is higher than or equal to the second power supply potential VCC and the second power supply potential VCC is higher than the third power supply potential VSS. Although the first to fourth clock signals (CK1) to (CK4) are signals which alternate between an H level signal and an L level signal at regular intervals, a potential is VDD when the clock signal is at the H level, and a potential is VSS when the clock signal is at the L level. Note that when the potential VDD of the power supply line 51 is set to be higher than the potential VCC of the power supply line 52, a potential applied to the gate electrode of the transistor can be reduced without adversely affecting the operation; thus, the shift of the threshold value of the transistor can be reduced and deterioration can be suppressed. A transistor having four terminals is preferably used as each of the first transistor 31 and the sixth to ninth transistors 36 to 39 among the first to thirteenth transistors 31 to 43. The first transistor 31 and the sixth to ninth transistors 36 to 39 each need to operate so that potentials of a gate electrode of the transistor 33 and the gate electrode of the transistor 40 are switched with a control signal, and can further reduce a malfunction of the pulse output circuit since response to the control signal input to the gate electrode is fast (the rise of on-state current is steep). Thus, by using the transistor having four terminals, the threshold voltage can be controlled, and a malfunction of the pulse output circuit can be further reduced.

Note that a thin film transistor is an element having at least three terminals of a gate, a drain, and a source. The thin film transistor has a semiconductor region (also referred to as a channel formation region) including a channel region formed in a region overlapping with the gate. Current which flows between the drain and the source through the channel region can be controlled by control of a potential of the gate. Here, since the source and the drain of the thin film transistor change depending on the structure, the operating condition, and the like of the thin film transistor, it is difficult to define which is a source or a drain. Thus, regions functioning as a source and a drain are not called a source and a drain in some cases. In that case, for example, such regions might be referred to as a first terminal and a second terminal.

Figure 16C:
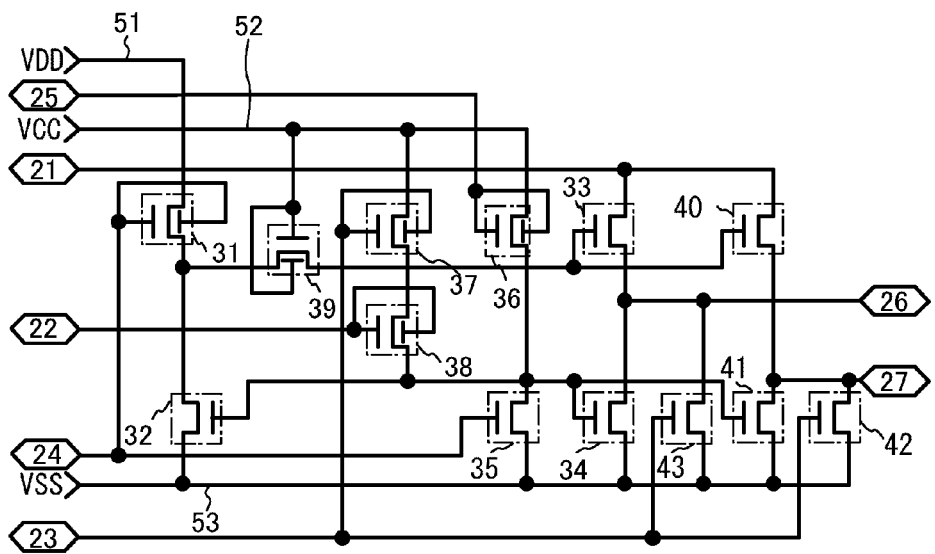

In FIG. 16C, a first terminal of the first transistor 31 is electrically connected to the power supply line 51, a second terminal of the first transistor 31 is electrically connected to a first terminal of the ninth transistor 39, and a gate electrode (a first gate electrode and a second gate electrode) of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode (a first gate electrode and a second gate electrode) of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode (a first gate electrode and a second gate electrode) of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode (a first gate electrode and a second gate electrode) of the eighth transistor 38 is electrically connected to the second input terminal 22. A first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and a gate electrode of the tenth transistor 40, and a gate electrode (a first gate electrode and a second gate electrode) of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and a gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode (a first gate electrode and a second gate electrode) of the twelfth transistor 42 is electrically connected to the gate electrode of the seventh transistor 37. A first terminal of the thirteenth transistor 43 is electrically connected to the power supply line 53, a second terminal of the thirteenth transistor 43 is electrically connected to the first output terminal 26, and a gate electrode (a first gate electrode and a second gate electrode) of the thirteenth transistor 43 is electrically connected to the gate electrode of the seventh transistor 37.

In FIG. 16C, a connection point of the gate electrode of the third transistor 33, the gate electrode of the tenth transistor 40, and the second terminal of the ninth transistor 39 is referred to as a node A. In addition, a connection point of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is referred to as a node B.

Figure 17A:
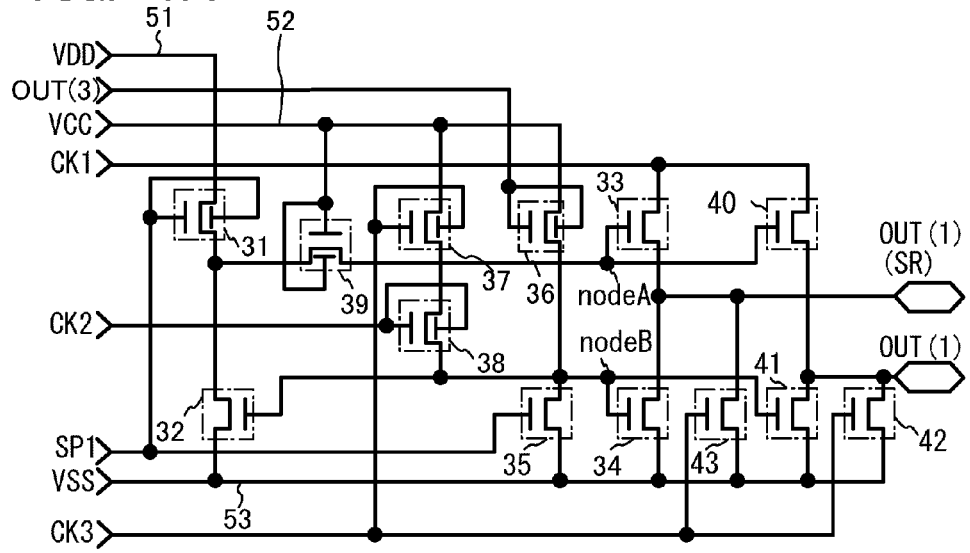
FIGS. 17A and 17B are a configuration and operation of a shift register, respectively.

Note that in FIG. 16C and FIG. 17A, a capacitor for performing bootstrap operation by making the node A be in a floating state may be additionally provided. Further, a capacitor having one electrode electrically connected to the node B may be additionally provided in order to hold a potential of the node B.

Figure 17B:
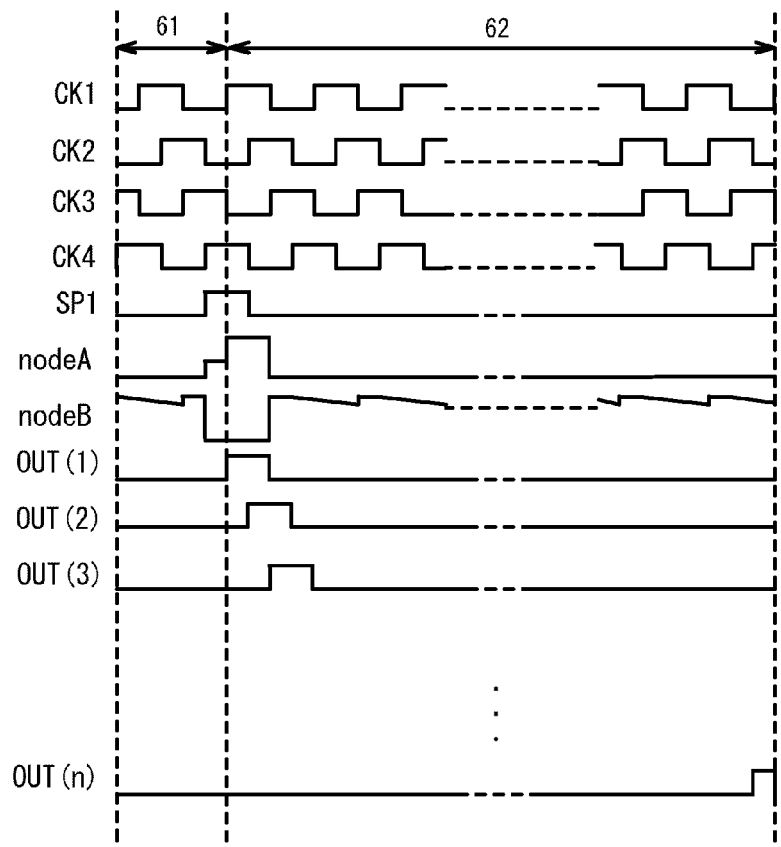

Here, FIG. 17B shows a timing chart of a shift register including the plurality of pulse output circuits shown in FIG. 17A. Note that when the shift register is a scan line driver circuit, in FIG. 17B, a period 61 is a vertical retrace period and a period 62 is a gate selection period.

Note that as shown in FIG. 17A, by providing of the ninth transistor 39 whose gate electrode is supplied with the second power supply potential VCC, advantages described below are obtained before and after bootstrap operation.

Without the ninth transistor 39 whose gate electrode is supplied with the second potential VCC, if the potential of the node A is raised by the bootstrap operation, the potential of a source which is the second terminal of the first transistor 31 increases to a value higher than the first power supply potential VDD. Then, the first terminal of the first transistor 31, namely the power supply line 51, comes to serve as the source thereof. Therefore, in the first transistor 31, large bias voltage is applied and thus significant stress is applied between the gate and the source and between the gate and the drain, which can cause deterioration in the transistor. By providing of the ninth transistor 39 whose gate electrode is supplied with the second power supply potential VCC, the potential of the node A is raised by the bootstrap operation, but at the same time, an increase in the potential of the second terminal of the first transistor 31 can be prevented. In other words, by providing of the ninth transistor 39, negative bias voltage applied between the gate and the source of the first transistor 31 can be reduced. Accordingly, with a circuit configuration in this embodiment, negative bias voltage applied between the gate and the source of the first transistor 31 can be reduced, so that deterioration in the first transistor 31, which is due to stress, can further be restrained.

Note that the ninth transistor 39 is provided so as to be connected, between the second terminal of the first transistor 31 and the gate of the third transistor 33 through the first terminal and the second terminal thereof. When a shift register including a plurality of the pulse output circuits shown in this embodiment is used, in a signal line driver circuit having more stages than a scan line driver circuit, the ninth transistor 39 may be omitted, and thus, the number of transistors can be reduced.

When an oxide semiconductor is used for semiconductor layers of the first to thirteenth transistors 31 to 43, off-current of the thin film transistors can be reduced, on-current and field effect mobility can be increased, and the degree of deterioration can be reduced; thus, malfunction in a circuit can be reduced. The degree of deterioration of the transistors formed using an oxide semiconductor, which is caused by application of a high potential to the gate electrode, is small in comparison with that of the transistor formed using amorphous silicon. Therefore, even when the first power supply potential VDD is supplied to a power supply line to which the second power supply potential VCC is supplied, a similar operation can be performed, and the number of power supply lines which are led in a circuit an be reduced, so that the circuit can be miniaturized.

Note that even if a wiring connection is changed so that the clock signal which is supplied to the gate electrode (the first gate electrode and the second gate electrode) of the seventh transistor 37 through the third input terminal 23 and the clock signal which is supplied to the gate electrode (the first gate electrode and the second gate electrode) of the eighth transistor 38 through the second input terminal 22 are the clock signal which is supplied to the gate electrode (the first gate electrode and the second gate electrode) of the seventh transistor 37 through the second input terminal 22 and the clock signal which is supplied to the gate electrode (the first gate electrode and the second gate electrode) of the eighth transistor 38 through the third input terminal 23, respectively, a similar operation effect can be obtained. Note that in the shift register shown in FIG. 17A, after the seventh transistor 37 and the eighth transistor 38 are both in an on-state, the seventh transistor 37 is turned off and the eighth transistor 38 is still in an on-state, and then the seventh transistor 37 is still off and the eighth transistor 38 is turned off. Therefore, a decrease in the potential of the node B, which is caused by a decrease in the potentials of the second input terminal 22 and the third input terminal 23, occurs twice because of a decrease in the potential of the gate electrode of the seventh transistor 37 and a decrease in the potential of the gate electrode of the eighth transistor 38. On the other hand, in the shift register shown in FIG. 17A, the number of decreases in the potential of the node B, which is caused by a decrease in the potentials of the second input terminal 22 and the third input terminal 23, can be reduced to one time which takes place when the potential of the gate electrode of the eighth transistor 38 is decreased. The number of decreases in the potential of the node B can be decreased by the following manner: after the seventh transistor 37 and the eighth transistor 38 are both in an on-state, the seventh transistor 37 is still in an on-state and the eighth transistor 38 is turned off, and then the seventh transistor 37 is turned off and the eighth transistor 38 is still off. Therefore, the connection relation, that is, the clock signal CK3 is supplied from the third input terminal 23 to the gate electrode (the first gate electrode and the second gate electrode) of the seventh transistor 37 and the clock signal CK2 is supplied from the second input terminal 22 to the gate electrode (the first gate electrode and the second gate electrode) of the eighth transistor 38, is preferable. That is because the number of times of the change in the potential of the node B can be reduced, whereby the noise can be decreased.

In this way, in a period during which the potentials of the first output terminal 26 and the second output terminal 27 are held at the L level, an H level signal is regularly supplied to the node B; therefore, malfunction of the pulse output circuit can be suppressed.

(Embodiment 12)

When a thin film transistor is manufactured and used for a pixel portion and further for a driver circuit, a semiconductor device having a display function (also referred to as a display device) can be manufactured. Furthermore, when part or whole of a driver circuit using a thin film transistor is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. The display device also relates to an element substrate, which corresponds to one mode before the display element is completed in a manufacturing process of the display device, and the element substrate is provided with means for supplying current to the display element in each of a plurality of pixels. Specifically, the element substrate may be in a state after only a pixel electrode (also referred to as a pixel electrode layer) of the display element is formed, a state after a conductive film to serve as a pixel electrode is formed and before the conductive film is etched to form the pixel electrode, or any of other states.

Note that a display device in this specification means an image display device, a display device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by a chip on glass (COG) method.

The appearance and a cross section of a liquid crystal display panel, which is an embodiment of a semiconductor device, will be described with reference to FIGS. 10A1, 10A2 and 10B. FIGS. 10A1 and 10A2 are each a plan view of a panel in which thin film transistors 4010 and 4011 and a liquid crystal element 4013 are sealed between a first substrate 4001 and a second substrate 4006 with a sealant 4005. FIG. 10B is a cross-sectional view taken along line M-N of FIGS. 10A1 and 10A2.

The sealant 4005 is provided to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 10A1 illustrates an example of mounting the signal line driver circuit 4003 by a COG method, and FIG. 10A2 illustrates an example of mounting the signal line driver circuit 4003 by a TAB method.

The pixel portion 4002 and the scan line driver circuit 4004 provided over the first substrate 4001 each include a plurality of thin film transistors. FIG. 10B illustrates the thin film transistor 4010 included in the pixel portion 4002 and the thin film transistor 4011 included in the scan line driver circuit 4004. An oxide insulating layer 4041, a protective insulating layer 4020, and an insulating layer 4021 are provided over the thin film transistors 4010 and 4011 in that order.

As the thin film transistors 4010 and 4011, the highly reliable thin film transistor including an oxide semiconductor layer which is described in any of Embodiments 1 to 7 can be employed. The thin film transistors 410, 440, 449, 460, 490, and 492, which are described in Embodiments 1 to 7, can be given as examples of the thin film transistor 4011 for a driver circuit. The thin film transistors 420, 451, 470, and 493, which are described in Embodiments 1 to 7, can be given as examples of the thin film transistor 4010 for a pixel. In this embodiment, the thin film transistors 4010 and 4011 are n-channel thin film transistors.

Over the insulating layer 4021, a conductive layer 4040 is provided in a portion overlapped with a channel formation region of the oxide semiconductor layer of the thin film transistor 4011 for a driver circuit. In addition, by providing the conductive layer 4040 in a portion overlapped with the channel formation region of the oxide semiconductor layer, the amount of shift in threshold voltage of the thin film transistor 4011 between before and after the BT test can be reduced. The conductive layer 4040 may have a potential which is the same as or different from that of a gate electrode layer of the thin film transistor 4011, and can function as a second gate electrode layer. The conductive layer 4040 may be in a GND state, a state in which a potential of 0 V is applied, or a floating state.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an oxide insulating layer 4032 and an oxide insulating layer 4033, respectively, each of which functions as an alignment film. The liquid crystal layer 4008 is sandwiched between the pixel electrode layer 4030 and the counter electrode layer 4031 with the oxide insulating layers 4032 and 4033 interposed therebetween.

Note that a light-transmitting substrate, which is made of glass, ceramic, or plastic, can be used for the first substrate 4001 and the second substrate 4006. As plastic, a fiberglass-reinforced plastics (FRP) plate, a polyvinyl fluoride (PVF) film, a polyester film, or an acrylic resin film can be used.

A spacer 4035 is a columnar obtained by selective etching of an insulating film and is provided in order to control the distance (a cell gap) between the pixel electrode layer 4030 and the counter electrode layer 4031. Note that a spherical spacer may be used for the spacer 4035. The counter electrode layer 4031 is electrically connected to a common potential line provided over the same substrate as the thin film transistor 4010. With the use of the common connection portion, the counter electrode layer 4031 can be electrically connected to the common potential line through conductive particles provided between the pair of substrates. Note that the conductive particles are contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at 5 wt % or more is used for the liquid crystal layer 4008 in order to improve the temperature range. The liquid crystal composition which includes a liquid crystal showing a blue phase and a chiral agent has a small response time of 1 msec or less, has optical isotropy, which makes the alignment process unneeded, and has a small viewing angle dependence.

The liquid crystal display device of this embodiment can also be applied to a transmissive liquid crystal display device or a transflective liquid crystal display device.

In this embodiment, an example of the liquid crystal display device will be described in which a polarizing plate is provided on the outer surface of the substrate (on the viewer side) and a coloring layer (also referred to as a color filter) and an electrode layer used for a display element are provided on the inner surface of the substrate in that order; however, the polarizing plate may be provided on the inner surface of the substrate. The stack structure of the polarizing plate and the coloring layer is not limited to that described in this embodiment and may be set as appropriate depending on materials of the polarizing plate and the coloring layer or conditions of manufacturing steps.

In the thin film transistor 4011, the oxide insulating layer 4041 is formed in contact with a semiconductor layer including a channel formation region. The oxide insulating layer 4041 may be formed, for example, using a material and a method similar to those of the oxide insulating layer 416 described in Embodiment 1. Here, a silicon oxide film is formed using a sputtering method in the similar manner to that in Embodiment 1, as the oxide insulating layer 4041.

Further, the protective insulating layer 4020 is formed over the oxide insulating layer 4041. The protective insulating layer 4020 can be formed using a material and a method which are similar to those of the protective insulating layer 403 described in Embodiment 1. Here, a silicon nitride film is formed using a PCVD method, as the protective insulating layer 4020.

In order to reduce the surface roughness of the thin film transistor, the insulating layer 4021 is formed over the protective insulating layer 4020, as the planarizing insulating film. The insulating layer 4021 may be formed using a material and a method similar to those of the planarizing insulating layer 404 described in Embodiment 1, and an organic material having heat resistance such as polyimide, an acrylic resin, a benzocyclobutene resin, polyamide, or an epoxy resin can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed of these materials.

There is no particular limitation on the method for forming the insulating layer 4021, and the insulating layer 4021 can be formed, depending on the material, by a method such as a sputtering method, an SOG method, spin coating, dip coating, spray coating, or a droplet discharge method (such as an inkjet method, screen printing, offset printing, or the like), or a tool (equipment) such as a doctor knife, a roll coater, a curtain coater, or a knife coater. The baking step of the insulating layer 4021 also serves as the annealing step of the semiconductor layer, whereby a semiconductor device can be manufactured efficiently.

The pixel electrode layer 4030 and the counter electrode layer 4031 can be made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the pixel electrode layer 4030 and the counter electrode layer 4031. The pixel electrode made of the conductive composition preferably has a sheet resistance of 10000 ohms per square or less and a transmittance of 70% or more at a wavelength of 550 nm. Furthermore, the resistivity of the conductive high molecule contained in the conductive composition is preferably 0.1 Ω·cm or less.

As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

In addition, a variety of signals and potentials are supplied to the signal line driver circuit 4003 that is formed separately, and the scan line driver circuit 4004 or the pixel portion 4002 from an FPC 4018.

A connection terminal electrode 4015 is formed from the same conductive film as the pixel electrode layer 4030 included in the liquid crystal element 4013, and a terminal electrode 4016 is formed from the same conductive film as a source and drain electrode layers of the thin film transistor 4011.

The connection terminal electrode 4015 is electrically connected to a terminal included in the FPC 4018 through an anisotropic conductive film 4019.

Note that FIGS. 10A1, 10A2, and 10B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 19:
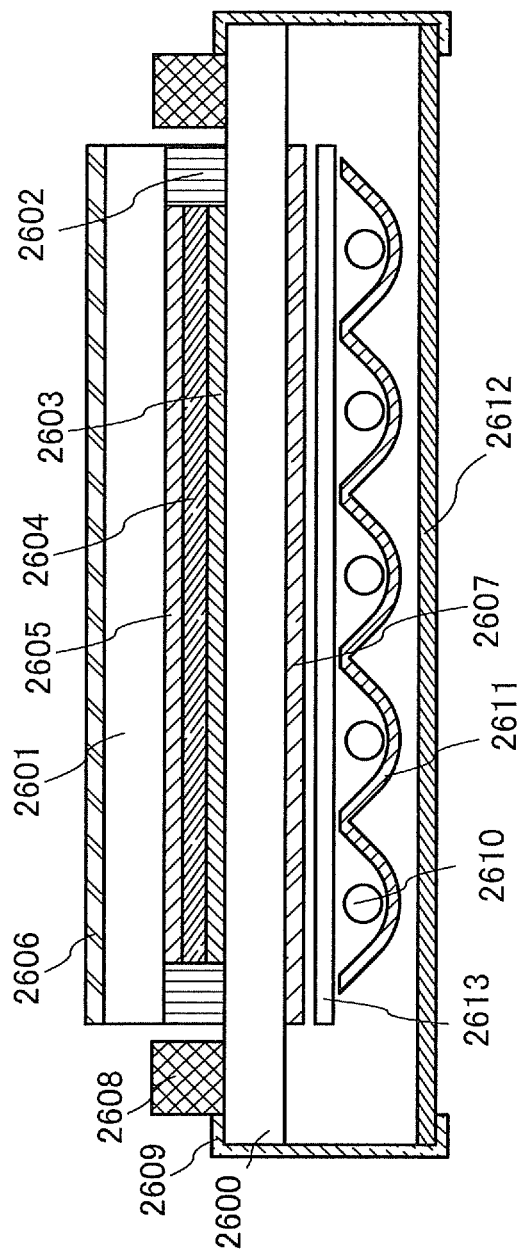
FIG. 19 is a view illustrating a semiconductor device.

FIG. 19 illustrates an example of a liquid crystal display module which is formed as a semiconductor device by using a TFT substrate 2600 manufactured according to a manufacturing method disclosed in this specification.

FIG. 19 illustrates an example of a liquid crystal display module, in which the TFT substrate 2600 and a counter substrate 2601 are bonded to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, or the like can be used.

Through the above process, a highly reliable liquid crystal display panel as a semiconductor device can be manufactured.

This embodiment can be implemented in appropriate combination with the structures described in the other embodiments.

(Embodiment 13)

An example of electronic paper will be described as a semiconductor device of an embodiment of the present invention.

The thin film transistor described in any of Embodiments 1 to 7 can be used for electronic paper in which electronic ink is driven by an element electrically connected to a switching element. The electronic paper is also referred to as an electrophoretic display device (electrophoretic display) and is advantageous in that it has the same level of readability as plain paper, it has lower power consumption than other display devices, and it can be made thin and lightweight.

Electrophoretic displays can have a variety of modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. An electrophoretic display device does not need to use a polarizing plate and a counter substrate, which are required in a liquid crystal display device, so that the thickness and weight of the electrophoretic display device can be reduced.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules is arranged as appropriate over an active matrix substrate so as to be interposed between two electrodes, an active matrix display device can be completed, and display can be performed by application of an electric field to the microcapsules. For example, the active matrix substrate obtained by the thin film transistors described in any of Embodiments 1 to 7 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Figure 18:
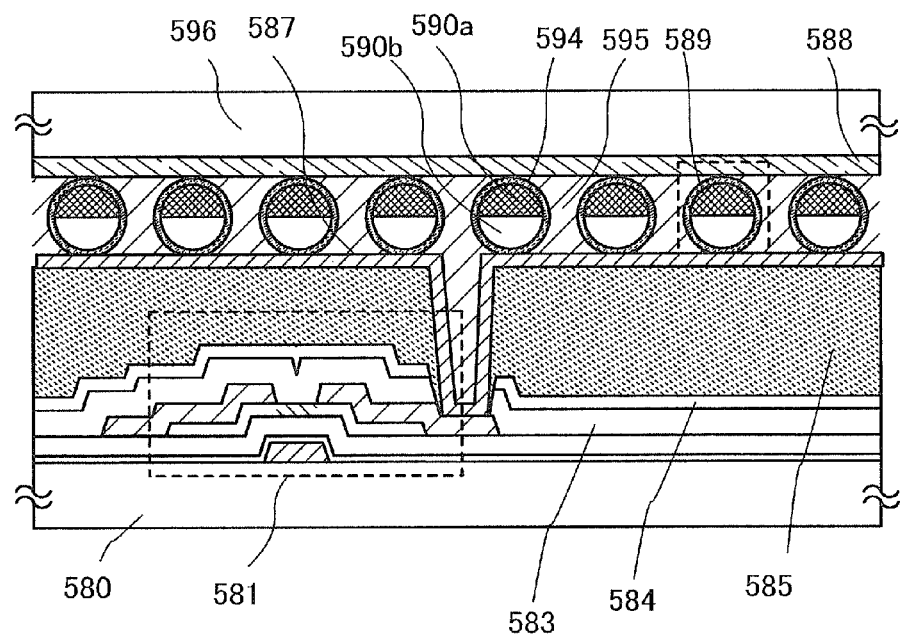
FIG. 18 is a view illustrating a semiconductor device.

FIG. 18 illustrates active matrix electronic paper as an example of a semiconductor device. A thin film transistor 581 can be manufactured in a manner similar to that of the thin film transistor described in Embodiment 1, which is a highly reliable thin film transistor including an oxide semiconductor layer. The thin film transistor described in any of Embodiments 2 to 7 can also be used as the thin film transistor 581.

The electronic paper in FIG. 18 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a thin film transistor with a bottom gate structure and is covered with insulating layers 583 and 584 which are in contact with a semiconductor layer. A source or drain electrode layer of the thin film transistor 581 is in contact with a first electrode layer 587 through an opening formed in the insulating layers 583 and 584 and an insulating layer 585, whereby the thin film transistor 581 is electrically connected to the first electrode layer 587. Between the first electrode layer 587 and a second electrode layer 588 formed on a substrate 596, spherical particles 589 each having a black region 590*a*, a white region 590*b*, and a cavity 594 around the regions which is filled with liquid are provided. A space around the spherical particles 589 is filled with a filler 595 such as a resin. The first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between a pair of substrates.

Instead of the twisting ball, an electrophoretic element can also be used. A microcapsule having a diameter of approximately 10 µm to 200 µm in which transparent liquid, positively-charged white microparticles, and negatively-charged black microparticles are encapsulated, is used. In the microcapsule which is provided between the first electrode layer and the second electrode layer, when an electric field is applied between the first electrode layer and the second electrode layer, the white microparticles and the black microparticles move in opposite directions to each other, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through the above process, highly reliable electronic paper as a semiconductor device can be manufactured.

This embodiment can be implemented in appropriate combination with the structures described in the other embodiments.

(Embodiment 14)

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) recombine, so that the light-emitting organic compound is excited. The light-emitting organic compound returns to a ground state from the excited state, thereby emitting light. With such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission which utilizes a donor level and an acceptor level. An inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 12:
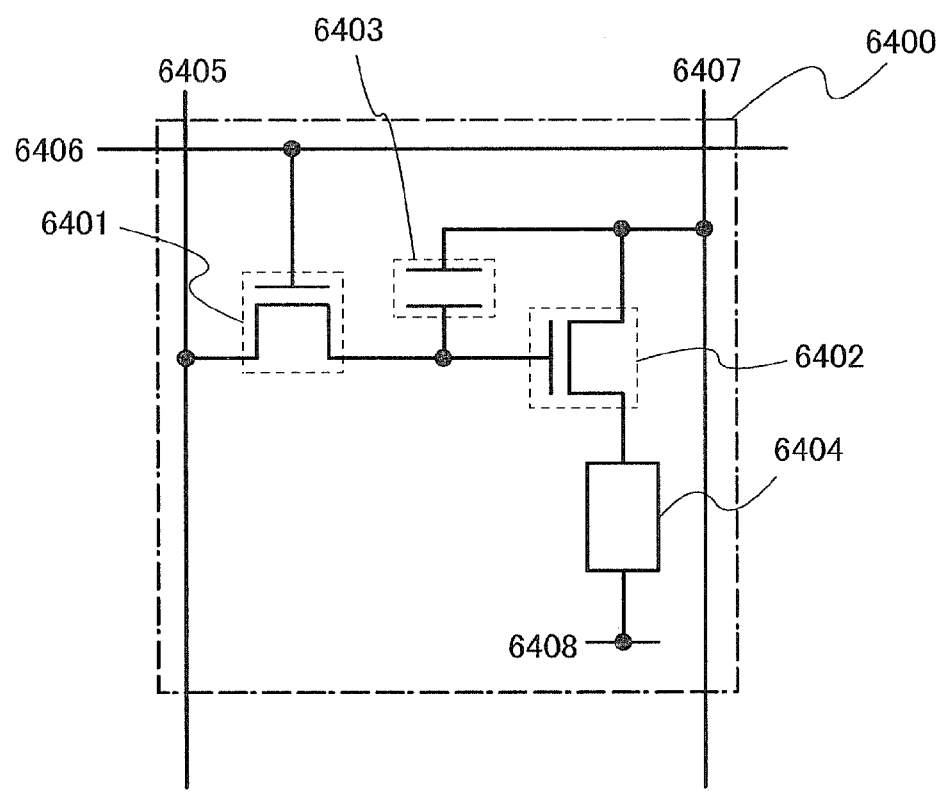
FIG. 12 is a view illustrating an equivalent circuit of a pixel in a semiconductor device.

FIG. 12 illustrates an example of a pixel structure as an example of a semiconductor device, which can be driven by a digital time grayscale method.

The structure and operation of a pixel which can be driven by a digital time grayscale method will be described. An example is described here in which one pixel includes two n-channel transistors using an oxide semiconductor layer in a channel formation region.

A pixel 6400 includes a switching transistor 6401, a driver transistor 6402, a light-emitting element 6404, and a capacitor 6403. A gate electrode of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate electrode of the driver transistor 6402. The gate electrode of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line formed over one substrate.

Note that the second electrode (common electrode 6408) of the light-emitting element 6404 is set to a low power supply potential. The low power supply potential is lower than a high power supply potential which is supplied to the power supply line 6407 when the high power supply potential set to the power supply line 6407 is a reference. For example, GND and 0 V can be given as the low power supply potential. The potential difference between the high power supply potential and the low power supply potential is applied to the light-emitting element 6404 so that current flows through the light-emitting element 6404, whereby the light-emitting element 6404 emits light. Thus, each potential is set so that the potential difference between the high power supply potential and the low power supply potential is greater than or equal to forward threshold voltage of the light-emitting element 6404.

When the gate capacitance of the driver transistor 6402 is used as a substitute for the capacitor 6403, the capacitor 6403 can be omitted. The gate capacitance of the driver transistor 6402 may be formed between a channel formation region and a gate electrode.

Here, in the case of using a voltage-input voltage driving method, a video signal is input to the gate electrode of the driver transistor 6402 to make the driver transistor 6402 sufficiently turn on or off. That is, the driver transistor 6402 operates in a linear region, and thus, voltage higher than the voltage of the power supply line 6407 is applied to the gate electrode of the driver transistor 6402. Note that voltage greater than or equal to (power supply line voltage+$V_{th}$ of the driver transistor 6402) is applied to the signal line 6405.

In the case of using an analog grayscale method instead of the digital time grayscale method, the same pixel structure as in FIG. 12 can be employed by inputting signals in a different way.

In the case of using the analog grayscale method, voltage greater than or equal to (forward voltage of the light-emitting element 6404+$V_{th}$ of the driver transistor 6402) is applied to the gate electrode of the driver transistor 6402. The forward voltage of the light-emitting element 6404 refers to voltage at which a desired luminance is obtained, and includes at least forward threshold voltage. By inputting a video signal to enable the driver transistor 6402 to operate in a saturation region, current can be supplied to the light-emitting element 6404. In order that the driver transistor 6402 can operate in the saturation region, the potential of the power supply line 6407 is higher than a gate potential of the driver transistor 6402. Since the video signal is an analog signal, current in accordance with the video signal flows in the light-emitting element 6404, and the analog grayscale method can be performed.

Note that the pixel structure is not limited to that illustrated in FIG. 12. For example, the pixel illustrated in FIG. 12 can further include a switch, a resistor, a capacitor, a transistor, a logic circuit, or the like.

Next, structures of the light-emitting element will be described with reference to FIGS. 13A to 13C. Here, a cross-sectional structure of a pixel will be described by taking an n-channel driving TFT as an example. A driving TFT 7001, a driving TFT 7011, and a driving TFT 7021 used for semiconductor devices illustrated in FIGS. 13A to 13C can be manufactured in a manner similar to that of the thin film transistor described in any of Embodiments 1 to 7 and are highly reliable thin film transistors each including an oxide semiconductor layer.

Each thin film transistor and each light-emitting element are formed over a substrate. In order to extract light emitted from the light-emitting element, at least one of an anode and a cathode may transmit light. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel structure illustrated in FIG. 12 can be applied to a light-emitting element having any of these emission structures.

A light-emitting element having a bottom emission structure will be described with reference to FIG. 13A.

FIG. 13A is a cross-sectional view of a pixel in the case where the TFT 7011 is of an n-type and light is emitted from a light-emitting element 7012 to a cathode 7013 side. In FIG. 13A, the cathode 7013 of the light-emitting element 7012 is formed over a light-transmitting conductive film 7017 which is electrically connected to the TFT 7011, and a light-emitting layer 7014 and an anode 7015 are stacked in that order over the cathode 7013. Note that the light-transmitting conductive film 7017 is electrically connected to a drain electrode layer of the TFT 7011 through a contact hole formed in an oxide insulating layer 7031, an insulating layer 7032, and a protective insulating layer 7035.

As the light-transmitting conductive film 7017, a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used.

The cathode 7013 can be formed using various materials, and it is preferable that a material having a low work function, for example, an alkali metal such as Li or Cs, an alkaline-earth metal such as Mg, Ca, or Sr, an alloy containing any of these (Mg:Ag, Al:Li, or the like), a rare-earth metal such as Yb or Er, or the like be used. In FIG. 13A, the thickness of the cathode 7013 is approximately the thickness that transmits light (preferably, approximately 5 nm to 30 nm). For example, an aluminum film having a thickness of 20 nm is used for the cathode 7013.

Note that the light-transmitting conductive film and the aluminum film may be stacked and selectively etched to form the light-transmitting conductive film 7017 and the cathode 7013; in this case, the light-transmitting conductive film 7017 and the cathode 7013 can be etched with the use of the same mask.

The peripheral portion of the cathode 7013 is covered with a partition 7019. The partition 7019 is formed using an organic resin film such as polyimide, an acrylic resin, polyamide, or an epoxy resin, an inorganic insulating film, or organic polysiloxane. It is particularly preferable that the partition 7019 be formed using a photosensitive resin material to have an opening over the cathode 7013 so that a sidewall of the opening is formed as an inclined surface with continuous curvature. In the case where a photosensitive resin material is used for the partition 7019, a step of forming a resist mask can be omitted.

The light-emitting layer 7014 formed over the cathode 7013 and the partition 7019 may be formed as a single layer or a plurality of layers stacked. When the light-emitting layer 7014 is formed as a plurality of layers, the light-emitting layer 7014 is formed by stacking an electron-injection layer, an electron-transport layer, a light-emitting layer, a hole-transport layer, and a hole-injection layer in that order over the cathode 7013. Note that not all of these layers need to be provided.

The stacking order is not limited to the above stacking order, and a hole-injection layer, a hole-transport layer, a light-emitting layer, an electron-transport layer, and an electron-injection layer may be stacked in that order over the cathode 7013. However, when power consumption is compared, an electron-injection layer, an electron-transport layer, a light-emitting layer, a hole-transport layer, and a hole-injection layer are preferably stacked in that order over the cathode 7013 because of lower power consumption.

As the anode 7015 formed over the light-emitting layer 7014, various materials can be employed, and a material having a high work function such as titanium nitride, ZrN, Ti, W, Ni, Pt, or Cr; or a light-transmitting conductive material such as ITO, IZO (indium oxide zinc oxide), or ZnO is preferably used for example. As a light-blocking film 7016 over the anode 7015, for example, a metal which blocks light, a metal which reflects light, or the like is used. In this embodiment, an ITO film is used for the anode 7015, and a Ti film is used for the light-blocking film 7016.

The light-emitting element 7012 corresponds to a region where the light-emitting layer 7014 is sandwiched between the cathode 7013 and the anode 7015. In the case of the element structure illustrated in FIG. 13A, light is emitted from the light-emitting element 7012 to the cathode 7013 side as indicated by arrows.

Note that an example in which a light-transmitting conductive film is used as a gate electrode layer is illustrated in FIG. 13A, light emitted from the light-emitting element 7012 passes through a color filter layer 7033 and gate and source electrode layers of the TFT 7011, and the light is emitted. A light-transmitting conductive film is used as the gate and source electrode layers of the TFT 7011, an aperture ratio can be improved.

The color filter layer 7033 is formed by a droplet discharge method such as an inkjet method, a printing method, an etching method with the use of a photolithography technique, or the like.

The color filter layer 7033 is covered with the overcoat layer 7034, and also covered with the protective insulating layer 7035. Note that the overcoat layer 7034 with a thin thickness is illustrated in FIG. 13A; however, the overcoat layer 7034 has a function to planarize a surface with unevenness due to the color filter layer 7033.

A contact hole which is formed in the oxide insulating layer 7031, the insulating layer 7032, and the protective insulating layer 7035, and which reaches the drain electrode layer is provided in a portion which overlaps with the partition 7019. In FIG. 13A, the contact hole which reaches the drain electrode layer and the partition 7019 overlap with each other, whereby an aperture ratio can be improved.

Next, a light-emitting element having a dual emission structure will be described with reference to FIG. 13B.

In FIG. 13B, a cathode 7023 of a light-emitting element 7022 is formed over a light-transmitting conductive film 7027 which is electrically connected to the TFT 7021, and a light-emitting layer 7024 and an anode 7025 are stacked in that order over the cathode 7023. Note that the light-transmitting conductive film 7027 is electrically connected to a drain electrode layer of the TFT 7021 through a contact hole formed in an oxide insulating layer 7041, an insulating layer 7042, and a protective insulating layer 7045.

For the light-transmitting conductive film 7027, a light-transmitting conductive film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like can be used.

The cathode 7023 can be made of a variety of conductive materials as long as they have a low work function. For example, an alkali metal such as Li or Cs; an alkaline-earth metal such as Mg, Ca, or Sr; an alloy containing any of these (Mg:Ag, Al:Li, or the like); a rare-earth metal such as Yb or Er; or the like are preferable. In this embodiment, the thickness of the cathode 7023 is formed to a thickness that can transmit light (preferably, approximately 5 nm to 30 nm). For example, a 20-nm-thick aluminum film is used as the cathode 7023.

Note that the light-transmitting conductive film and the aluminum film may be stacked and then selectively etched, whereby the light-transmitting conductive film 7027 and the cathode 7023 may be formed. In this case, etching can be performed with the use of the same mask, which is preferable.

The periphery of the cathode 7023 is covered with a partition 7029. The partition 7029 is formed using an organic resin film such as polyimide, an acrylic resin, polyamide, or an epoxy resin; an inorganic insulating film; or organic polysiloxane. It is particularly preferable that the partition 7029 be formed using a photosensitive material to have an opening over the cathode 7023 so that a sidewall of the opening is formed as an inclined surface with continuous curvature. In the case where a photosensitive resin material is used for the partition 7029, a step of forming a resist mask can be omitted.

The light-emitting layer 7024 formed over the cathode 7023 and the partition 7029 may be formed as either a single layer or a plurality of layers stacked. When the light-emitting layer 7024 is formed as a plurality of layers, the light-emitting layer 7024 is formed by stacking an electron-injection layer, an electron-transport layer, a light-emitting layer, a hole-transport layer, and a hole-injection layer in that order over the cathode 7023. Note that not all of these layers need to be provided.

The stacking order is not limited to the above stacking order, and a hole-injection layer, a hole-transport layer, a light-emitting layer, an electron-transport layer, and an electron-injection layer may be stacked in that order over the cathode 7023. However, when power consumption is compared, an electron-injection layer, an electron-transport layer, a light-emitting layer, a hole-transport layer, and a hole-injection layer are preferably stacked in that order over the cathode 7023 because of lower power consumption.

As the anode 7025 formed over the light-emitting layer 7024, various materials can be used, and a material having a high work function, for example, a light-transmitting conductive material of ITO, IZO, ZnO, or the like is preferable. In this embodiment, an ITO film containing silicon oxide is used for an anode 7026.

The light-emitting element 7022 corresponds to a region where the light-emitting layer 7024 is sandwiched between the cathode 7023 and the anode 7025. In the case of the element structure illustrated in FIG. 13B, light is emitted from the light-emitting element 7022 to both the anode 7025 side and the cathode 7023 side as indicated by arrows.

Note that an example in which the light-transmitting conductive film is used as the gate electrode layer is illustrated in FIG. 13B, and light emitted from the light-emitting element 7022 to the cathode 7023 side passes through the color filter layer 7043 and the gate and source electrode layers of the TFT 7021, and the light is emitted. When a light-transmitting conductive film is used for the gate electrode layer and the source electrode layer of the TFT 7021, the aperture ratio on the anode 7025 side can be approximately the same as the aperture ratio on the cathode 7023 side.

The color filter layer 7043 is formed by a droplet discharge method such as an inkjet method, a printing method, an etching method with the use of a photolithography technique, or the like.

The color filter layer 7043 is covered with the overcoat layer 7044, and also covered with the protective insulating layer 7045.

A contact hole which is formed in the oxide insulating layer 7041, the insulating layer 7042, and the protective insulating layer 7045, and which reaches the drain electrode layer is provided in a portion which overlaps with the partition 7029. The contact hole which reaches the drain electrode layer and the partition 7029 overlap with each other, whereby the aperture ratio on the anode 7025 side can be approximately the same as the aperture ratio on the cathode 7023 side.

A contact hole which is formed in the protective insulating layer 7045 and the insulating layer 7042 and which reaches the light-transmitting conductive film 7027 is provided in a portion which overlaps with the partition 7029.

Note that when a light-emitting element having a dual emission structure is used and full color display is performed on both display surfaces, light from the anode 7025 side does not pass through the color filter layer 7043; therefore, a sealing substrate provided with another color filter layer is preferably provided on the anode 7025.

Next, a light-emitting element having a top emission structure is described with reference to FIG. 13C.

FIG. 13C is a cross-sectional view of a pixel in the case where the driving TFT 7001 is of n-type and light is emitted from a light-emitting element 7002 to an anode 7005 side. In FIG. 13C, a cathode 7003 of the light-emitting element 7002 which is electrically connected to the driving TFT 7001 is formed, and a light-emitting layer 7004 and the anode 7005 are stacked in that order over the cathode 7003.

The cathode 7003 can be made of a variety of conductive materials as long as they have a low work function. For example, an alkali metal such as Li or Cs; an alkaline-earth metal such as Mg, Ca, or Sr; an alloy containing any of these (Mg:Ag, Al:Li, or the like); a rare-earth metal such as Yb or Er; or the like is preferable.

The periphery of the cathode 7003 is covered with a partition 7009. The partition 7009 is formed using an organic resin film such as polyimide, an acrylic resin, polyamide, or an epoxy resin; an inorganic insulating film; or organic polysiloxane. It is particularly preferable that the partition 7009 be formed using a photosensitive material to have an opening over the cathode 7003 so that a sidewall of the opening is formed as an inclined surface with continuous curvature. In the case where a photosensitive resin material is used for the partition 7009, a step of forming a resist mask can be omitted.

The light-emitting layer 7004 formed over the cathode 7003 and the partition 7009 may be formed as a single layer or a plurality of layers stacked. When the light-emitting layer 7004 is formed as a plurality of layers, the light-emitting layer 7004 is formed by stacking an electron-injection layer, an electron-transport layer, a light-emitting layer, a hole-transport layer, and a hole-injection layer in that order over the cathode 7003. Note that not all of these layers need to be provided.

The stacking order is not limited to the above stacking order, and a hole-injection layer, a hole-transport layer, a light-emitting layer, an electron-transport layer, and an electron-injection layer may be stacked in that order over the cathode 7003. In the case where these layers are stacked in that order, the cathode 7003 functions as an anode.

In FIG. 13C, a hole-injection layer, a hole-transport layer, a light-emitting layer, an electron-transport layer, and an electron-injection layer are stacked in that order over a stacked film in which a Ti film, an aluminum film, and a Ti film are stacked in that order, and thereover, a stacked layer of a Mg:Ag alloy thin film and ITO is formed.

However, when power consumption is compared, an electron-injection layer, an electron-transport layer, a light-emitting layer, a hole-transport layer, and a hole-injection layer are preferably stacked in that order over the cathode 7003 because of lower power consumption.

The anode 7005 is formed using a light-transmitting conductive material, and for example, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

The light-emitting element 7002 corresponds to a region where the light-emitting layer 7004 is sandwiched between the cathode 7003 and the anode 7005. In the case of the element structure illustrated in FIG. 13C, light is emitted from the light-emitting element 7002 to the anode 7005 side as indicated by arrows.

In FIG. 13C, an example in which the thin film transistor 460 is used as the TFT 7001 is illustrated; however, there is no particular limitation, and another thin film transistor can be used. When another thin film transistor is used as the TFT 7001, the cathode 7003 and the drain electrode layer are electrically connected to each other so as to be in contact with each other.

In FIG. 13C, the drain electrode layer of the TFT 7001 is electrically connected to the cathode 7003 with an oxide insulating layer 7051 interposed therebetween. A planarizing insulating layer 7053 is formed using a resin material such as polyimide, an acrylic resin, a benzocyclobutene resin, polyamide, or an epoxy resin. In addition to such resin materials, it is also possible to use a low-dielectric constant material (low-k material), a siloxane-based resin, phosphosilicate glass (PSG), borophosphosilicate glass (BPSG), or the like. Note that the planarizing insulating layer 7053 may be formed by stacking a plurality of insulating films formed of these materials. There is no particular limitation on the method for forming the planarizing insulating layer 7053, and the planarizing insulating layer 7053 can be formed, depending on the material, by a method such as a sputtering method, an SOG method, spin coating, dip coating, spray coating, or a droplet discharge method (such as an inkjet method, screen printing, offset printing, or the like), or a tool (equipment) such as a doctor knife, a roll coater, a curtain coater, or a knife coater.

The partition 7009 is provided so as to insulate the cathode 7003 and a cathode of an adjacent pixel. The partition 7009 is formed using an organic resin film such as polyimide, an acrylic resin, polyamide, or an epoxy resin; an inorganic insulating film; or organic polysiloxane. It is particularly preferable that the partition 7009 be formed using a photosensitive resin material to have an opening over the cathode 7003 so that a sidewall of the opening is formed as an inclined surface with continuous curvature. In the case where a photosensitive resin material is used for the partition 7009, a step of forming a resist mask can be omitted.

In the structure of FIG. 13C, when full color display is performed, for example, the light-emitting element 7002 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements, which include white light-emitting elements as well as three kinds of light-emitting elements.

In the structure of FIG. 13C, a light-emitting display device capable of full color display may be manufactured in such a way that all of a plurality of light-emitting elements which is arranged is white light-emitting elements and a sealing substrate having a color filter or the like is arranged on the light-emitting element 7002. A material which exhibits a single color such as white is formed and combined with a color filter or a color conversion layer, whereby full color display can be performed.

Needless to say, display of monochromatic light can also be performed. For example, a lighting system may be formed with the use of white light emission, or an area-color light-emitting device may be formed with the use of a single color light emission.

If necessary, an optical film such as a polarizing film including a circularly polarizing plate may be provided.

Although an organic EL element is described here as a light-emitting element, an inorganic EL element can also be provided as a light-emitting element.

Note that the example is described in which a thin film transistor (driving TFT) which controls the driving of a light-emitting element is electrically connected to the light-emitting element; however, a structure may be employed in which a TFT for current control is connected between the driving TFT and the light-emitting element.

When a structure is not provided with a light-emitting element and a partition, one embodiment of the present invention can be applied to a liquid crystal display device. The case of a liquid crystal display device will be described in FIG. 47.

Figure 47:
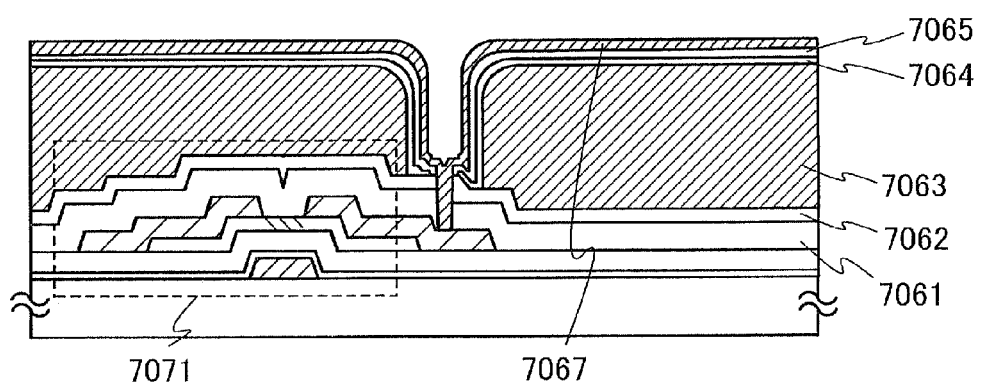
FIG. 47 is a view illustrating a semiconductor device.

The case where a TFT 7071 is of an n-type is described. In FIG. 47, a light-transmitting conductive film 7067 which is electrically connected to the TFT 7071 is provided, and the light-transmitting conductive film 7067 is electrically connected to a drain electrode layer of the TFT 7071 through a contact hole formed in an oxide insulating layer 7061, a protective insulating layer 7062, a color filter layer 7063, an overcoat layer 7064, and a protective insulating layer 7065.

As the light-transmitting conductive film 7067, a light-transmitting conductive film such as a film of indium oxide containing tungsten oxide, indium zinc oxide containing tungsten oxide, indium oxide containing titanium oxide, indium tin oxide containing titanium oxide, indium tin oxide (also referred to as ITO), indium zinc oxide, or indium tin oxide to which silicon oxide is added can be used, for example.

Note that an example using a light-transmitting conductive film as a gate electrode layer is illustrated in FIG. 47, and light emitted from a backlight or the like passes through the color filter layer 7063, and the light is emitted. Accordingly, a light-transmitting conductive film is used as the gate and source electrode layers of the TFT 7071, and an aperture ratio can be improved.

The color filter layer 7063 is formed by a droplet discharge method such as an inkjet method, a printing method, an etching method with the use of a photolithography technique, or the like.

The color filter layer 7063 is covered with the overcoat layer 7064, and also covered with the protective insulating layer 7065. Note that the overcoat layer 7064 with a thin thickness is illustrated in FIG. 47; however, the overcoat layer 7064 has a function to planarize a surface with unevenness due to the color filter layer 7063.

A structure in which a liquid crystal layer is provided over the light-transmitting conductive film 7067 can be applied to a liquid crystal display device.

Figure 11A:
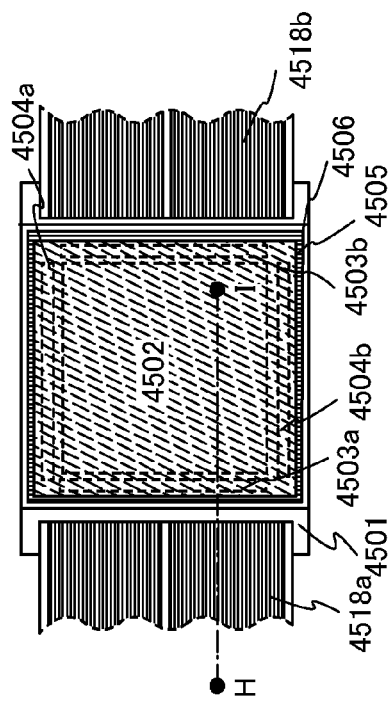
FIGS. 11A and 11B are views each illustrating a semiconductor device.
Figure 11B:
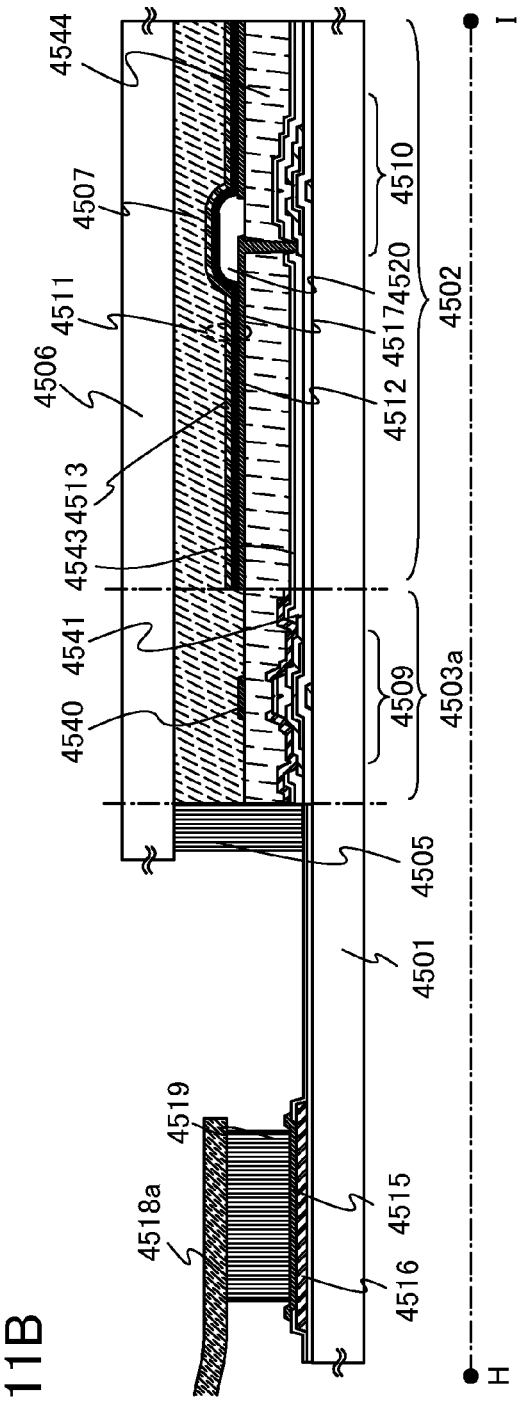

Next, the appearance and a cross section of a light-emitting display panel (also referred to as a light-emitting panel), which is one embodiment of the semiconductor device, will be described with reference to FIGS. 11A and 11B. FIG. 11A is a plan view of a panel in which a thin film transistor and a light-emitting element are sealed between a first substrate and a second substrate with a sealant. FIG. 11B is a cross-sectional view taken along line H-I of FIG. 11A.

A sealant 4505 is provided to surround a pixel portion 4502, a signal line driver circuit 4503a, a signal line driver circuit 4503b, a scan line driver circuit 4504a, and a scan line driver circuit 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 11B.

As the thin film transistors 4509 and 4510, the highly reliable thin film transistor including an oxide semiconductor layer which is described in any of Embodiments 1 to 7 can be employed. As the thin film transistor 4509 for a driver circuit, the thin film transistors 410, 440, 449, 460, 490, or 492 can be used. As the thin film transistor 4510 for a pixel, for example, any of the thin film transistors 420, 451, 470, and 493 which are described in any of Embodiments 1 to 7 can be used. In this embodiment, the thin film transistors 4509 and 4510 are n-channel thin film transistors.

A conductive layer 4540 is provided in a portion which overlaps with a channel formation region of the oxide semiconductor layer of the thin film transistor 4509 for a driver circuit over an insulating layer 4544. When the conductive layer 4540 is provided in a portion which overlaps with the channel formation region of the oxide semiconductor layer, the amount of shift in the threshold voltage of the thin film transistor 4509 between before and after a BT test can be reduced. The conductive layer 4540 may have a potential which is the same as or different from that of the gate electrode layer of the thin film transistor 4509, and can function as a second gate electrode layer. The potential of the conductive layer 4540 may be GND, 0 V or in a floating state.

In the thin film transistor 4509, an oxide insulating layer 4541 is formed as a protective insulating film so as to be in contact with a semiconductor layer including a channel formation region. The oxide insulating layer 4541 may be formed using a material and a method similar to those of the oxide insulating layer 416 described in Embodiment 1. In addition, in order to reduce the surface roughness of the thin film transistors, the thin film transistors are covered with the insulating layer 4544 functioning as a planarizing insulating film. Here, a silicon oxide film is formed as the oxide insulating layer 4541 by a sputtering method with the use of Embodiment 1.

A protective insulating layer 4543 is formed over the oxide insulating layer 4541. The protective insulating layer 4543 may be formed using a material and a method similar to those of the protective insulating layer 403 described in Embodiment 1. Here, a silicon nitride film is formed as the protective insulating layer 4543 by a PCVD method.

Further, the insulating layer 4544 is formed as the planarizing insulating film. The insulating layer 4544 may be formed using a material and a method similar to those of the planarizing insulating layer 404 described in Embodiment 1. Here, an acrylic resin is used for the insulating layer 4544.

A first electrode layer 4517 that is a pixel electrode included in a light-emitting element 4511 is electrically connected to a source electrode layer or a drain electrode layer of the thin film transistor 4510. Note that a structure of the light-emitting element 4511 is not limited to the stack structure, which includes the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed of a photosensitive material to have an opening over the first electrode layer 4517 so that a sidewall of the opening is formed as an inclined surface with continuous curvature.

The electroluminescent layer 4512 may be formed as a single layer or a plurality of layers stacked.

Note that a protective film may be formed over the second electrode layer 4513 and the partition 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals and potentials are supplied to the signal line driver circuits 4503a and 4503b, the scan line driver circuits 4504a and 4504b, or the pixel portion 4502 from an FPC 4518a and an FPC 4518b.

A connection terminal electrode 4515 is formed from the same conductive film as the first electrode layer 4517 included in the light-emitting element 4511, and a terminal electrode 4516 is formed from the same conductive film as the source and drain electrode layers included in the thin film transistor 4510.

The connection terminal electrode 4515 is electrically connected to a terminal of the FPC 4518a through an anisotropic conductive film 4519.

The substrate located in the direction in which light is extracted from the light-emitting element 4511 needs to have a light-transmitting property. In that case, a light-transmitting material such as a glass plate, a plastic plate, a polyester film, or an acrylic film is used as the substrate.

As the filler 4507, an ultraviolet curable resin or a thermosetting resin can be used, in addition to an inert gas such as nitrogen or argon. For example, polyvinyl chloride (PVC), an acrylic resin, polyimide, an epoxy resin, a silicone resin, polyvinyl butyral (PVB), or an ethylene-vinyl acetate copolymer (EVA) can be used. For example, nitrogen is used for the filler.

If needed, an optical film, such as a polarizing plate, a circularly polarizing plate (including an ellipticaly polarizing plate), a retardation plate (a quarter-wave plate or a half-wave plate), or a color filter, may be provided as appropriate on a light-emitting surface of the light-emitting element 4511. Furthermore, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503*a* and 4503*b* and the scan line driver circuits 4504*a* and 4504*b* may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 11A and 11B.

Through the above process, a highly reliable light-emitting display device (display panel) as a semiconductor device can be manufactured.

This embodiment can be implemented in appropriate combination with the structures described in the other embodiments.

(Embodiment 15)

A semiconductor device disclosed in this specification can be applied to electronic paper. Electronic paper can be used for electronic devices in a variety of fields as long as they can display data. For example, electronic paper can be applied to an e-book reader (electronic book), a poster, an advertisement in a vehicle such as a train, or displays of various cards such as a credit card. An example of the electronic device is illustrated in FIG. 20.

Figure 20:
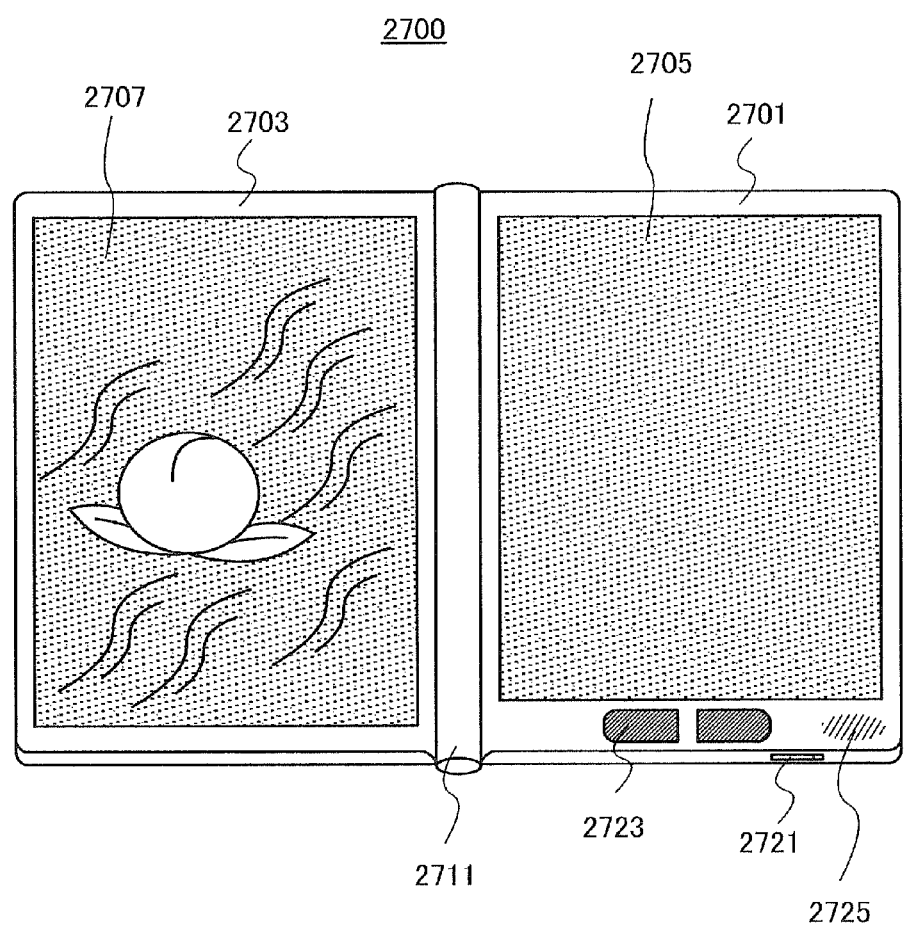
FIG. 20 is an external view illustrating an example of an e-book reader.

FIG. 20 illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (display portion 2705 in FIG. 20) and graphics can be displayed on a display portion on the left side (display portion 2707 in FIG. 20).

FIG. 20 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

(Embodiment 16)

A semiconductor device disclosed in this specification can be applied to a variety of electronic devices (including amusement machines). Examples of electronic devices include television sets (also referred to as televisions or television receivers), monitor of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 21A:
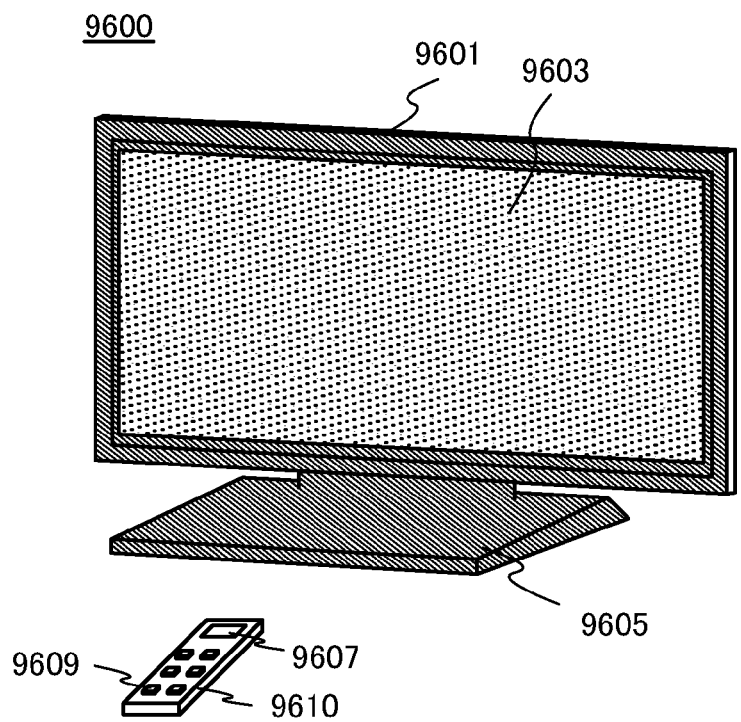
FIGS. 21A and 21B are external views illustrating examples of a television device and a digital photo frame, respectively.

FIG. 21A illustrates an example of a television set. In a television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 21B:
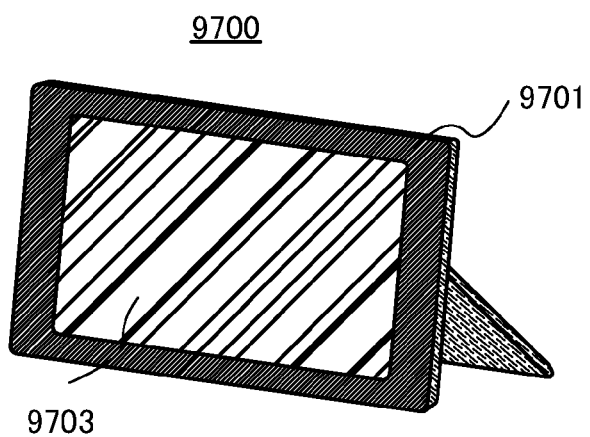

FIG. 21B illustrates an example of a digital photo frame. For example, in a digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame 9700, whereby the image data can be downloaded and displayed on the display portion 9703.

The digital photo frame 9700 may have a configuration capable of wirelessly transmitting and receiving data. Through wireless communication, desired image data can be downloaded to be displayed.

Figure 22A:
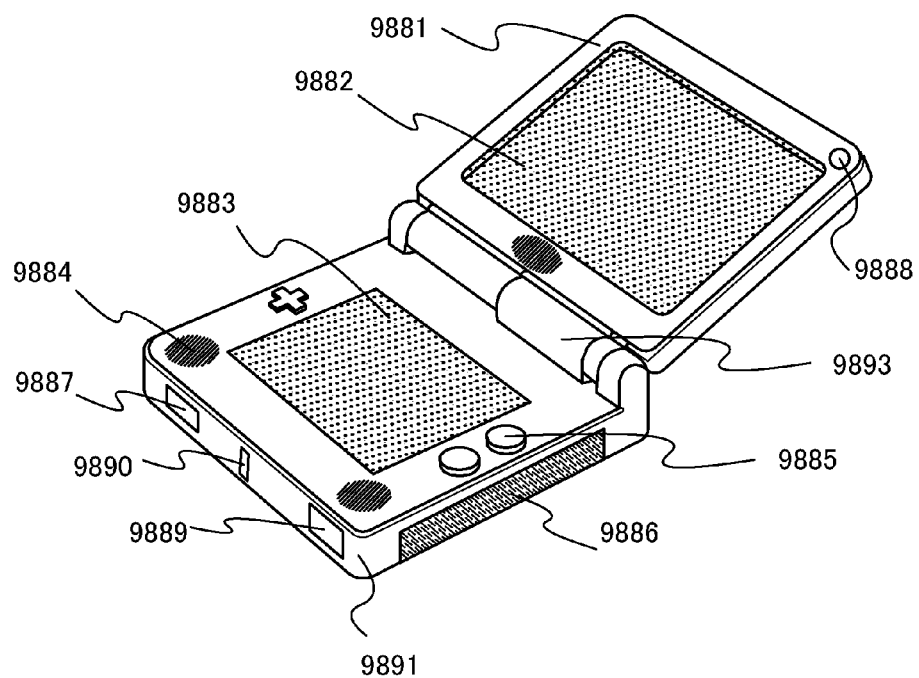
FIGS. 22A and 22B are external views each illustrating an example of an game machine.

FIG. 22A illustrates a portable amusement machine including two housings: a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 22A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device disclosed in this specification can be employed. The portable amusement machine may include other accessory equipment, as appropriate. The portable amusement machine illustrated in FIG. 22A has a function of reading a program or data stored in a recording medium to display it on the display portion, and a function of sharing information with another portable amusement machine by wireless communication. The portable amusement machine illustrated in FIG. 22A can have various functions without limitation to the above.

Figure 22B:
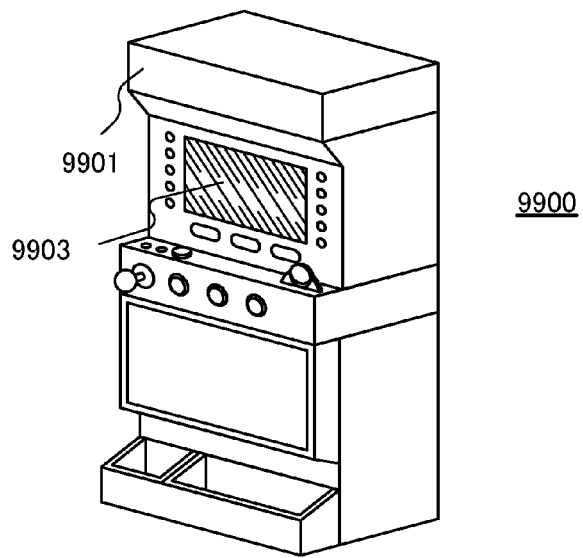

FIG. 22B illustrates an example of a slot machine which is a large-sized amusement machine. In a slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device disclosed in this specification may be employed. The slot machine 9900 may include other accessory equipment, as appropriate.

Figure 23A:
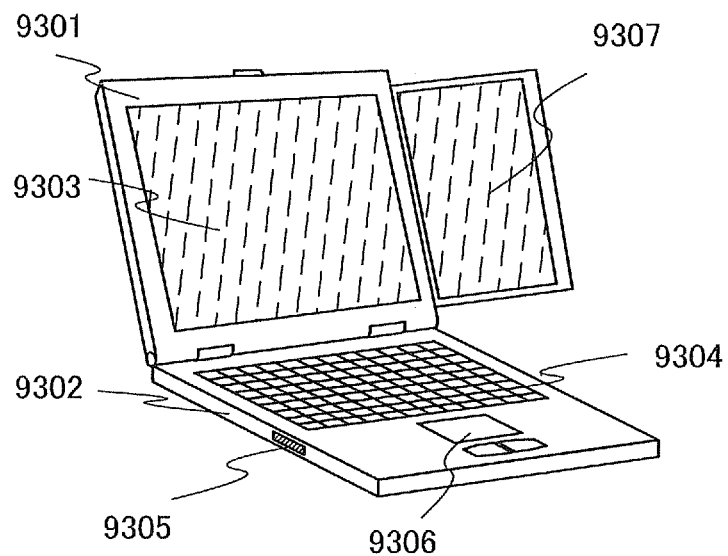
FIGS. 23A and 23B are external views illustrating examples of a portable computer and a mobile phone, respectively.

FIG. 23A is a perspective view illustrating an example of a portable computer.

In the portable computer of FIG. 23A, a top housing 9301 having a display portion 9303 and a bottom housing 9302 having a keyboard 9304 can overlap with each other by closing a hinge unit which connects the top housing 9301 and the bottom housing 9302. The portable computer of FIG. 23A can be convenient for carrying, and in the case of using the keyboard for input, the hinge unit is opened and the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes an external connection port 9305 into which another device such as a communication cable conformable to communication standards of a USB is inserted.

The top housing 9301, which includes a display portion 9307 and can keep the display portion 9307 therein by sliding it toward the inside of the top housing 9301, can have a large display screen. In addition, the user can adjust the orientation of a screen of the display portion 9307 which can be kept in the top housing 9301. When the display portion 9307 which can be kept in the top housing 9301 is a touch input panel, input can be performed by touching part of the display portion 9307 which can be kept in the top housing 9301.

The display portion 9303 or the display portion 9307 which can be kept in the top housing 9301 are formed using an image display device of a liquid crystal display panel, a light-emitting display panel such as an organic light-emitting element or an inorganic light-emitting element, or the like.

In addition, the portable computer of FIG. 23A can be provided with a receiver and the like and can receive a television broadcast to display an image on the display portion 9303 or the display portion 9307. The user can watch a television broadcast when the whole screen of the display portion 9307 is exposed by sliding the display portion 9307 while the hinge unit which connects the top housing 9301 and the bottom housing 9302 is kept closed. In this case, the hinge unit is not opened and display is not performed on the display portion 9303. In addition, start up of only a circuit for displaying a television broadcast is performed. Therefore, power can be consumed to the minimum, which is useful for the portable computer whose battery capacity is limited.

Figure 23B:
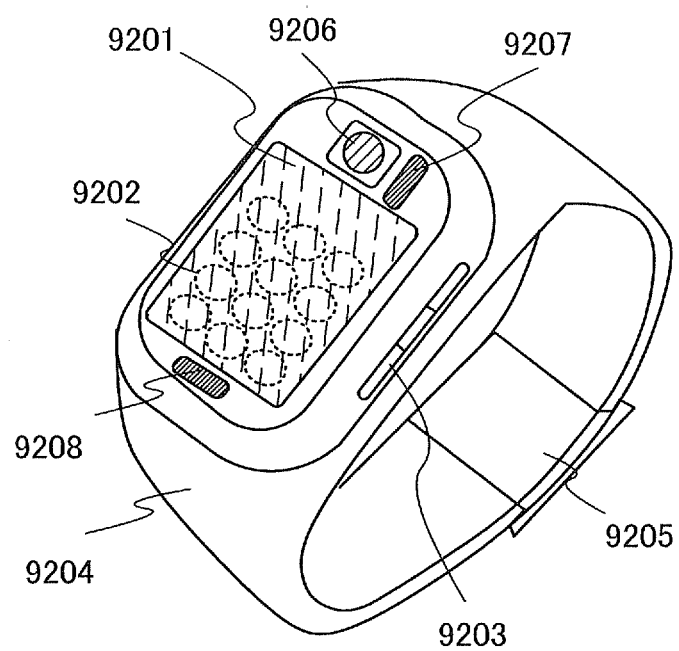

FIG. 23B is a perspective view illustrating an example of a cellular phone that the user can wear on the wrist like a wristwatch.

This cellular phone is formed with a main body which includes a communication device including at least a telephone function, and a battery; a band portion 9204 which enables the main body to be worn on the wrist; an adjusting portion 9205 for adjusting the fixation of the band portion fixed for the wrist; a display portion 9201; a speaker 9207; and a microphone 9208.

In addition, the main body includes operating switches 9203. The operating switches 9203 serve, for example, as a switch for starting a program for the Internet when the switch is pressed, in addition to serving as a switch for turning on a power source, a switch for shifting a display, a switch for instructing to start taking images, or the like, and can be used so as to correspond to each function.

Input to this cellular phone is operated by touching the display portion 9201 with a finger or an input pen, operating the operating switches 9203, or inputting voice into the microphone 9208. Note that displayed buttons 9202 which are displayed on the display portion 9201 are illustrated in FIG. 23B. Input can be performed by touching the displayed buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The cellular phone illustrated in FIG. 23B is provided with a receiver of a television broadcast and the like, and can display an image on the display portion 9201 by receiving a television broadcast. In addition, the cellular phone illustrated in FIG. 23B is provided with a memory device and the like such as a memory, and can record a television broadcast in the memory. The cellular phone illustrated in FIG. 23B may have a function of collecting location information such as GPS.

An image display device of a liquid crystal display panel, a light-emitting display panel such as an organic light-emitting element or an inorganic light-emitting element, or the like is used as the display portion 9201. The cellular phone illustrated in FIG. 23B is compact and lightweight, and the battery capacity of the cellular phone illustrated in FIG. 23B is limited. Therefore, a panel which can be driven with low power consumption is preferably used as a display device for the display portion 9201.

Note that FIG. 23B illustrates the electronic device which is worn on the wrist; however, this embodiment is not limited thereto as long as a portable shape is employed.

(Embodiment 17)

This embodiment will describe examples of display devices including any of the thin film transistors described in Embodiments 1 to 7 as one embodiment of a semiconductor device with reference to FIGS. 24, 25, 26, 27, 28, 29, 30, 31, 32, 33, 34, 35, 36, and 37. In this embodiment, a liquid crystal display device with the use of a liquid crystal element as a display element will be described with reference to FIGS. 24, 25, 26, 27, 28, 29, 30, 31, 32, 33, 34, 35, 36, and 37. Any of the thin film transistors described in Embodiments 1 to 7 can be applied to a TFT 628 and a TFT 629 used for liquid crystal display devices illustrated in FIGS. 24, 25, 26, 27, 28, 29, 30, 31, 32, 33, 34, 35, 36, and 37, and the TFT 628 and the TFT 629 can be manufactured in a manner similar to that of any of the thin film transistors described in Embodiments 1 to 7 and have high electric characteristics and high reliability. The TFT 628 and the TFT 629 each include an oxide semiconductor layer as a channel formation region. The case where the thin film transistor illustrated in FIGS. 4A to 4C is used as an example of a thin film transistor is explained in FIGS. 24, 25, 26, 27, 28, 29, 30, 31, 32, 33, 34, 35, 36, and 37, but the case is not limited thereto.

First, a vertical alignment (VA) liquid crystal display device is described. The VA liquid crystal display device has a kind of form in which alignment of liquid crystal molecules of a liquid crystal display panel is controlled. The VA liquid crystal display device has a form in which liquid crystal molecules are vertical to a panel surface when voltage is not applied. In particular, in this embodiment, it is devised that a pixel is divided into several regions (sub-pixels) so that molecules are aligned in different directions in the respective regions. This is referred to as domain multiplication or multi-domain design. In the following description, a liquid crystal display device with multi-domain design is described.

Figure 24:
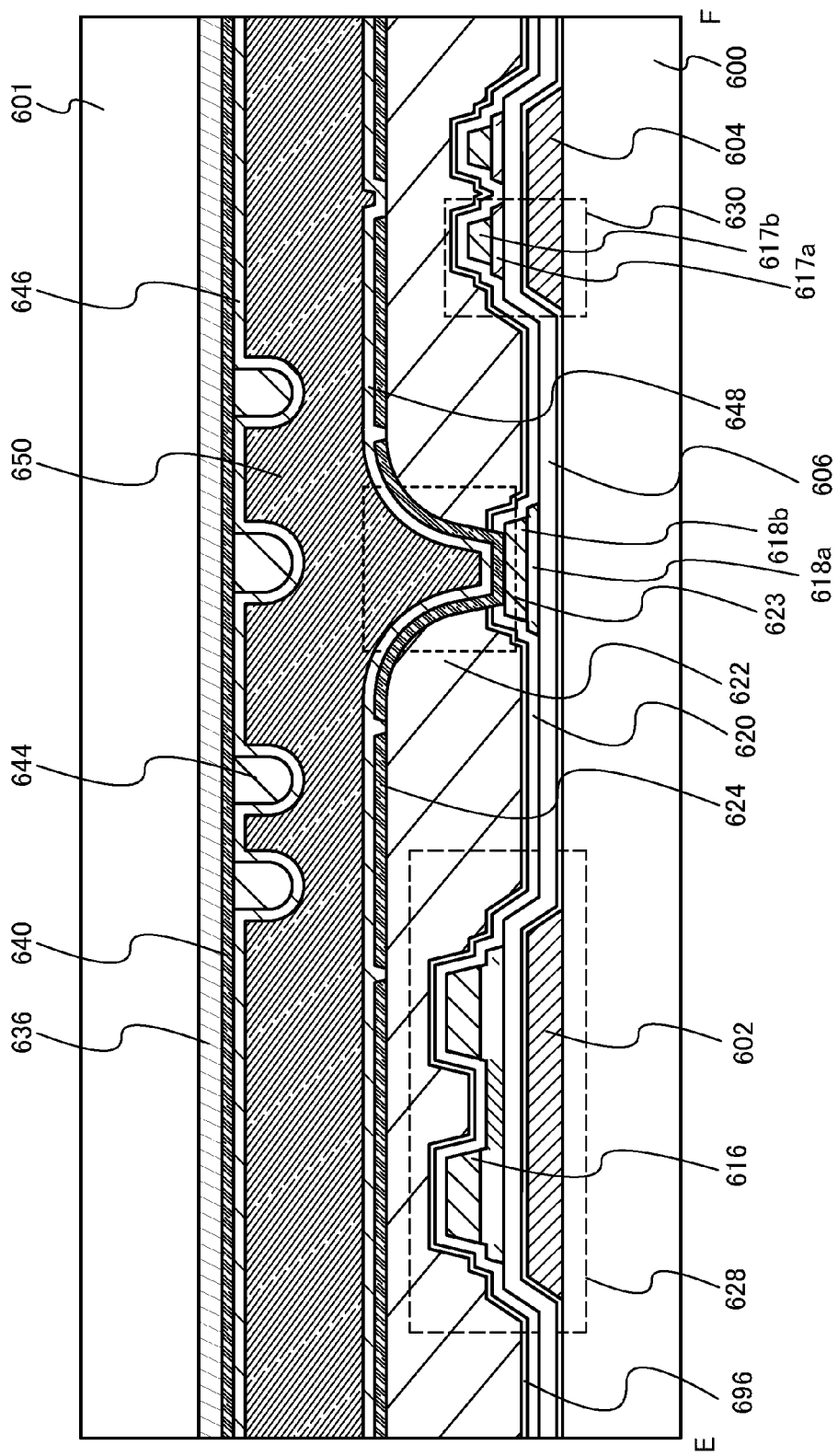
FIG. 24 is a view illustrating a semiconductor device.
Figure 25:
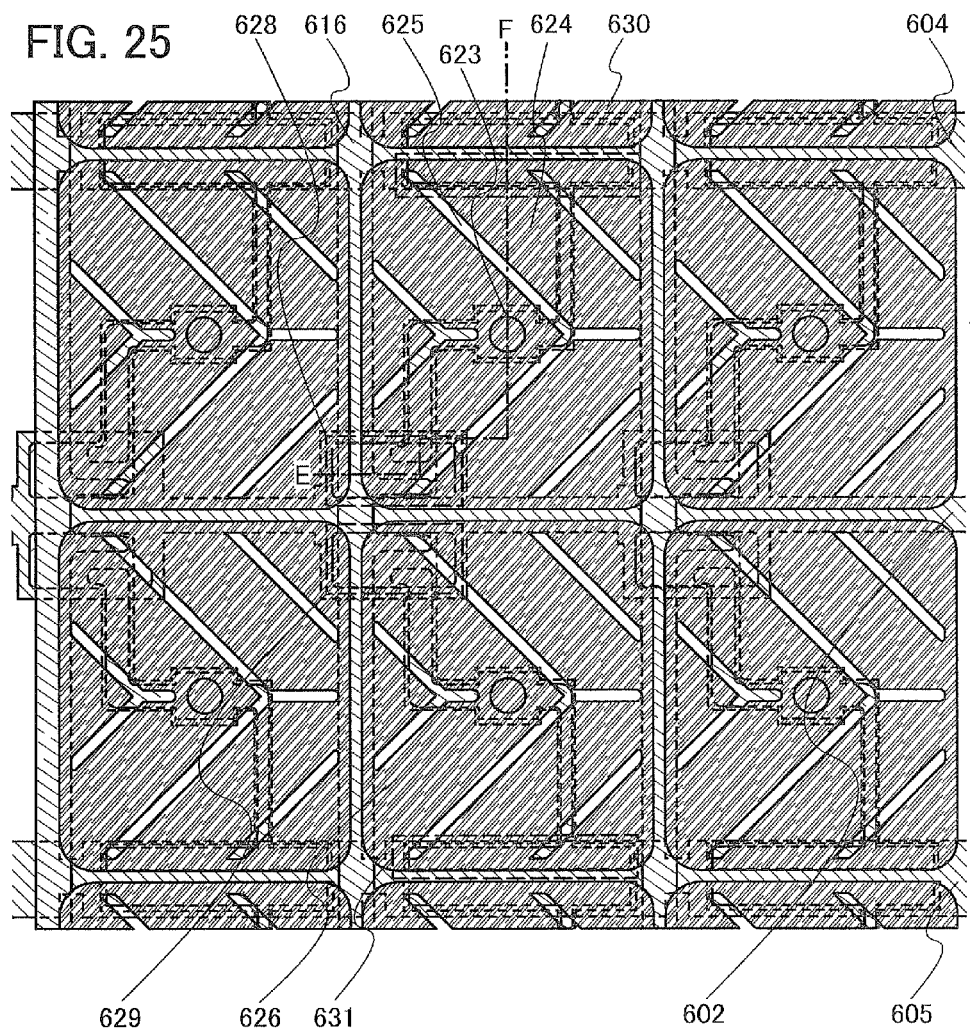
FIG. 25 is a view illustrating a semiconductor device.
Figure 26:
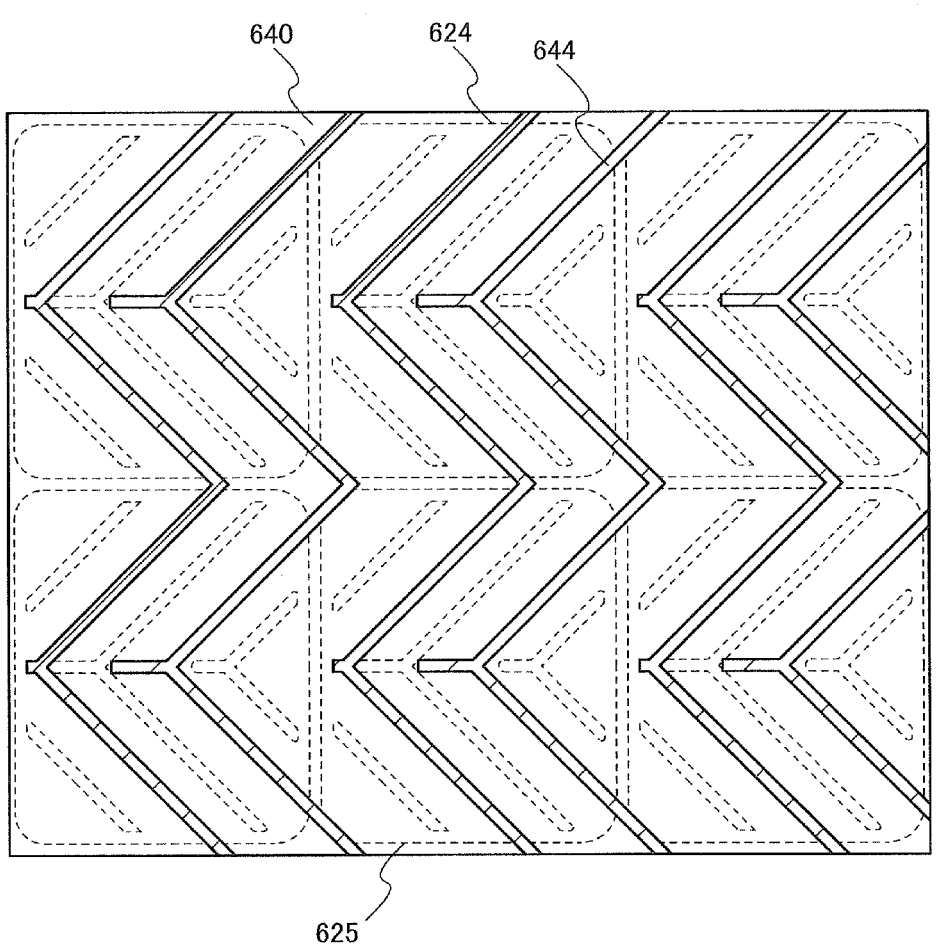
FIG. 26 is a view illustrating a semiconductor device.

FIG. 25 and FIG. 26 illustrate a pixel electrode and a counter electrode, respectively. FIG. 25 is a plan view of a side of a substrate provided with the pixel electrode. FIG. 24 illustrates a cross-sectional structure taken along line E-F of FIG. 25. FIG. 26 is a plan view of a side of a substrate provided with the counter electrode. Hereinafter, description is made with reference to these drawings.

FIG. 24 illustrates a state in which a substrate 600 provided with the TFT 628, a pixel electrode layer 624 electrically connected to the TFT 628, and a storage capacitor portion 630 overlaps with a counter substrate 601 provided with a counter electrode layer 640 and the like, and liquid crystal is injected therebetween.

The counter substrate 601 is provided with a coloring film 636 and the counter electrode layer 640, and the counter electrode layer 640 is provided with a projection 644. An alignment film 648 is formed over the pixel electrode layer 624. Similarly, the counter electrode layer 640 and the projection 644 are also provided with an alignment film 646. A liquid crystal layer 650 is formed between the substrate 600 and the counter substrate 601.

Although a columnar spacer is used for the spacer here, bead spacers may be dispersed. Further, the spacer may also be formed over the pixel electrode layer 624 provided over the substrate 600.

The TFT 628, the pixel electrode layer 624 electrically connected to the TFT 628, and the storage capacitor portion 630 are formed over the substrate 600. The pixel electrode layer 624 is electrically connected to the TFT 628 and to a wiring 618a and a wiring 618b through a contact hole 623 which penetrates an insulating film 620 covering the storage capacitor portion 630 and penetrates an insulating film 696 covering the insulating film 620 and penetrates an insulating film 622 covering the insulating film 696. Any of the thin film transistors described in Embodiments 1 to 7 can be used as the TFT 628, as appropriate. The storage capacitor portion 630 includes a first capacitor wiring 604 which is formed at the same time as the formation of a gate wiring 602 of the TFT 628, a gate insulating film 606, and a second capacitor wiring 617a and a second capacitor wiring 617b which are formed at the same time as the formation of a wiring 616.

A liquid crystal element is formed by overlapping of the pixel electrode layer 624, the liquid crystal layer 650, and the counter electrode layer 640.

For example, the pixel electrode layer 624 is formed using any of the materials described in Embodiments 1 to 7. The pixel electrode layer 624 is provided with a slit 625. The slit 625 has a function of controlling alignment of the liquid crystal.

The TFT 629, a pixel electrode layer 626 electrically connected to the TFT 629, and a storage capacitor portion 631 illustrated in FIG. 25 can be formed in a similar manner to the TFT 628, the pixel electrode layer 624, and the storage capacitor portion 630, respectively. Both the TFT 628 and the TFT 629 are connected to the wiring 616. A pixel of this liquid crystal display panel includes the pixel electrode layers 624 and 626. Each of the pixel electrode layers 624 and 626 is in a sub-pixel.

FIG. 26 illustrates a plan structure on the counter substrate side. The counter electrode layer 640 is preferably formed using a material similar to that of the pixel electrode layer 624. The counter electrode layer 640 is provided with the projection 644 for controlling alignment of the liquid crystal. Note that in FIG. 26, the pixel electrode layers 624 and 626 are indicated by dashed lines, and the counter electrode layer 640 and the pixel electrode layers 624 and 626 overlap with each other.

Figure 27:
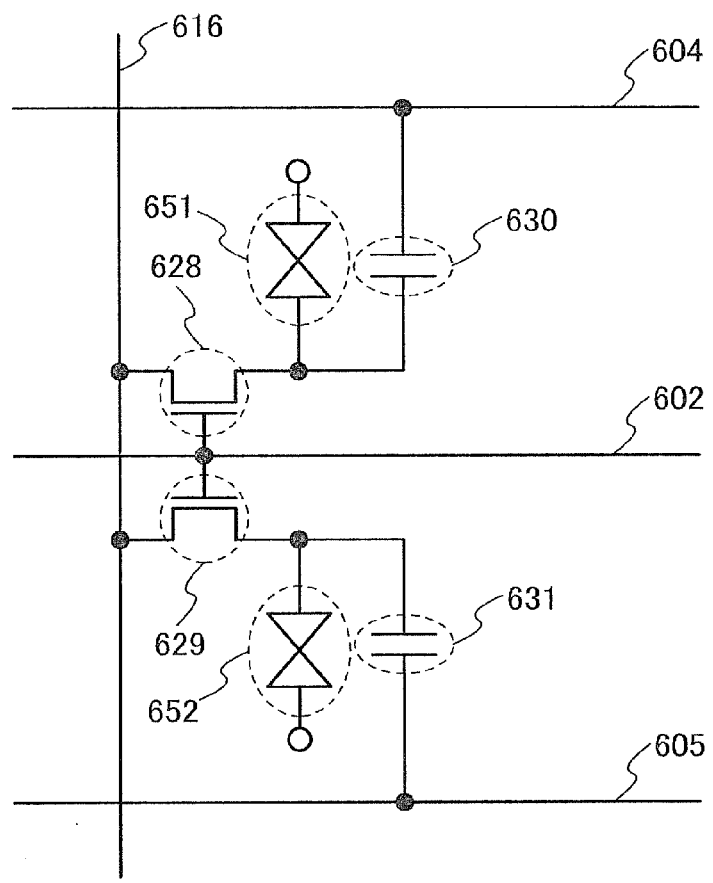
FIG. 27 is a view illustrating a semiconductor device.

FIG. 27 illustrates an equivalent circuit of this pixel structure. Both the TFT 628 and the TFT 629 are connected to the gate wiring 602 and the wiring 616. In this case, when potentials of the capacitor wiring 604 and a capacitor wiring 605 are different from each other, operation of a liquid crystal element 651 and a liquid crystal element 652 can vary. That is, alignment of the liquid crystal is precisely controlled and a viewing angle is increased by individual control of potentials of the capacitor wirings 604 and 605.

When voltage is applied to the pixel electrode layer 624 provided with the slit 625, electric field distortion (oblique electric field) is generated near the slit 625. The slit 625 and the projection 644 on the counter substrate 601 side are alternately arranged in an engaging manner, and thus an oblique electric field is effectively generated to control alignment of the liquid crystal, so that a direction of alignment of the liquid crystal varies depending on location. That is, a viewing angle of the liquid crystal display panel is increased by domain multiplication.

Next, another VA liquid crystal display device, which is different from the above-described device, is described with reference to FIGS. 28, 29, 30, and 31.

Figure 28:
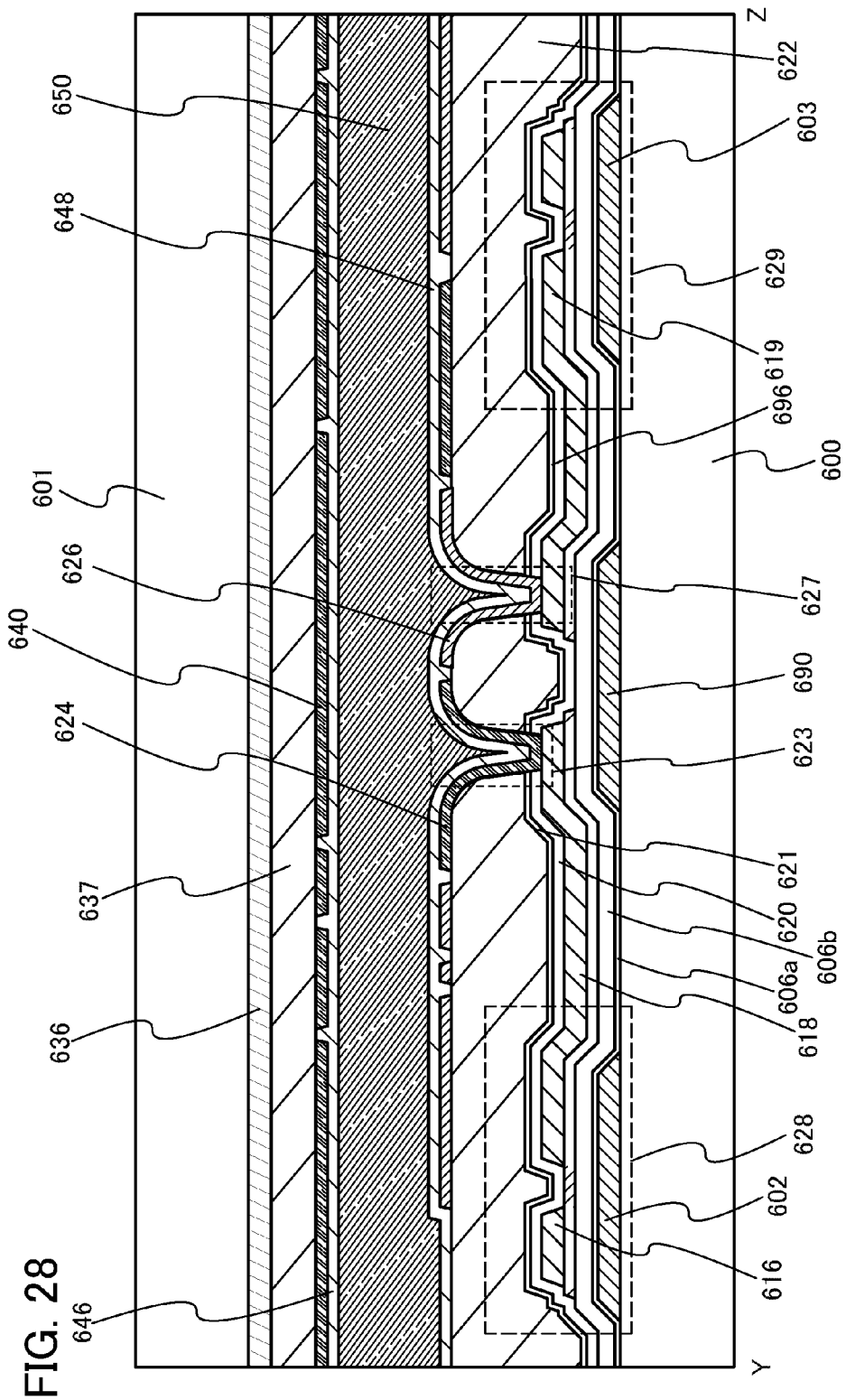
FIG. 28 is a view illustrating a semiconductor device.
Figure 29:
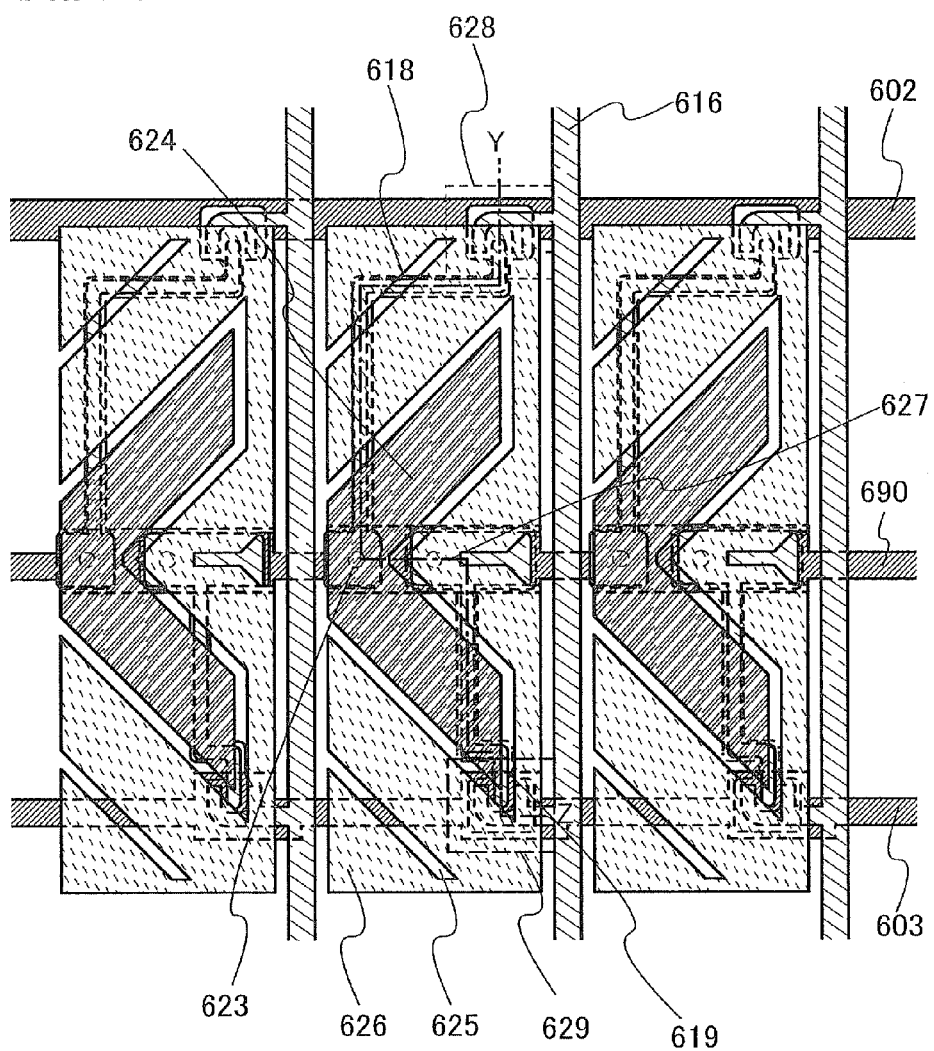
FIG. 29 is a view illustrating a semiconductor device.

FIG. 28 and FIG. 29 each illustrate a pixel structure of a VA liquid crystal display panel. FIG. 29 is a plan view of the substrate 600. FIG. 28 illustrates a cross-sectional structure taken along line Y-Z of FIG. 29. Hereinafter, description is made with reference to these drawings.

In this pixel structure, a plurality of pixel electrodes is included in one pixel, and each of the pixel electrodes is connected to a respective TFT. Each TFT is driven by a different gate signal. That is, this is a structure in which a signal supplied to each pixel electrode is individually controlled in a multi-domain pixel.

Through the contact hole 623 which penetrates the insulating film 620, an insulating film 621, and the insulating film 622, the pixel electrode layer 624 is connected to the TFT 628 through a wiring 618. Through a contact hole 627 which penetrates the insulating films 620, 621, and 622, the pixel electrode layer 626 is connected to the TFT 629 through a wiring 619. The gate wiring 602 of the TFT 628 and a gate wiring 603 of the TFT 629 are separated so that different gate signals can be given thereto. In contrast, the wiring 616 functioning as a data line is used in common for the TFTs 628 and 629. As each of the TFTs 628 and 629, any of the thin film transistors described in Embodiments 1 to 7 can be used as appropriate. Note that a first gate insulating film 606a and a second gate insulating film 606b are formed over the gate wiring 602, the gate wiring 603, and a capacitor wiring 690.

Figure 31:
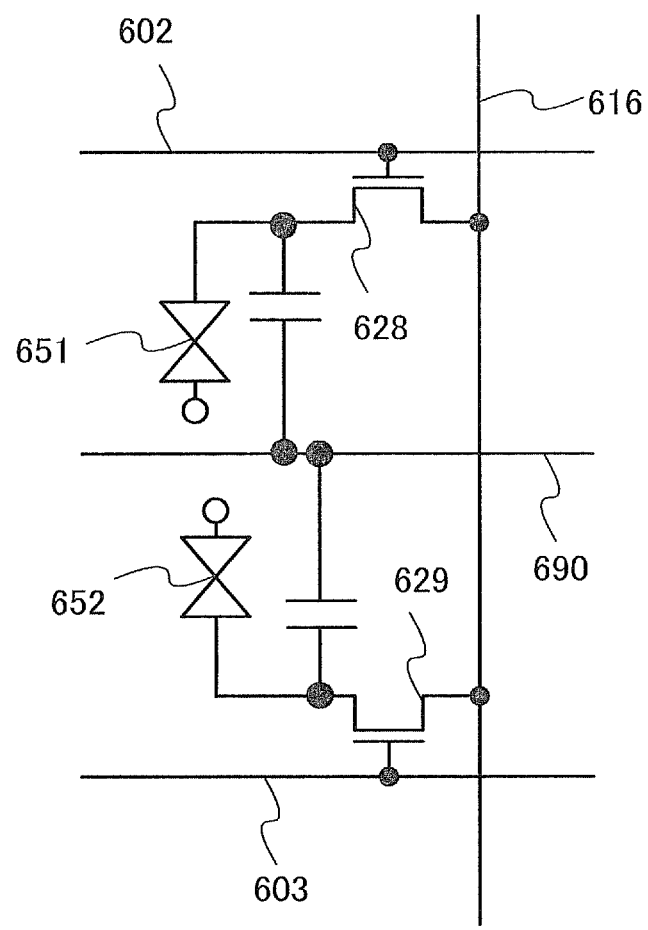
FIG. 31 is a view illustrating a semiconductor device.

The pixel electrode layers 624 and 626 have different shapes and are separated by the slit 625. The pixel electrode layer 626 is formed so as to surround the external side of the pixel electrode layer 624 which is spread into a V shape. Voltage applied between the pixel electrode layers 624 and 626 is made to vary by the TFTs 628 and 629 in order to control alignment of the liquid crystal. FIG. 31 illustrates an equivalent circuit of this pixel structure. The TFT 628 is connected to the gate wiring 602. The TFT 629 is connected to the gate wiring 603. Both the TFTs 628 and 629 are connected to the wiring 616. When different gate signals are supplied to the gate wirings 602 and 603, operation timings of the TFTs 628 and 629 can vary. The operation of the liquid crystal elements 651 and 652 can vary. That is, the operation of the TFTs 628 and 629 is individually controlled, so that orientation of liquid crystals of the liquid crystal elements 651 and 652 is precisely controlled and a viewing angle can be increased.

Figure 30:
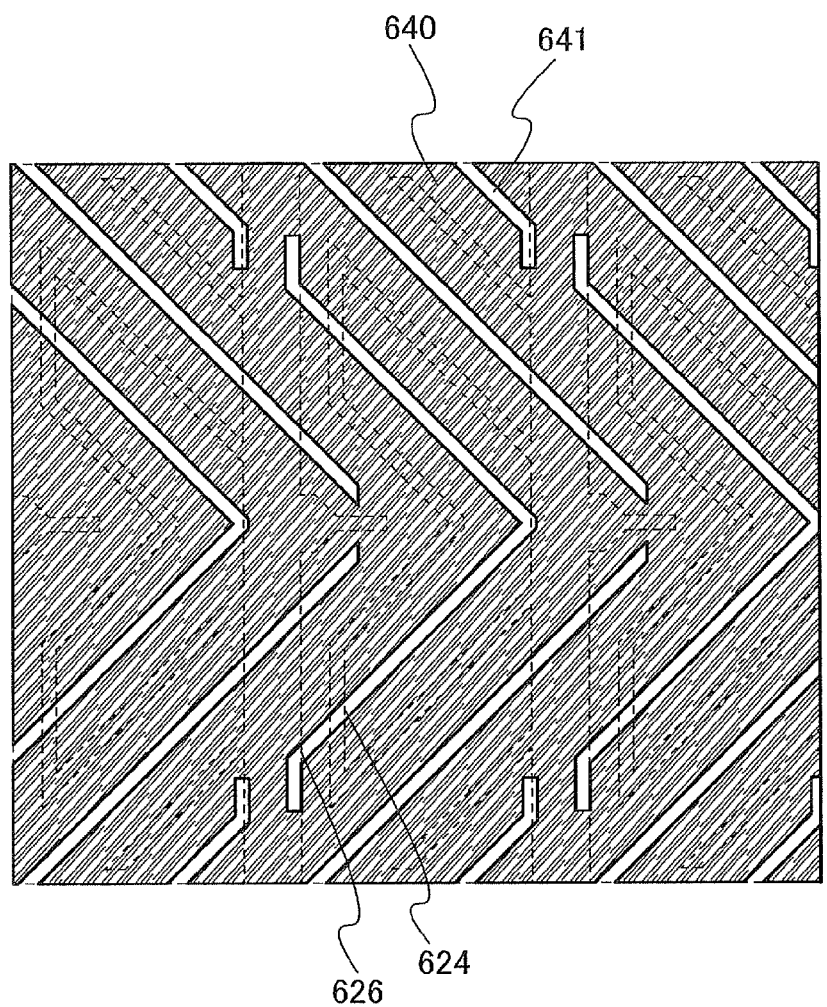
FIG. 30 is a view illustrating a semiconductor device.

The counter substrate 601 is provided with the coloring film 636 and the counter electrode layer 640. Moreover, a planarizing film 637 is formed between the coloring film 636 and the counter electrode layer 640 to prevent alignment disorder of the liquid crystal. FIG. 30 illustrates a plan structure on the counter substrate side. A slit 641 is formed in the counter electrode layer 640, which is used in common between different pixels. The slits 641 and 625 on the pixel electrode layers 624 and 626 side are alternately arranged in an engaging manner; thus, an oblique electric field is effectively generated, and alignment of the liquid crystal can be controlled. Accordingly, a direction in which the liquid crystal is aligned can vary depending on location, and a viewing angle is increased. Note that in FIG. 30, the pixel electrode layers 624 and 626 formed over the substrate 600 are indicated by dashed lines, and the counter electrode layer 640 and the pixel electrode layers 624 and 626 overlap with each other.

A first liquid crystal element is formed by overlapping of the pixel electrode layer 624, the liquid crystal layer 650, and the counter electrode layer 640. A second liquid crystal element is formed by overlapping of the pixel electrode layer 626, the liquid crystal layer 650, and the counter electrode layer 640. The pixel structure of the display panel illustrated in FIGS. 28, 29, 30, 31, and 32 is a multi-domain structure in which the first liquid crystal element and the second liquid crystal element are included in one pixel.

Next, a horizontal electric field liquid crystal display device is described. The horizontal electric field mode is a mode in which an electric field is horizontally applied to liquid crystal molecules in a cell, whereby the liquid crystal is driven to express a gray scale. By this method, a viewing angle can be increased to approximately 180 degrees. Hereinafter, a liquid crystal display device employing the horizontal electric field mode is described.

Figure 32:
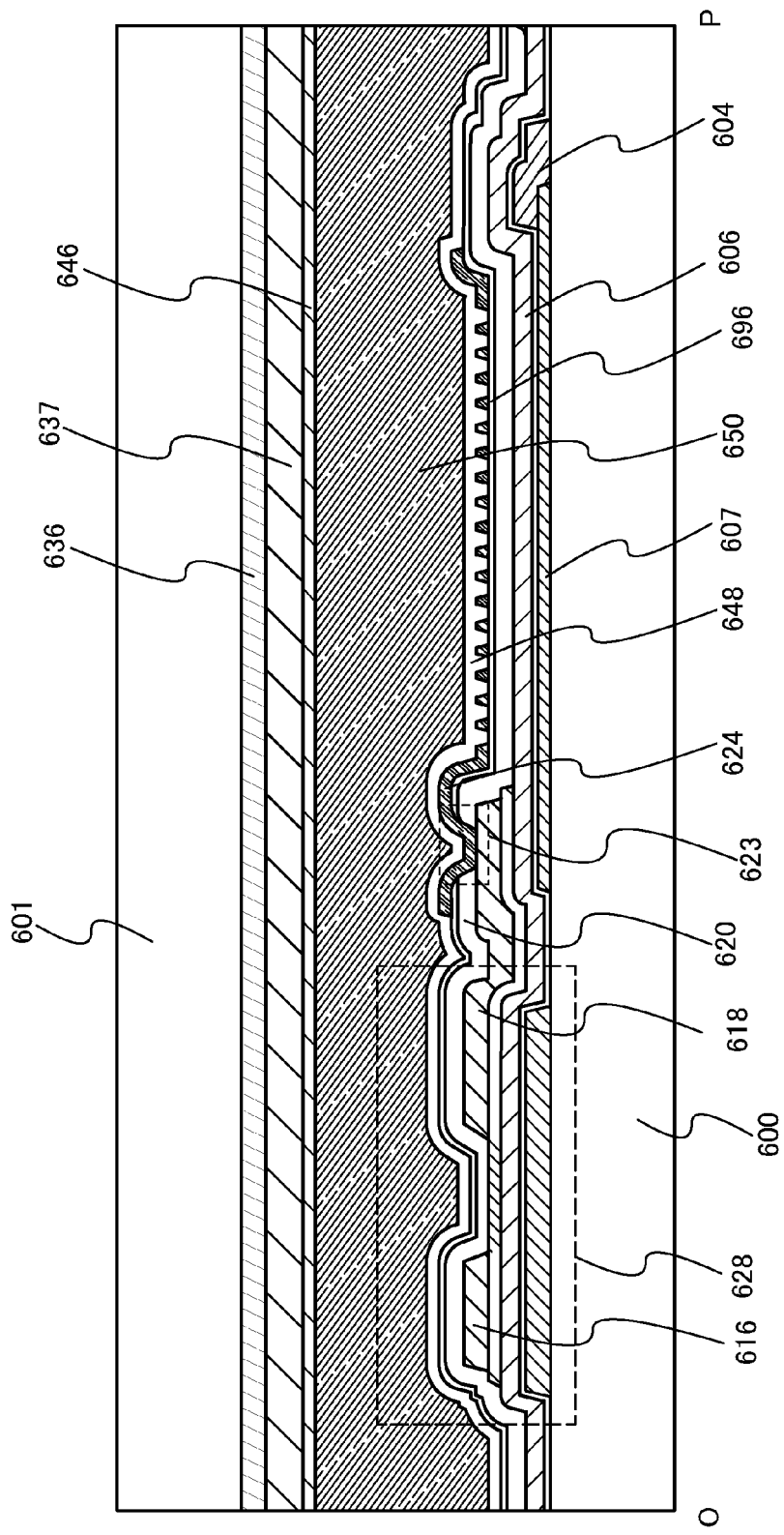
FIG. 32 is a view illustrating a semiconductor device.

FIG. 32 illustrates a state in which the substrate 600 provided with an electrode layer 607, the TFT 628, and the pixel electrode layer 624 electrically connected to the TFT 628 overlaps with the counter substrate 601, and liquid crystal is injected therebetween. The counter substrate 601 is provided with the coloring film 636, the planarizing film 637, and the like. Note that the counter electrode layer is not provided on the counter substrate 601 side. The liquid crystal layer 650 is formed between the substrate 600 and the counter substrate 601 with the alignment films 646 and 648 interposed.

The electrode layer 607, the capacitor wiring 604 electrically connected to the electrode layer 607, and the TFT 628 which is a thin film transistor and is described in any of Embodiments 1 to 7 are formed over the substrate 600. The capacitor wiring 604 can be formed using a material similar to that of the gate wiring 602 of the TFT 628. As the TFT 628, any of the thin film transistors described in Embodiments 1 to 7 can be used. The electrode layer 607 can be formed using a material similar to that of the pixel electrode layer described in any of Embodiments 1 to 7. The electrode layer 607 is formed into a shape which is compartmentalized roughly into a pixel shape. Note that the gate insulating film 606 is formed over the electrode layer 607 and the capacitor wiring 604.

The wirings 616 and 618 of the TFT 628 are formed over the gate insulating film 606. The wiring 616 serves as a data line extending in one direction, through which a video signal is transmitted in a liquid crystal display panel and serves as one of a source electrode and a drain electrode of the TFT 628. The wiring 618 serves as the other of the source electrode and the drain electrode, and is electrically connected to the second pixel electrode layer 624.

The insulating film 620 is formed over the wirings 616 and 618. The insulating film 696 is formed over the insulating film 620. Over the insulating film 696, the pixel electrode layer 624 electrically connected to the wiring 618 through the contact hole 623 formed in the insulating films 620 and 696 is formed. The pixel electrode layer 624 is formed using a material similar to that of the pixel electrode layer described in any of Embodiments 1 to 7.

In such a manner, the TFT 628 and the pixel electrode layer 624 electrically connected to the TFT 628 are formed over the substrate 600. Note that a storage capacitor is formed between the electrode layer 607 and the pixel electrode layer 624.

Figure 33:
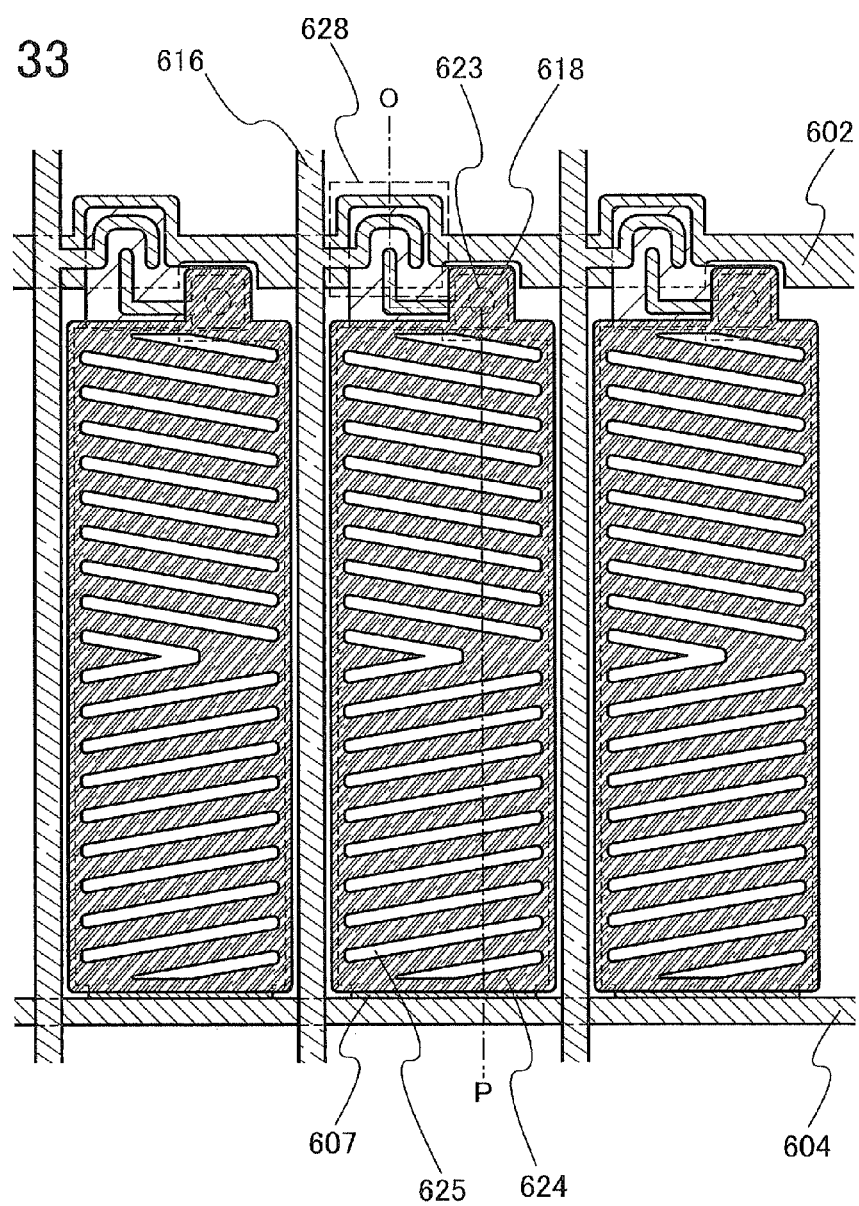
FIG. 33 is a view illustrating a semiconductor device.

FIG. 33 is a plan view illustrating a structure of the pixel electrode. FIG. 32 illustrates a cross-sectional structure taken along line O-P of FIG. 33. The pixel electrode layer 624 is provided with the slit 625. The slit 625 is for controlling alignment of the liquid crystal. In this case, an electric field is generated between the electrode layer 607 and the pixel electrode layer 624. The thickness of the gate insulating film 606 formed between the electrode layer 607 and the pixel electrode layer 624 is 50 nm to 200 nm, which is thin enough compared to the liquid crystal layer with a thickness of 2 μm to 10 μm. Accordingly, an electric field is generated substantially in parallel (in a horizontal direction) to the substrate 600. Alignment of the liquid crystal is controlled by the electric field. The liquid crystal molecules are horizontally rotated using the electric field which is approximately parallel to the substrate. In this case, since the liquid crystal molecules are parallel to the substrate in any state, contrast or the like is less affected by change in angle of viewing, and a viewing angle is increased. Further, since both the electrode layer 607 and the pixel electrode layer 624 are light-transmitting electrodes, an aperture ratio can be increased.

Next, another example of a horizontal electric field liquid crystal display device is described.

Figure 34:
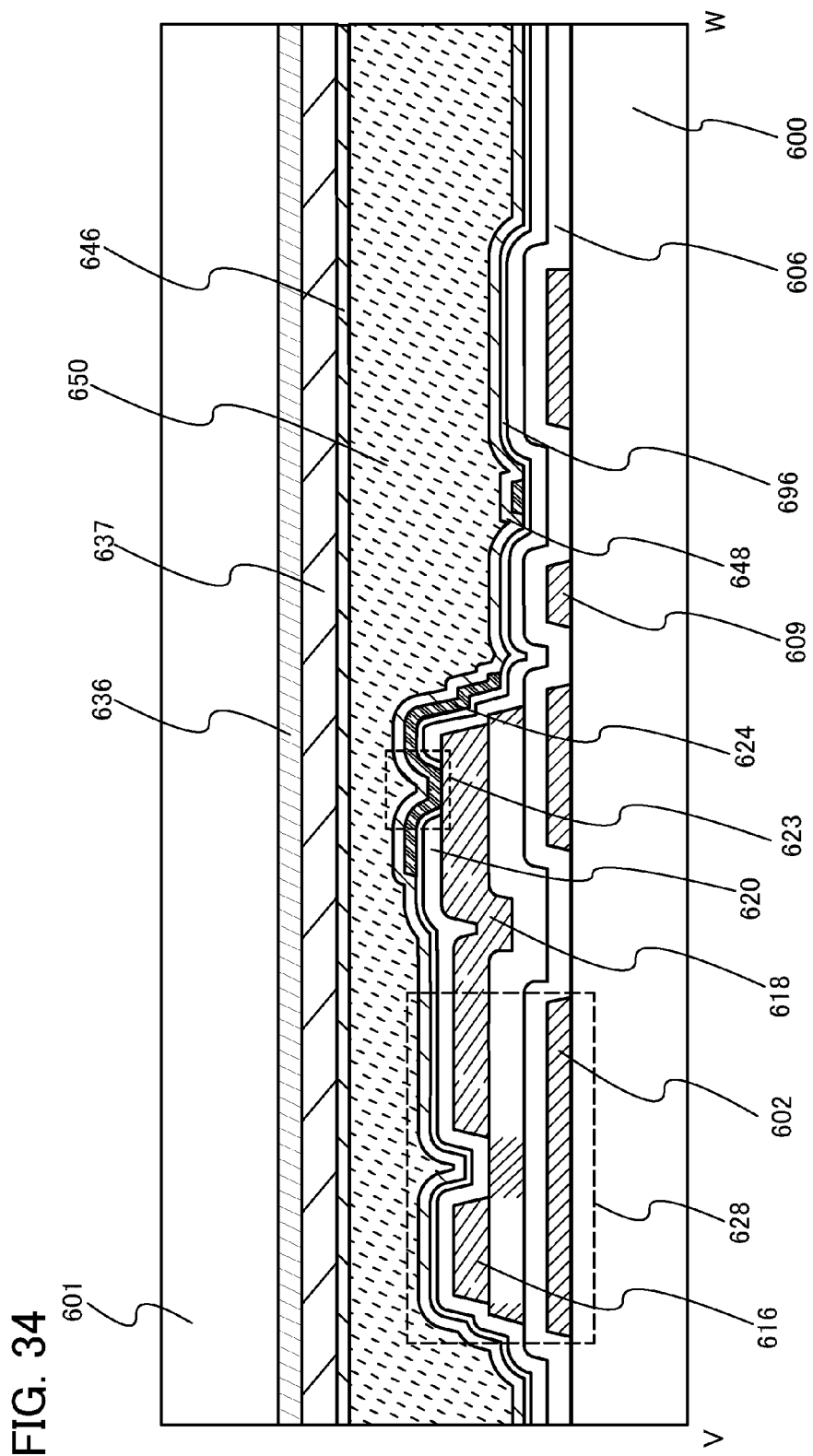
FIG. 34 is a view illustrating a semiconductor device.
Figure 35:
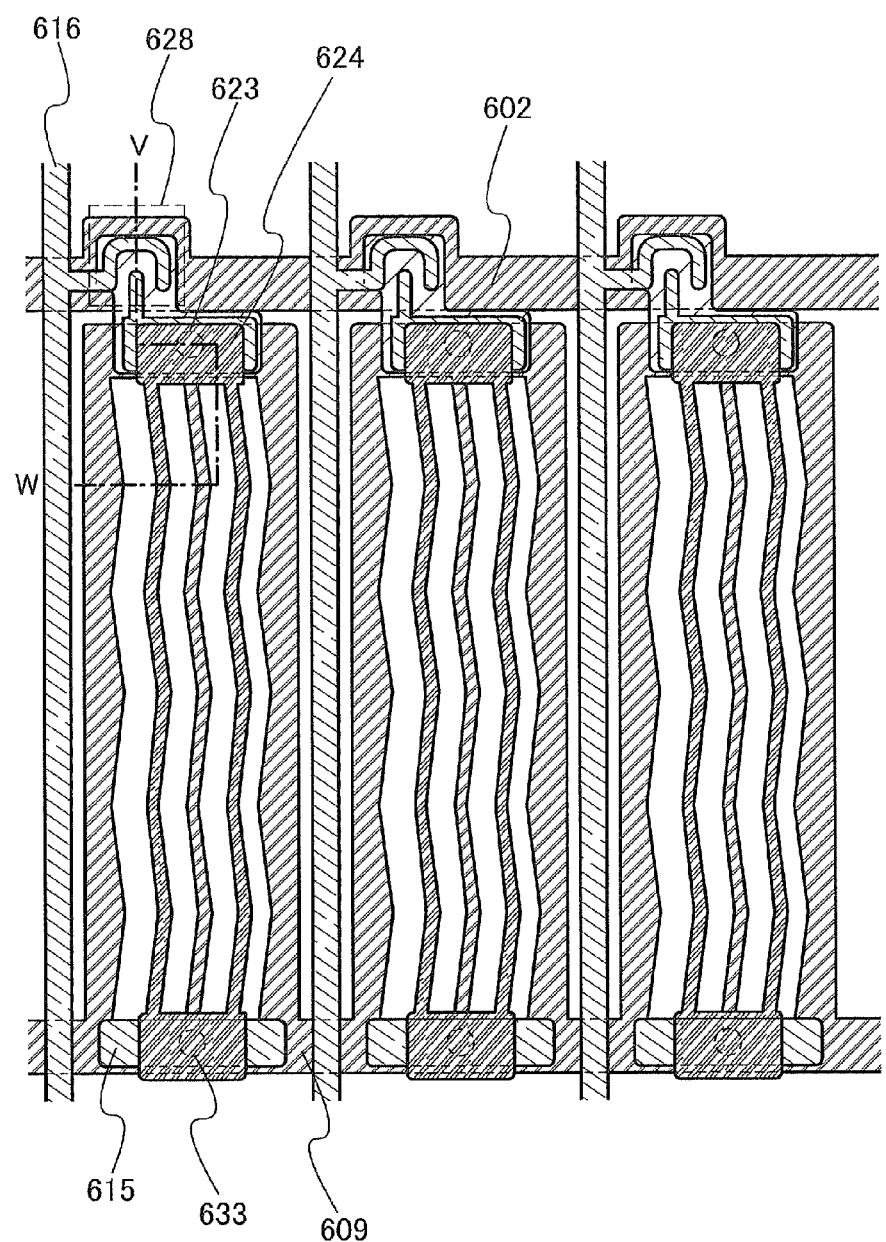
FIG. 35 is a view illustrating a semiconductor device.

FIG. 34 and FIG. 35 each illustrate a pixel structure of an IPS liquid crystal display device. FIG. 35 is a plan view. FIG. 34 illustrates a cross-sectional structure taken along line V-W of FIG. 35. Hereinafter, description is made with reference to these drawings.

FIG. 34 illustrates a state in which the substrate 600 provided with the TFT 628 and the pixel electrode layer 624 electrically connected to the TFT 628 overlaps with the counter substrate 601, and liquid crystal is injected therebetween. The counter substrate 601 is provided with the coloring film 636, the planarizing film 637, and the like. The counter electrode layer is not provided on the counter substrate 601 side. The liquid crystal layer 650 is formed between the substrate 600 and the counter substrate 601 with the alignment films 646 and 648 interposed.

A common potential line 609 and the TFT 628 described in any of Embodiments 1 to 7 are formed over the substrate 600. The common potential line 609 can be formed at the same time as the formation of the gate wiring 602 of the TFT 628. The pixel electrode layer 624 which is a first pixel electrode is formed into a shape which is compartmentalized roughly into a pixel shape. As the TFT 628, any of the thin film transistors described in Embodiments 1 to 7 can be used.

The wirings 616 and 618 of the TFT 628 are formed over the gate insulating film 606. The wiring 616 serves as a data line extending in one direction, through which a video signal is transmitted in a liquid crystal display panel, and serves as one of a source electrode and a drain electrode of the TFT 628. The wiring 618 serves as the other of the source electrode and the drain electrode, and is electrically connected to the pixel electrode layer 624.

The insulating film 620 is formed over the wirings 616 and 618. The insulating film 696 is formed over the insulating film 620. Over the insulating film 696, the pixel electrode layer 624 electrically connected to the wiring 618 through the contact hole 623 formed in the insulating films 620 and 696 is formed. The pixel electrode layer 624 is formed using a material similar to that of the pixel electrode layer described in any of Embodiments 1 to 7. Note that as illustrated in FIG. 35, the pixel electrode layer 624 is formed so as to generate a horizontal electric field with a comb-shaped electrode which is formed at the same time as the formation of the common potential line 609. Moreover, the pixel electrode layer 624 is formed so that comb-teeth portions of the pixel electrode layer 624 are alternately engaged with the comb-shaped electrode which is formed at the same time as the formation of the common potential line 609.

Alignment of the liquid crystal is controlled by an electric field generated between a potential applied to the pixel electrode layer 624 and a potential of the common potential line 609. The liquid crystal molecules are horizontally rotated using the electric field which is approximately parallel to the substrate. In this case, since the liquid crystal molecules are parallel to the substrate in any state, contrast or the like is less affected by change in angle of viewing, and a viewing angle is increased.

In such a manner, the TFT 628 and the pixel electrode layer 624 electrically connected to the TFT 628 are formed over the substrate 600. A storage capacitor is formed using the common potential line 609, a capacitor electrode 615, and the gate insulating film 606 provided therebetween. The capacitor electrode 615 and the pixel electrode layer 624 are connected through a contact hole 633.

Next, a mode of a TN liquid crystal display device is described.

Figure 36:
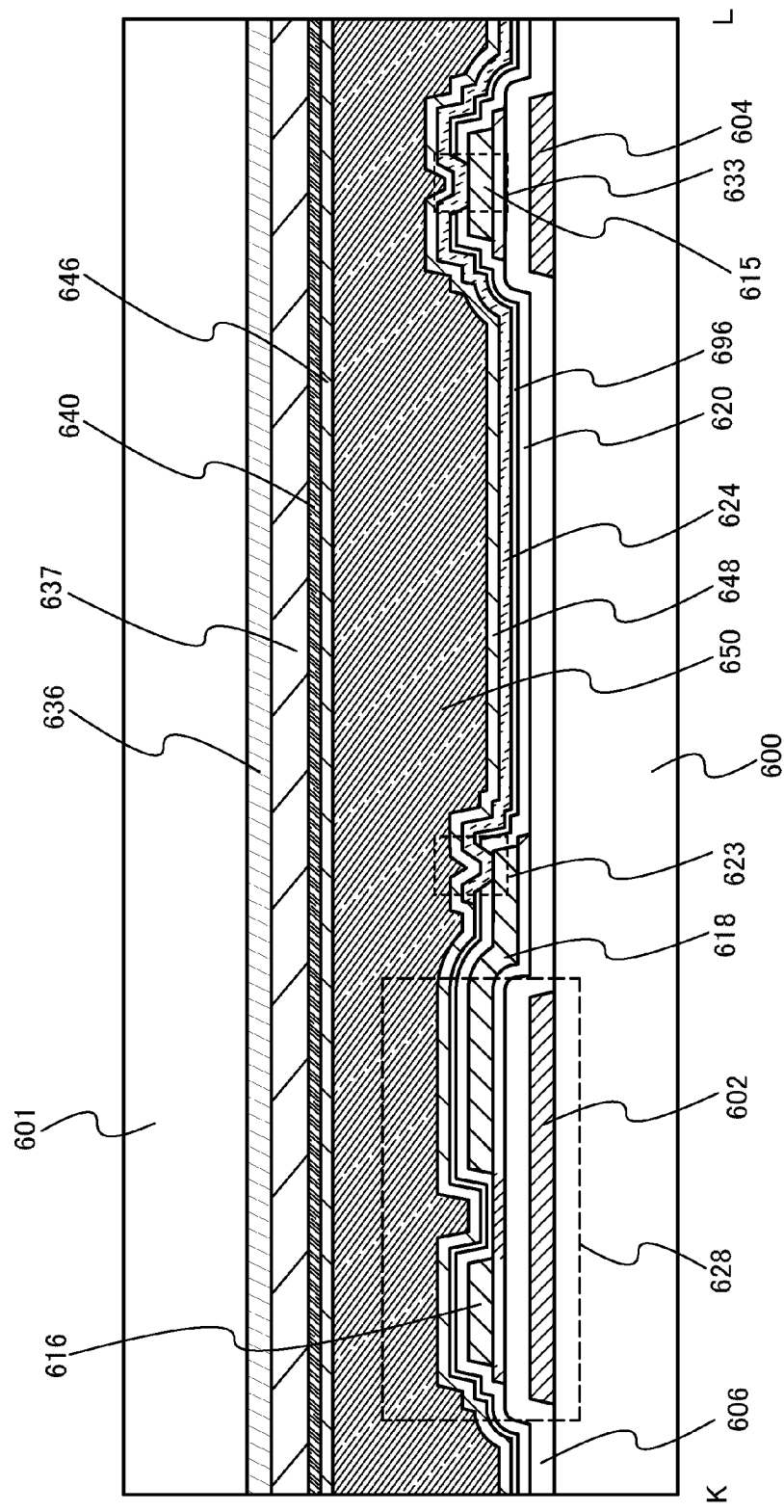
FIG. 36 is a view illustrating a semiconductor device.
Figure 37:
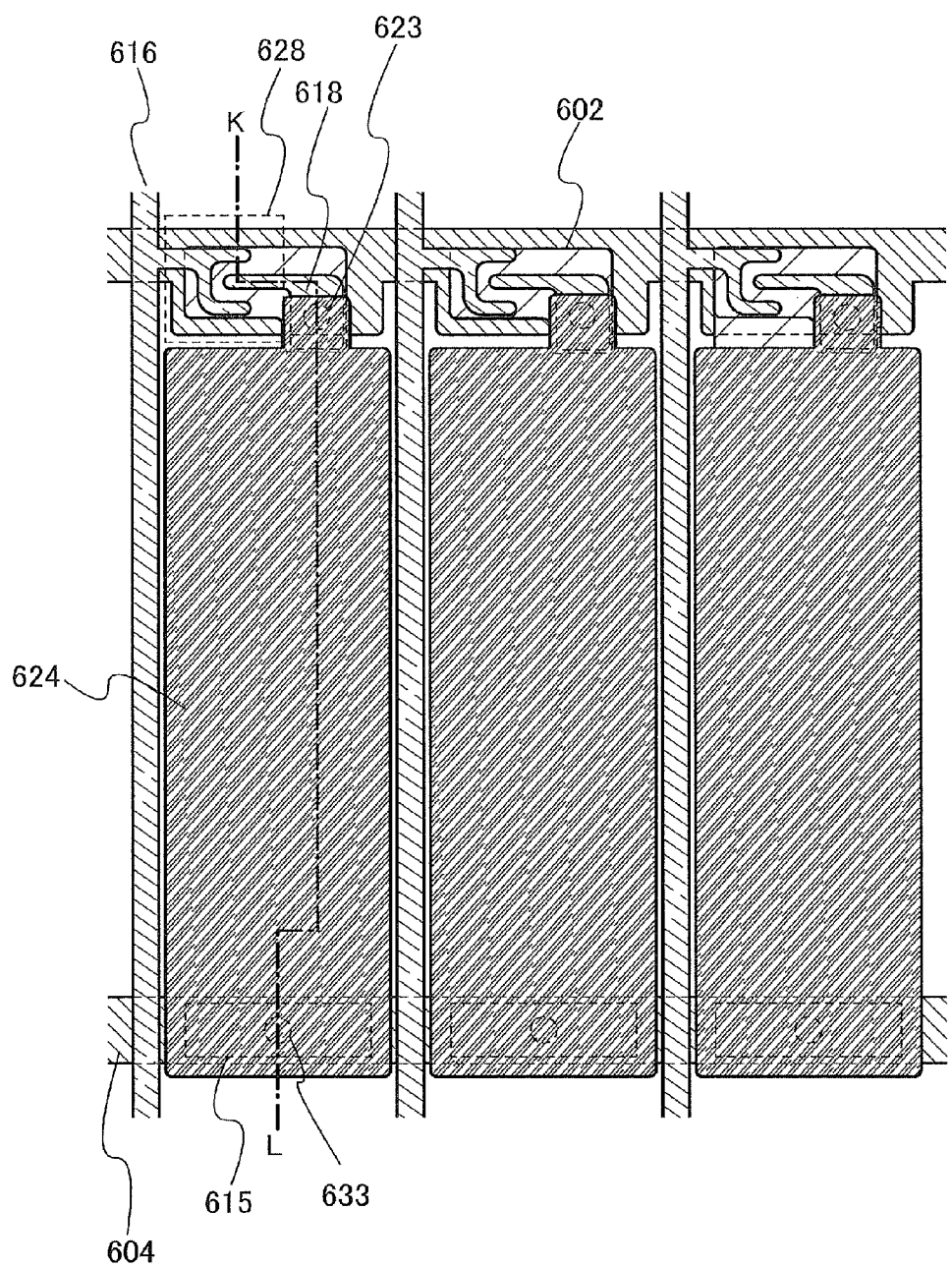
FIG. 37 is a view illustrating a semiconductor device.

FIG. 36 and FIG. 37 each illustrate a pixel structure of a TN liquid crystal display device. FIG. 37 is a plan view. FIG. 36 illustrates a cross-sectional structure taken along line K-L of FIG. 37. Hereinafter, description is made with reference to these drawings.

The pixel electrode layer 624 is connected to the TFT 628 through the wiring 618 and the contact hole 623 formed in the insulating films 620 and 696. The wiring 616 functioning as a data line is connected to the TFT 628. As the TFT 628, any of the TFTs described in Embodiments 1 to 7 can be used.

The pixel electrode layer 624 is formed using a material similar to that of the pixel electrode layer described in any of Embodiments 1 to 7. The capacitor wiring 604 can be formed at the same time as the formation of the gate wiring 602 of the TFT 628. The gate insulating film 606 is formed over the gate wiring 602 and the capacitor wiring 604. The storage capacitor is formed using the capacitor wiring 604, the capacitor electrode 615, and the gate insulating film 606 between the capacitor wiring 604 and the capacitor electrode 615. The capacitor electrode 615 is connected to the pixel electrode layer 624 through the contact hole 633.

The counter substrate 601 is provided with the coloring film 636 and the counter electrode layer 640. The planarizing film 637 is formed between the coloring film 636 and the counter electrode layer 640 to prevent alignment disorder of liquid crystal. The liquid crystal layer 650 is formed between the pixel electrode layer 624 and the counter electrode layer 640, with the alignment films 648 and 646 interposed.

A liquid crystal element is formed by overlapping of the pixel electrode layer 624, the liquid crystal layer 650, and the counter electrode layer 640.

The coloring film 636 may be provided on the substrate 600 side. Further, a polarizing plate is attached to a surface of the substrate 600, which is opposite to a surface on which the thin film transistor is formed. Moreover, a polarizing plate is attached to a surface of the counter substrate 601, which is opposite to a surface on which the counter electrode layer 640 is formed.

Through the above-described process, the liquid crystal display device can be formed as a display device. The liquid crystal display device of this embodiment has a high aperture ratio.

This application is based on Japanese Patent Application serial no. 2009-185300 filed with Japan Patent Office on Aug. 7, 2009, the entire contents of which are hereby incorporated by reference.

What is claimed is:

1. A semiconductor device comprising:
 a first transistor electrically connected to a pixel electrode layer; and
 a second transistor comprising:
  a first gate electrode layer;
  a first insulating layer over the first gate electrode layer;
  a first oxide semiconductor layer over the first insulating layer;
  a second oxide semiconductor layer over the first oxide semiconductor layer;
  a second insulating layer over and in contact with the second oxide semiconductor layer, the second insulating layer covering a side surface of the first oxide semiconductor layer;
  a source electrode layer and a drain electrode layer over the second insulating layer, the source electrode layer and the drain electrode layer being electrically connected to the second oxide semiconductor layer;
  a second gate electrode layer over the second insulating layer; and
  a third insulating layer over the second gate electrode layer,
 wherein the pixel electrode layer is over the third insulating layer.

2. The semiconductor device according to claim 1, wherein the first oxide semiconductor layer comprises indium, gallium, and zinc.

3. The semiconductor device according to claim 1, wherein the first oxide semiconductor layer comprises microcrystal.

4. The semiconductor device according to claim 1, wherein the first gate electrode layer is electrically connected to the second gate electrode layer.

5. The semiconductor device according to claim 1, wherein the source electrode layer and the drain electrode layer each comprise a conductive layer of an element selected from Al, Cr, Cu, Ta, Ti, Mo, and W as a main component, or a stack of any of these elements in combination.

6. The semiconductor device according to claim 1, further comprising a capacitor portion,
wherein the capacitor portion includes a capacitor wiring layer and a capacitor electrode layer overlapped with the capacitor wiring layer, and
wherein the capacitor wiring layer and the capacitor electrode layer each have a light-transmitting property.

7. The semiconductor device according to claim 1, wherein the semiconductor device is a touch display.

8. A phone comprising the semiconductor device according to claim 7.

9. A watch comprising the semiconductor device according to claim 7.

10. A display device comprising a pixel and a driver circuit, the pixel comprising a first transistor electrically connected to a pixel electrode layer, the driver circuit comprising a second transistor, the second transistor comprising:
a first gate electrode layer;
a first insulating layer over the first gate electrode layer;
a first oxide semiconductor layer over the first insulating layer;
a second oxide semiconductor layer over the first oxide semiconductor layer;
a second insulating layer over and in contact with the second oxide semiconductor layer, the second insulating layer covering a side surface of the first oxide semiconductor layer;
a source electrode layer and a drain electrode layer over the second insulating layer, the source electrode layer and the drain electrode layer being electrically connected to the second oxide semiconductor layer;
a second gate electrode layer over the second insulating layer; and
a third insulating layer over the second gate electrode layer, wherein the pixel electrode layer is over the third insulating layer.

11. The device according to claim 10, wherein the first oxide semiconductor layer comprises indium, gallium, and zinc.

12. The display device according to claim 10, wherein the first oxide semiconductor layer comprises microcrystal.

13. The display device according to claim 10, wherein the first gate electrode layer is electrically connected to the second gate electrode layer.

14. The display device according to claim 10, wherein the source electrode layer and the drain electrode layer each comprise a conductive layer of an element selected from Al, Cr, Cu, Ta, Ti, Mo, and W as a main component, or a stack of any of these elements in combination.

15. The display device according to claim 10, further comprising a capacitor portion,
wherein the capacitor portion includes a capacitor wiring layer and a capacitor electrode layer overlapped with the capacitor wiring layer, and
wherein the capacitor wiring layer and the capacitor electrode layer each have a light-transmitting property.

16. The display device according to claim 10, wherein the display device is a touch display.

17. A phone comprising the display device according to claim 16.

18. A watch comprising the display device according to claim 16.

* * * * *